United States Patent
Kao et al.

(10) Patent No.: US 12,419,113 B2
(45) Date of Patent: Sep. 16, 2025

(54) BACK-END-OF-LINE SEMICONDUCTOR DEVICE STRUCTURE PROVIDING A NOT-GATE LOGIC FUNCTION AND METHODS OF FORMING THE SAME

(71) Applicant: Taiwan Semiconductor Manufacturing Company Limited, Hsinchu (TW)

(72) Inventors: Yun-Feng Kao, New Taipei (TW); Katherine H. Chiang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 385 days.

(21) Appl. No.: 18/313,406

(22) Filed: May 8, 2023

(65) Prior Publication Data
US 2024/0379685 A1 Nov. 14, 2024

(51) Int. Cl.
*H01L 27/12* (2006.01)
*H10D 86/01* (2025.01)
*H10D 86/40* (2025.01)
*H10D 86/60* (2025.01)
*H10D 87/00* (2025.01)

(52) U.S. Cl.
CPC ......... *H10D 87/00* (2025.01); *H10D 86/0221* (2025.01); *H10D 86/423* (2025.01); *H10D 86/60* (2025.01)

(58) Field of Classification Search
CPC .... H10D 87/00; H10D 86/0221; H10D 86/01; H10D 86/423; H10D 86/40; H10D 86/60; H10D 30/6734; H10D 30/67; H10D 30/6755
See application file for complete search history.

(56) References Cited

U.S. PATENT DOCUMENTS

2021/0328056 A1 10/2021 Baek et al.
2023/0058626 A1 2/2023 Chuang et al.

OTHER PUBLICATIONS

Jianq Chyun Intellectual Property Office; Taiwanese Patent Application No. 112125333; First Office Action mailed Jan. 11, 2024; 8 pages.

*Primary Examiner* — Nikolay K Yushin
(74) *Attorney, Agent, or Firm* — The Marbury Law Group, PLLC

(57) ABSTRACT

A semiconductor device structure providing a NOT gate logic function includes a layer stack including a pair of semiconductor layers having opposite conductivity-types, and a dielectric isolation layer disposed therebetween. First and second electrodes are located on a first side of the layer stack, where the first electrode contacts a first side surface of a first semiconductor layer and a second electrode contacts a first side surface a second semiconductor layer. A third electrode located on a second side of the layer stack contacts a second side surface of the first semiconductor layer and a second side surface of the second semiconductor layer. A gate dielectric layer is located over two side surfaces of the layer stack. A pair of gate electrodes located on either side of the layer stack contacts the gate dielectric layer. The semiconductor device structure may be fabricated using a BEOL process using metal-oxide semiconductor materials.

20 Claims, 67 Drawing Sheets

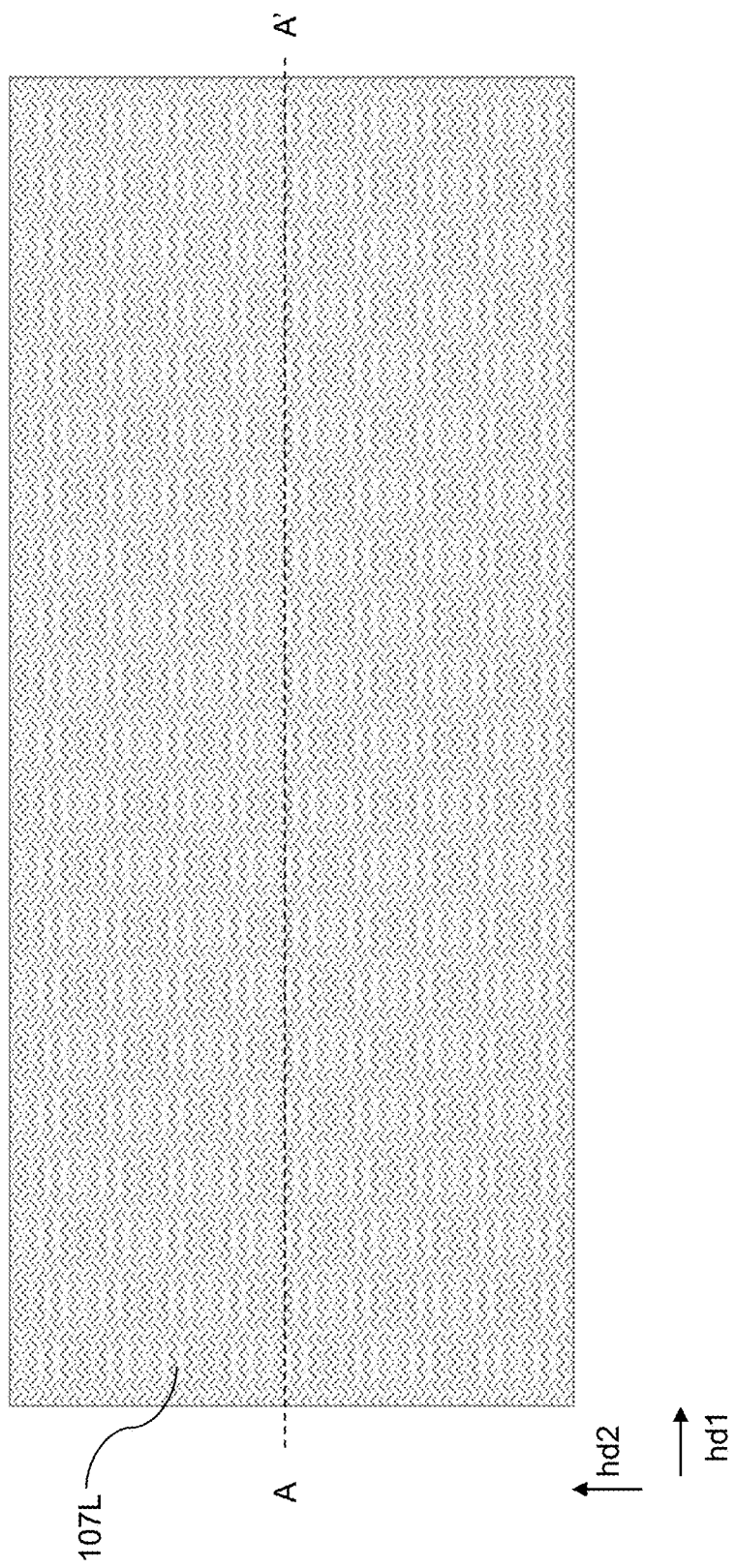

BACK-END-OF-LINE SEMICONDUCTOR DEVICE STRUCTURE PROVIDING A NOT-GATE LOGIC FUNCTION AND METHODS OF FORMING THE SAME

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Transistors made of oxide semiconductors are an attractive option for back-end-of-line (BEOL) integration since such transistors may be processed at low temperatures and thus, may not damage previously fabricated devices. For example, the fabrication conditions and techniques may not damage previously fabricated front-end-of-line (FEOL) and middle end-of-line (MEOL) devices. Circuits based on oxide semiconductor-based transistor devices may further include other components that may be fabricated in a BEOL process, such as capacitors, inductors, resistors, and integrated passive devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a top view of the intermediate structure illustrating a continuous first conductivity-type semiconductor layer formed over a first dielectric material layer according to various embodiments of the present disclosure.

DETAILED DESCRIPTION

Figure 1:
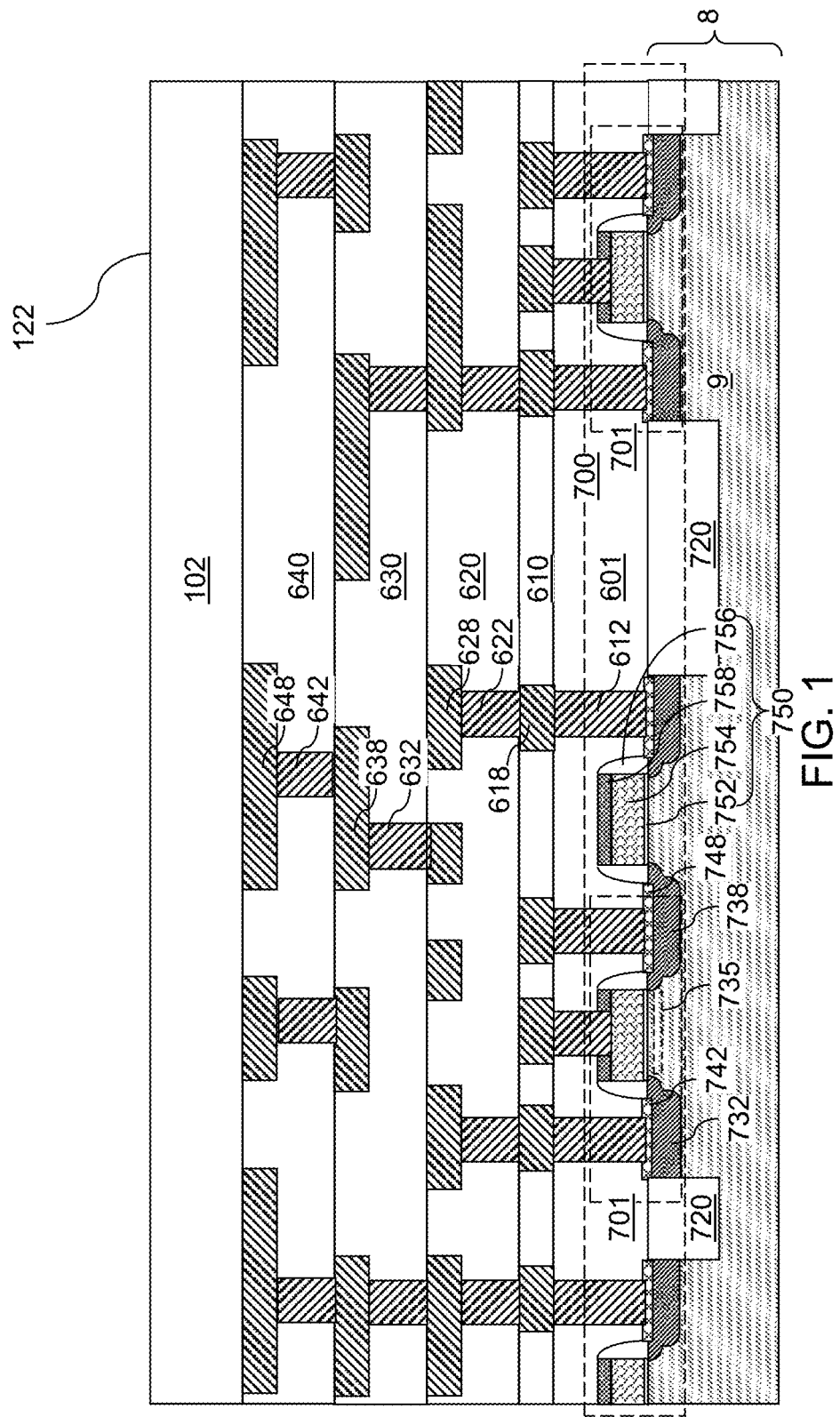
FIG. 1 is a vertical cross-sectional view of a first structure prior to formation of a semiconductor device structure providing a NOT-gate logic function according to various embodiments of the present disclosure.

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of this disclosure provide semiconductor device structures and methods that may be advantageous in terms of manufacturing flexibility, improved integration density, and increased computing power of semiconductor integrated circuit (IC) dies. In this regard, an embodiment semiconductor device structure is provided that may be formed in a BEOL process and may be incorporated with other BEOL circuit components such as capacitors, inductors, resistors, and integrated passive devices. As such, the disclosed semiconductor device structure may include materials that may be processed at low temperatures and thus, may not damage previously fabricated devices (e.g., FEOL and MEOL devices).

In various embodiments, the semiconductor device structure may be configured as a logic NOT gate or inverter circuit such that applying an input signal to the semiconductor device structure having a first logic state will produce an output signal from the semiconductor device structure having the complementary logic state. In this regard, providing a high voltage input signal to the semiconductor device structure may result in a low voltage output signal from the semiconductor device structure, and providing a low voltage input signal to the semiconductor device structure may result in a high voltage output signal from the semiconductor device structure.

In various embodiments, the semiconductor device structure may include a layer stack including a first conductivity-type semiconductor layer, a dielectric isolation layer over the first conductivity-type semiconductor layer, and a second conductivity-type semiconductor layer over the dielectric isolation layer. In various embodiments, the first conductivity-type semiconductor layer and/or the second conductivity-type semiconductor layer may include a metal oxide semiconductor material. A first electrode and a second electrode may be located on a first side of the layer stack, where the first electrode may contact a first side surface of the first conductivity-type semiconductor layer and the second electrode may contact a first side surface of the second conductivity-type semiconductor layer. The dielectric isolation layer may extend between the first electrode and the second electrode. A third electrode may be located on a second side of the layer stack, opposite the first side, and may contact a second side surface of the first conductivity-type semiconductor layer, a side surface of the dielectric isolation layer, and a second side surface of the second conductivity-type semiconductor layer. A gate dielectric layer may surround the layer stack over two side surfaces and an upper surface of the layer stack over at least a portion of a length of the layer stack between the first and second electrodes on one end of the layer stack and the third electrode at the other end of the layer stack. A pair of gate electrodes may be located on either side of the layer stack, where the gate dielectric layer may be located between each of the gate electrodes and the respective opposite side surfaces of the layer stack over at least a portion of the length of the layer stack between first and second electrodes on one end of the layer stack and the third electrode at the other end of the layer stack.

In various embodiments, semiconductor device structures providing a NOT gate logic functions may be fabricated using a BEOL process using thin-film metal oxide semiconductor materials. Accordingly, this may enable computing operations to be performed, at least in part, within one or more interconnect levels of a semiconductor integrated circuit (IC) die, which may enable improved integration density and/or increased processing power of the semiconductor IC die.

FIG. 1 is a vertical cross-sectional view of a first structure prior to formation of a semiconductor device structure providing a NOT-gate logic function according to various embodiments of the present disclosure. The first structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of a NOT gate semiconductor device structure to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 631, 638, 642, 648) may include at least one conductive material, which may be a combination of a metallic liner (such as a metallic nitride or a metallic carbide) and a metallic fill material. Each metallic liner may include TIN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices 701 may be formed on a substrate 8, and metal interconnect structures (612, 618, 622, 628, 631, 638, 642, 648) and dielectric material layers (601, 610, 620, 630, 640) over the semiconductor devices 701. The metal interconnect structures (612, 618, 622, 628, 631, 638, 642, 648) may be formed in the dielectric material layers (601, 610, 620, 630, 640), and may be electrically connected to the semiconductor devices.

Referring again to FIG. 1, a first dielectric material layer 102 may be formed over the metal interconnect structures (612, 618, 622, 628, 631, 638, 642, 648) and dielectric material layers (601, 610, 620, 630, 640). The first dielectric material layer 102 may include a suitable dielectric material, such as silicon oxide, undoped silicate glass, a doped silicate glass, organosilicate glass, amorphous fluorinated carbon, porous variants thereof, or combinations thereof. Other suitable dielectric materials are within the contemplated scope of disclosure. The first dielectric material layer 102 may be deposited using any suitable deposition process, such a chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. In some embodiments, one or more above-described metal interconnect structures, such as integrated line and via structures, may be formed within the first dielectric material layer 102 and may be coupled to metal interconnect structures (612, 618, 622, 628, 631, 638, 642, 648) located within the underlying dielectric material layers (601, 610, 620, 630, 640). The first dielectric material layer 102 may include a planar upper surface 122.

Figure 2A:
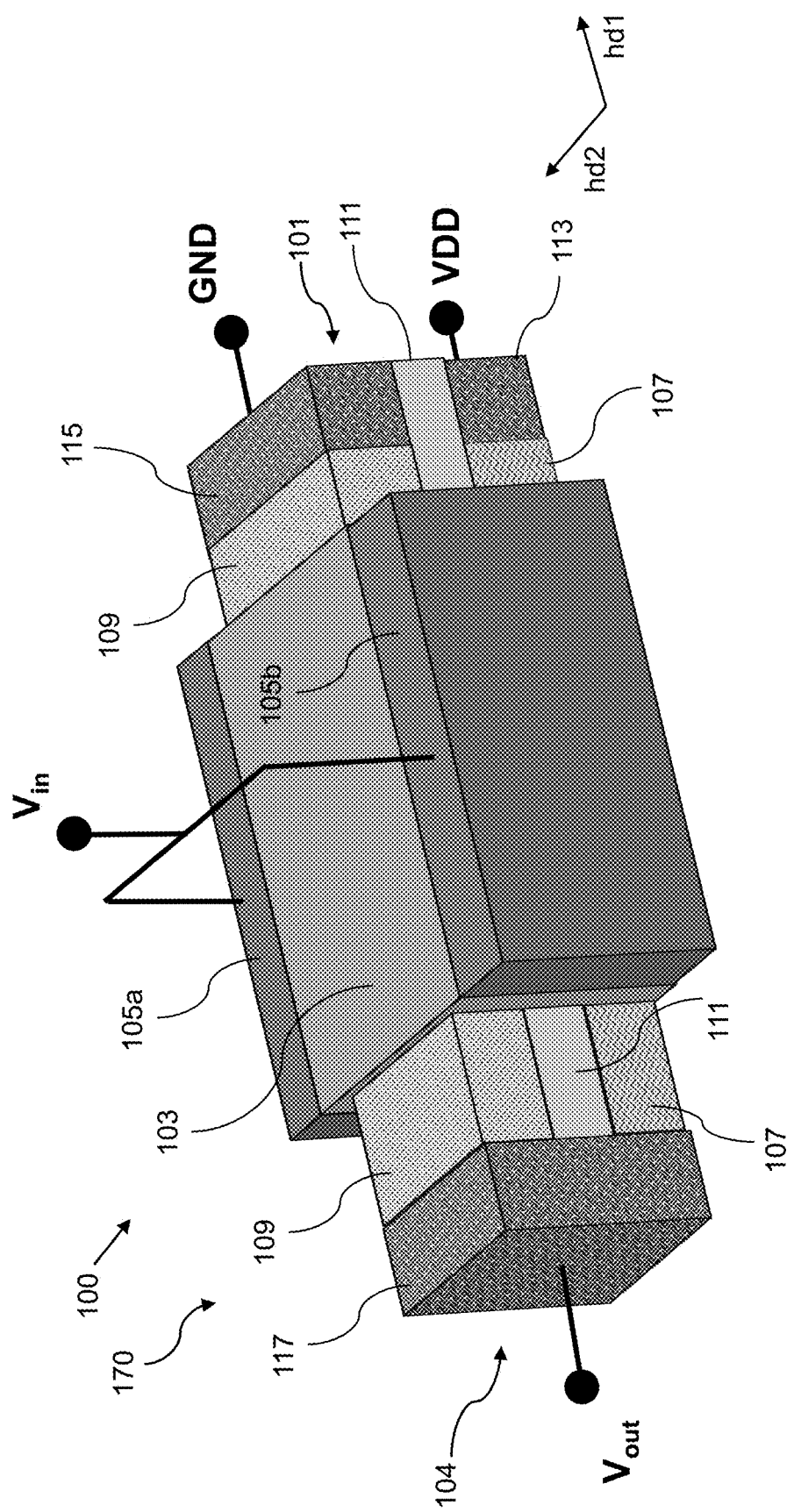
FIG. 2A is a three-dimensional perspective view of a semiconductor device structure according to various embodiments of the present disclosure.
Figure 2B:
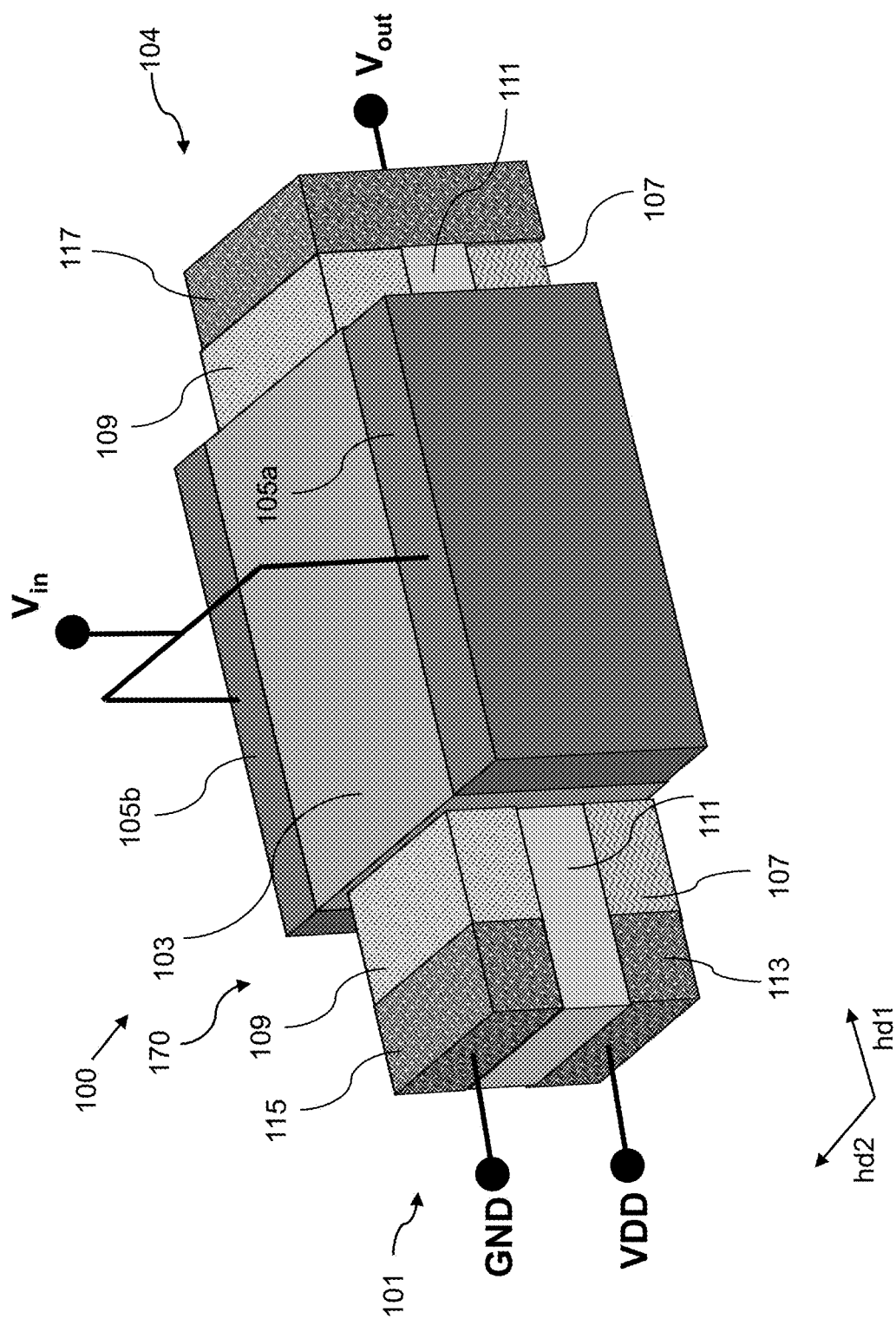
FIG. 2B is a further three-dimensional perspective view of the semiconductor device structure of FIG. 2A.
Figure 2C:
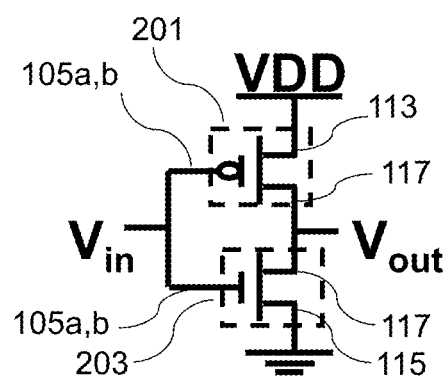
FIG. 2C is a schematic equivalent circuit diagram describing the operations of the semiconductor device structure of FIG. 2A according to various embodiments of the present disclosure.

FIG. 2A is a three-dimensional perspective view of a semiconductor device structure 100, and FIG. 2B is a further three-dimensional perspective view of the semiconductor device structure 100 of FIG. 2A that has been rotated, according to various embodiments. FIG. 2C is a schematic equivalent circuit diagram 100c describing the operations of the semiconductor device structure 100 of FIGS. 2A and 2B, according to various embodiments. A semiconductor device structure 100 as shown in FIGS. 2A and 2B may be formed via a BEOL process. In some embodiments, the semiconductor device structure 100 may be formed on and/or in a dielectric material layer, such as the first dielectric material layer 102 described above with reference to FIG. 1. The semiconductor device structure 100 may be embedded in an insulating matrix that may include one or more dielectric material layers (not shown in FIGS. 2A and 2B for clarity).

Referring to FIGS. 2A and 2B, the semiconductor device structure 100 may include a first end 101 and a second end 104 that is opposite the first end 101 along a first horizontal direction hd1. A first electrode 113 and a second electrode 115 may be located at the first end 101 of the semiconductor device structure 100. The second electrode 115 may be located vertically above the first electrode 113. A layer of dielectric material 111 (which may also be referred to as a dielectric isolation layer 111) may be located between first electrode 113 and the second electrode 115. A third electrode 117 may be located at the second end 104 of the semiconductor device structure 100.

A layer stack 170 may extend along the first horizontal direction hd1 between the first electrode 113 and second electrode 115 on one end (e.g., 101) of the layer stack 170 and the third electrode 117 on the opposite end (e.g., 104) of the layer stack 170. The layer stack 170 may include a first conductivity-type semiconductor layer 107, the dielectric isolation layer 111 over the first conductivity-type semiconductor layer 107, and a second conductivity-type semiconductor layer 109 over the dielectric isolation layer 111. For example, when the first conductivity-type semiconductor layer 107 may be p-type, the second conductivity-type semiconductor layer 109 may be n-type, and vice versa. In one non-limiting embodiment, the first conductivity-type semiconductor layer 107 may be composed of a p-type semiconductor material and the second conductivity-type semiconductor layer 109 may composed of an n-type semiconductor material. In some embodiments, the first conductivity-type semiconductor layer 107 and the second conductivity-type semiconductor layer 109 may be composed of oxide semiconductor materials, as described in further detail below.

The layer stack 170 may include a gate dielectric layer 103 that may surround the layer stack 170 over two side surfaces and an upper surface of the layer stack 170 over at least a portion of the layer stack 170 between the third electrode 117 on one end (e.g., 104) of the layer stack 170 and the first electrode 113 and the second electrode 115 on the other end (e.g., 101) of the layer stack 170. In other words, the gate dielectric layer 103 may extend over and contact an upper surface and two opposite side surfaces of the second conductivity-type semiconductor layer 109, two opposite side surfaces of the dielectric isolation layer 111, and two opposite side surfaces of the first conductivity-type semiconductor layer 107. In some embodiments, the gate dielectric layer 103 may also contact a bottom surface of the first conductivity-type semiconductor layer 107. A pair of gate electrodes 105a and 105b may be located on either side of the layer stack 170, where the gate dielectric layer 103 may be located between each of the gate electrodes 105a and 105b and the respective opposite side surfaces of the layer stack 170 over at least a portion of the length of the layer stack 170. Although FIGS. 2A and 2B illustrate the gate dielectric layer 103 and the gate electrodes 105a and 105b extending along a portion of the length of the layer stack 170, it will be understood that in other embodiments, the gate dielectric layer 103 and the gate electrodes 105a and 105b may extend over the entire or substantially entire length of the layer stack 170.

A first end of the first conductivity-type semiconductor layer 107 may contact a side surface of the first electrode 113 and a second end of the first conductivity-type semiconductor layer 107 may contact a side surface of the third electrode 117. A first end of the second conductivity-type semiconductor layer 109 may contact a side surface of the second electrode 115 and a second end of the second conductivity-type semiconductor layer 109 may contact the side surface of the third electrode 117. As schematically illustrated in FIGS. 2B and 2C, the first electrode 113 may be electrically connected to a voltage supply (e.g., that may be held at a source voltage VDD). The second electrode 115 may be electrically connected to a ground voltage terminal (e.g., that may be held at a ground (GND) voltage). The pair of gate electrodes 105a and 105b may be electrically connected to a common input voltage terminal (e.g., Vin). The third electrode 117 may be electrically connected to an output signal terminal (e.g., Vout).

The semiconductor device structure 100 as shown in FIGS. 2A and 2B may be configured as a NOT gate circuit (which may also be referred to as an inverter circuit). A NOT gate circuit is a logic gate circuit that inverts (i.e., outputs the complementary logic state) of a given input signal. For example, when a low voltage signal (e.g., representing a logic state of "0" or "1") is provided at the input terminal (Vin) of the semiconductor device structure 100, the output signal terminal (Vout) of the semiconductor device structure 100 outputs a high voltage signal (e.g., representing the complementary logic state of the input signal, such that when the input low voltage signal represents a logic state "0," the output high voltage signal represents a logic state "1," and vice versa). Similarly, when a high voltage signal is provided at the input terminal (Vin), a low voltage signal is output at the output signal terminal (Vout).

FIG. 2C is a schematic equivalent circuit diagram 100c that describes the operation of the semiconductor device structure 100 as shown in FIGS. 2A and 2B. In particular, the first conductivity-type semiconductor layer 107 may be configured as a channel layer of a first transistor 201, which may be a p-channel metal oxide semiconductor field effect transistor (MOSFET). Thus, the first transistor 201 may include the first conductivity-type semiconductor layer 107 (which may function as a p-channel layer), the first electrode 113 (which may function as a source electrode), the third electrode 117 (which may function as a drain electrode), the gate dielectric layer 103 and the pair of gate electrodes 105a and 105b on either side of the p-channel layer 107. Similarly, the second conductivity-type semiconductor layer 109 may be configured as a channel layer of a second transistor 203, which may be an n-channel metal oxide semiconductor field effect transistor (MOSFET). Thus, the second transistor 203 may include the second conductivity-type semiconductor layer 109 (which may function as an n-channel layer), the second electrode 115 (which may function as a source electrode), the third electrode 117 (which may function as a drain electrode), the gate dielectric layer 103 and the pair of gate electrodes 105a and 105b on either side of the n-channel layer 109. It will be understood that source/drain electrode(s) 113, 115 and 117 may refer to a source or a drain electrode, individually or collectively, dependent upon the context.

Referring again to FIG. 2C, a low voltage placed on the input signal terminal Vin turns on the first transistor 201 and turns off the second transistor 203. Since the source of the first transistor 201 (i.e., the first electrode 113) is connected to the voltage supply (VDD) that has a high voltage, the output voltage Vout (i.e., the voltage at the third electrode 117) will have a high voltage. Similarly, a high voltage placed on the input signal terminal Vin turns on the second transistor 203 and turns off the first transistor 201. Since the source of the second transistor 203 (i.e., the second electrode 115) is connected to a ground voltage terminal, the output voltage Vout (i.e., the voltage at the third electrode 117) will have a low voltage. In this way, a high input signal is converted to a low output signal and a low input signal is converted to a high input signal. As such, the semiconductor device structure 100 is configured as a NOT gate or inverter circuit.

In some embodiments, the semiconductor device structure 100 of FIGS. 2A and 2B may be formed over an interconnect-level dielectric layer having a planar horizontal surface. For example, the semiconductor device structure 100 may be formed over the first dielectric material layer 102 (e.g., see FIG. 1), over any of layers 601, 610, 620, 630 and 640 in FIG. 1, or over one or more additional interconnect-level dielectric layers formed over the first dielectric material layer 102. As shown in FIGS. 2A and 2B, the layer stack 170 including the first conductivity-type semiconductor layer 107, the dielectric isolation layer 111 and the second conductivity-type semiconductor layer 109 may have a horizontal orientation such that the interfacing surfaces of the first conductivity-type semiconductor layer 107, the dielectric isolation layer 111 and the second conductivity-type semiconductor layer 109 may be substantially parallel to the planar horizontal surface of the interconnect-level dielectric layer (e.g., see FIG. 1 in which the first dielectric material layer 102 has a horizontal upper surface 122). However, it will be understood that other orientations of the semiconductor device structure 100 are within the contemplated scope of disclosure. For example, the semiconductor device structure 100 may be oriented such that the interfacing surfaces of the gate electrodes 105a, 105b, the gate dielectric layer 103, and the respective opposite side surfaces of the layer stack 170 may be substantially parallel to the planar horizontal surface of the interconnect-level dielectric layer.

As discussed above, the interconnect-level dielectric layer on which the semiconductor device structure 100 is formed may include one or more electrical interconnect structures. In this regard, one or more of the first electrode 113, the second electrode 115, the third electrode 117 and the gate electrodes 105a and 105b may be electrically connected to the one or more electrical interconnect structures (e.g., 612, 618, 622, 628, 632, 638, 642, 648) formed in one or more dielectric material layers (601, 610, 620, 630, 640) underlying the semiconductor device structure 100. In other embodiments, one or more of the first electrode 113, the second electrode 115, the third electrode 117 and the gate electrodes 105a and 105b may be electrically connected to one or more electrical interconnect structures to be subsequently formed over the semiconductor device structure 100.

In one or more embodiments, one or both of the first conductivity-type semiconductor layer 107 and the second conductivity-type semiconductor layer 109 may include metal-oxide semiconductors. For example, suitable metal-oxide semiconductor materials for a p-type semiconductor layer 107 or 109 may include one or more of NiO, SnO, and $Cu_2O$. Other suitable p-type semiconductor materials are within the contemplated scope of disclosure. Suitable metal-oxide semiconductor materials for an n-type semiconductor layer 109 or 107 may include one or more of InZnO (IZO), InSnO (indium tin oxide) (ITO), $In_2O_3$, $Ga_2O_3$, InGaZnO (IGZO), $Al_2O_5Zn_2$, ZnO, InGaO, InWO, ZnO, TiOx, aluminum-doped zinc oxide (AZO), including various combinations and alloys thereof. Other suitable n-type semiconductor materials, such as amorphous silicon, III-V materials, and the like, including combinations (e.g., stacked layers) and/or alloys thereof, may also be utilized. In some embodiments, the n-type semiconductor layer 109 or 107 may have a composition given by $In_x Ga_y Zn_z$ MO, wherein $0<x<1$; $0 \leq y \leq 1$; $0 \leq z \leq 1$; and M is one of Ti, Al, Ag, Ce, and Sn. In other embodiments, the n-type semiconductor layer 109 may include an alloy of oxygen, a group-III element, and a group-V element. In other embodiments, the one or more of the n-type semiconductor layer 109 or 107 and the p-type semiconductor layer 107 or 109 may be formed of a metal-oxide semiconductor having a multi-layer structure.

In some embodiments, the dielectric isolation layer 111 may include one or more of AlOx, $SiO_2$, SiNx, or other interconnect-level dielectric materials, as described above. The gate dielectric layer 103 may include one or more of silicon oxide, aluminum oxide, hafnium oxide, hafnium lanthanum oxide, hafnium silicon oxide, hafnium tantalum oxide, hafnium titanium oxide, hafnium zirconium oxide, zirconium oxide, titanium oxide, tantalum oxide, hafnium dioxide-alumina, etc. In some embodiments, the gate dielectric layer 103 may include a high-k dielectric material. Other suitable materials for the dielectric isolation layer 111 and/or the gate dielectric layer 103 are within the contemplated scope of disclosure.

As described in greater detail below, one or more of the first electrode 113, the second electrode 115, the third electrode 117 and the gate electrodes 105a and 105b may include one or more of TiN, W, WN, WCN, Co, PdCo, Mo, Cu, TaN, Ti, Al, etc. Other suitable conductor materials may be within the contemplated scope of disclosure.

Figure 2D:
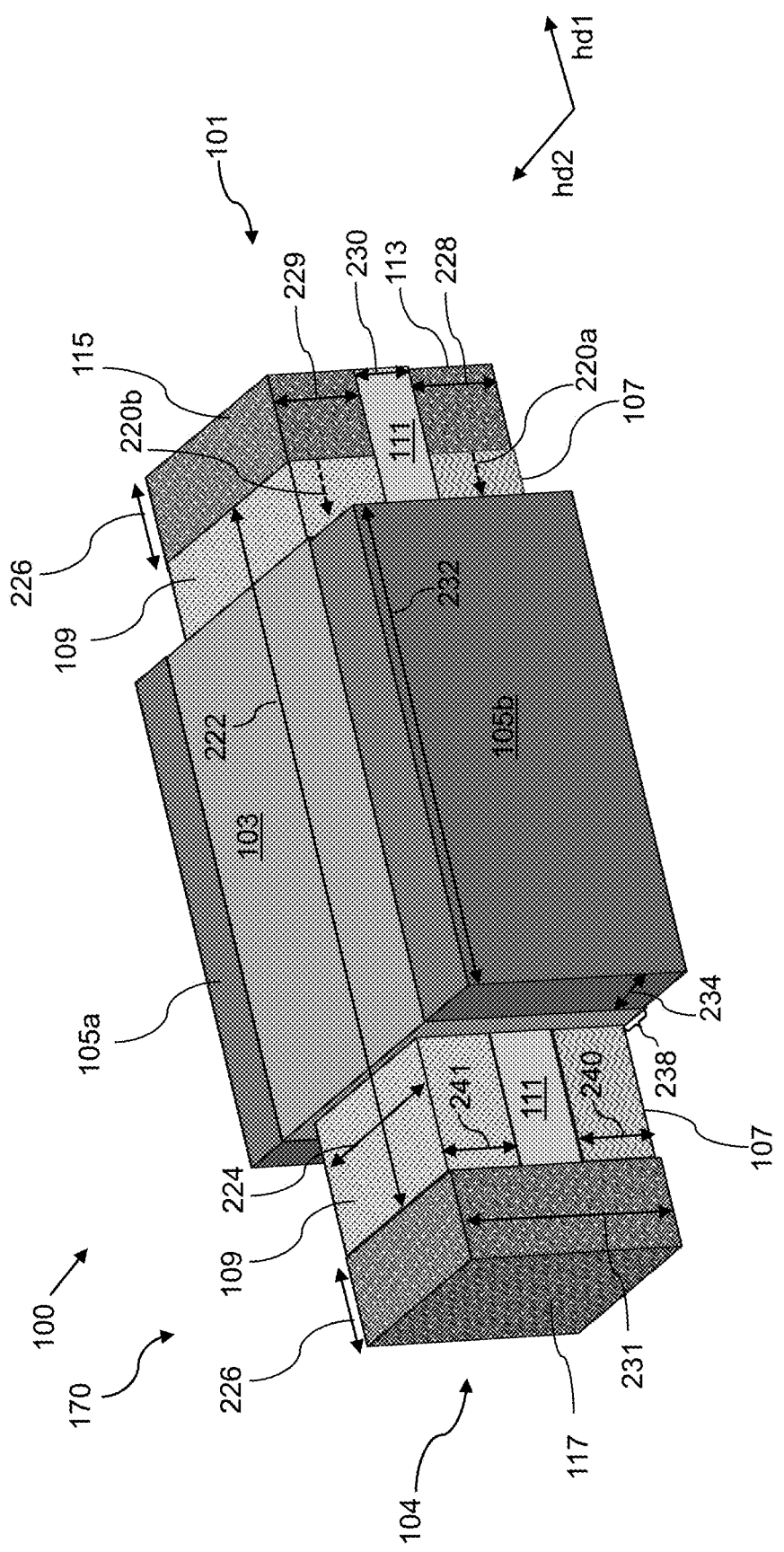
FIG. 2D is a further three-dimensional perspective view of the semiconductor device structure of FIG. 2A showing various dimensions of components of the semiconductor device structure according to various embodiments of the present disclosure.

FIG. 2D is a further three-dimensional perspective view showing various dimensions of components of the semiconductor device structure 100 of FIGS. 2A and 2B, according to various embodiments. As described above, the first conductivity-type semiconductor layer 107 may be configured as a p-channel layer of a first transistor 201 and the second conductivity type semiconductor layer 109 may be configured as an n-channel layer of second transistor 203 (e.g., see FIG. 2C). As such, when the respective transistors (201, 203) are activated, current may flow as indicated by the dashed arrows (220a, 220b) in FIG. 2D. In this regard, when the first transistor 201 is activated (e.g., by applying a low or zero bias to the gate electrodes 105a and 105b) positive charge carriers (i.e., "holes") may flow from the first electrode 113 to the third electrode 117 giving rise to a first current 220a. Similarly, when the second transistor 203 is activated (e.g., by applying a high bias to the gate electrodes 105a and 105b) negative charge carriers (i.e., electrons) may flow from the third electrode 117 to the second 115 but, since the current carried by a negative charge is opposite to its motion, the charge motion in the n-channel 109 gives rise to a second current 220b, which is in the same direction as first current 220a that flows in the p-channel 107.

Each of the p-type semiconductor layer 107 and the n-type semiconductor layer 109 may have a respective channel length 222 (i.e., along the first horizontal direction hd1) and a respective channel width 224 (i.e., along a second horizontal direction hd2 that is perpendicular to the first horizontal direction hd1). The channel length 222 may have a value greater than 15 nm in various embodiments. An increased value of the channel length 222 may mitigate short channel effects. However, increasing the channel length 222 may result in reduced driving current and a greater size of the semiconductor circuit 100. Thus, it may be possible to optimize the channel length 222 to determine a value sufficiently large to avoid short channel effects while also keeping the size of the semiconductor device structure 100 as small as possible. The channel width 224 may have a value that is greater than 5 nm and less than 500 nm according to various embodiments.

Each of the first electrode 113, the second electrode 115 and the third electrode 117 may have a width along the second horizontal direction hd2 that is approximately equal to the channel width 224. Each of the first electrode 113, the second electrode 115 and the third electrode 117 may also have a length dimension 226 (along hd1) that is greater than 5 nm. The first electrode 113 and the second electrode 115 may have thickness dimensions 228 and 229 (along a vertical direction) between about 2 nm and about 50 nm. As shown in FIG. 2D, the third electrode 117 may have a thickness dimension 231 that is greater than the combined thickness dimensions 228 and 229 of the first electrode 113 and the second electrode 115. The thickness dimension 231 of the third electrode 117 may be approximately equal to the total thickness of the layer stack 170 including the first conductivity-type semiconductor layer 107, the dielectric isolation layer 111 and the second conductivity-type semiconductor layer 109. The dielectric isolation layer 111 may have a thickness 230 that is greater than 5 nm and less than 500 nm. The gate electrodes 105a and 105b may each have a gate length 232 that may be comparable to the channel length 222 in some embodiments. For example, in some embodiments the gate length 232 may be greater than about 10 nm. The gate electrodes 105a and 105b may each have a gate width 234 that is at least about 10 nm. The gate dielectric layer may have a thickness 238 that is greater than about 2 nm and less than about 20 nm. The first conductivity-type semiconductor layer 107 may have a thickness 240 that is between about 2 nm and about 50 nm. The second conductivity-type semiconductor layer 109 may have a thickness 241 that is between about 2 nm and about 50 nm. In some embodiments, the thickness 240 of the first conductivity-type semiconductor layer 107 may be approximately equal to the thickness 228 of the first electrode 113, and the thickness 241 of the second conductivity-type semiconductor layer 109 may be approximately equal to the thickness 229 of the second electrode 115.

Figure 3A:
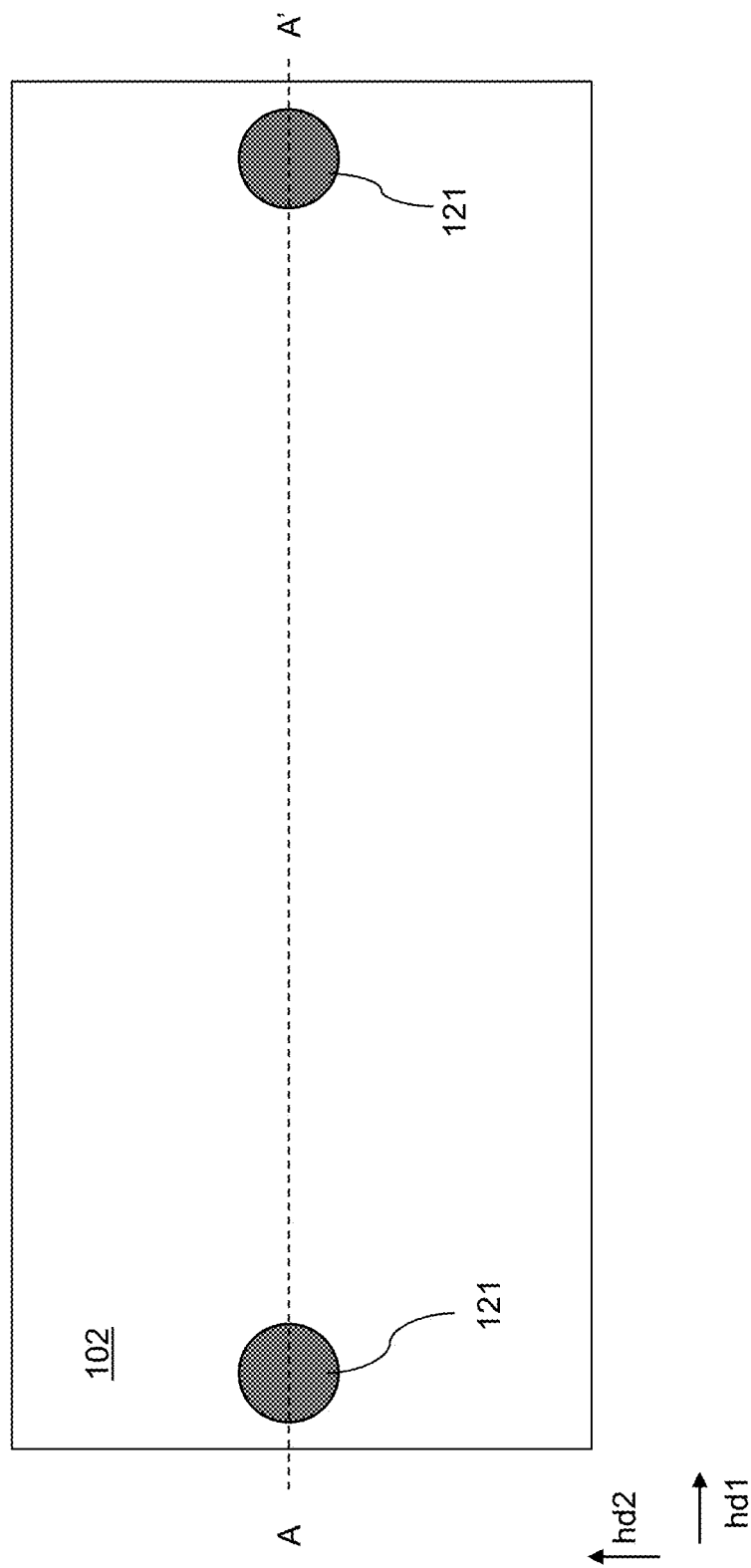
FIG. 3A is a top view of an intermediate structure during a process of fabricating a semiconductor device structure as shown in FIGS. 2A and 2B according to various embodiments of the present disclosure.
Figure 3B:
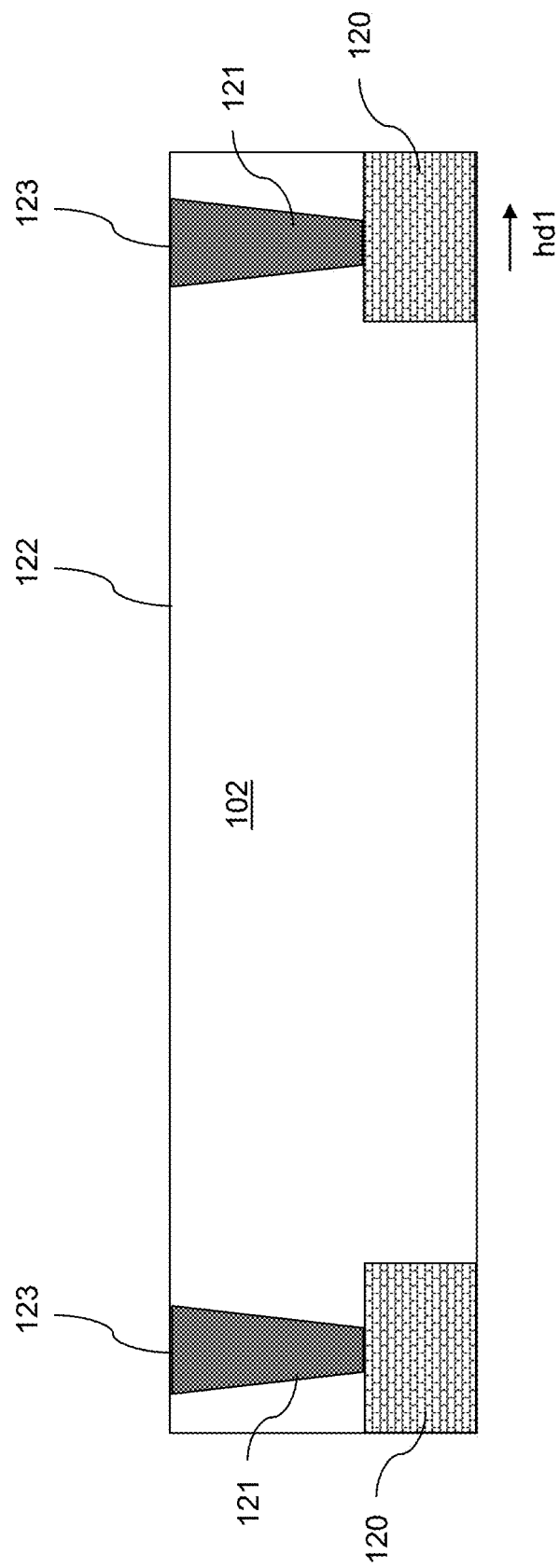
FIG. 3B is a vertical cross-section view of the intermediate structure taken along line A-A' in FIG. 3A.

FIG. 3A is a top view of an intermediate structure during a process of fabricating a semiconductor device structure 100 as shown in FIGS. 2A and 2B according to various embodiments of the present disclosure. FIG. 3B is a vertical cross-section view of the exemplary intermediate structure taken along line A-A' in FIG. 3A. Referring to FIGS. 3A and 3B, the exemplary intermediate structure may include a first dielectric material layer 102 having a planar upper surface 122. The first dielectric material layer 102 may be formed in a BEOL process as described above with reference to FIG. 1. Accordingly, the first dielectric material layer 102 may be formed over a substrate 8 including a semiconductor material layer 9, semiconductor devices 701, metal interconnect structures (612, 618, 622, 628, 631, 638, 642, 648) and dielectric material layers (601, 610, 620, 630, 640), as described above with reference to FIG. 1.

The first dielectric material layer 102 may be composed of a suitable dielectric material, such as undoped silicate glass, a doped silicate glass (e.g., deposited by decomposition of tetraethylorthosilicate (TEOS)), organosilicate glass, silicon oxynitride, or silicon carbide nitride. Other suitable dielectric materials are within the contemplated scope of disclosure. The first dielectric material layer 102 may be deposited by a conformal deposition process (e.g., chemical vapor deposition (CVD), atomic layer deposition (ALD), physical vapor deposition (PVD), plasma enhanced chemical vapor deposition (PECVD), etc.) or a self-planarizing deposition process (such as spin coating). The thickness of the first dielectric material layer 102 be in a range from approximately 15 nm to approximately 60 nm, such as from approximately 20 nm to approximately 40 nm, although smaller and larger thicknesses may also be used.

Referring again to FIGS. 3A and 3B, metal interconnect features, such as metal line 120 and via 121 structures, may be formed within the first dielectric material layer 102 (e.g., via a single or dual damascene process). Upper surfaces 123 of each of the vias 121 may be coplanar with the upper surface 122 of the first dielectric material layer 102.

Figure 4B:
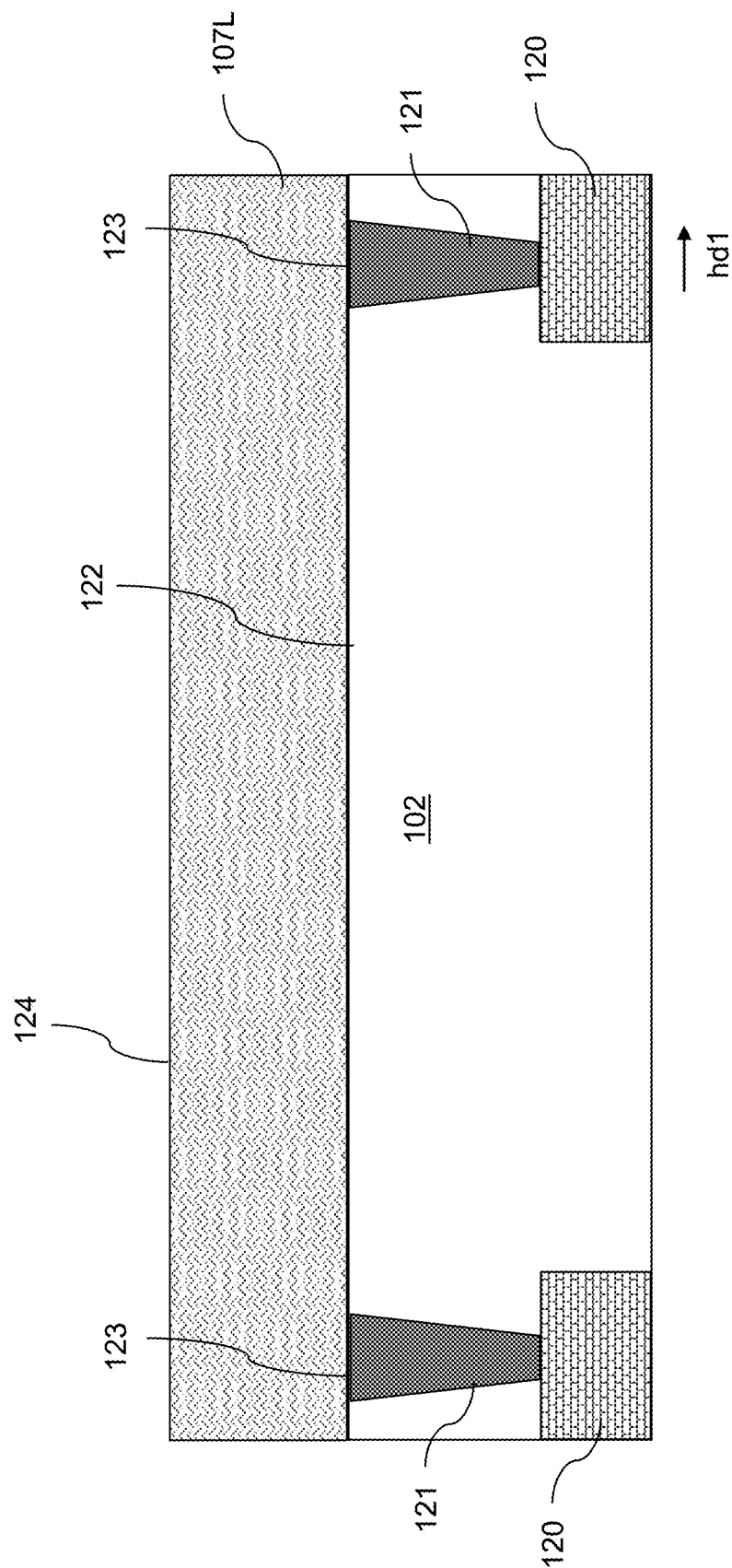
FIG. 4B is a vertical cross-sectional view of the intermediate structure taken along line A-A' in FIG. 4B.

FIG. 4A is a top view of the intermediate structure illustrating a continuous first conductivity-type semiconductor layer 107L formed over the first dielectric material layer 102 according to various embodiments of the present disclosure. FIG. 4B is a vertical cross-sectional view of the intermediate structure taken along line A-A' in FIG. 4B. Referring to FIGS. 4A and 4B, a continuous first conductivity-type semiconductor layer 107L may be deposited over the upper surface 122 of the first dielectric material layer 102 and the upper surfaces 123 of each of the conductive vias 121 via a suitable deposition process, such as ALD, CVD, PECVD, PVD, etc. A thickness of the continuous first conductivity-type semiconductor layer 107L may be in a range from approximately 2 nm to approximately 50 nm, although other embodiments may include smaller and larger thicknesses. The continuous first conductivity-type semiconductor layer 107L may be composed of a suitable semiconductor material, such as a metal oxide semiconductor material. In some embodiments, the continuous first conductivity-type semiconductor layer 107L may be a p-type semiconductor material including, but not limited to, one or more of NiO, SnO, and $Cu_2O$. Other suitable p-type semiconductor materials are within the contemplated scope of disclosure. In some embodiments, following the deposition of the continuous first conductivity-type semiconductor layer 107L, the intermediate structure may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

Figure 5A:
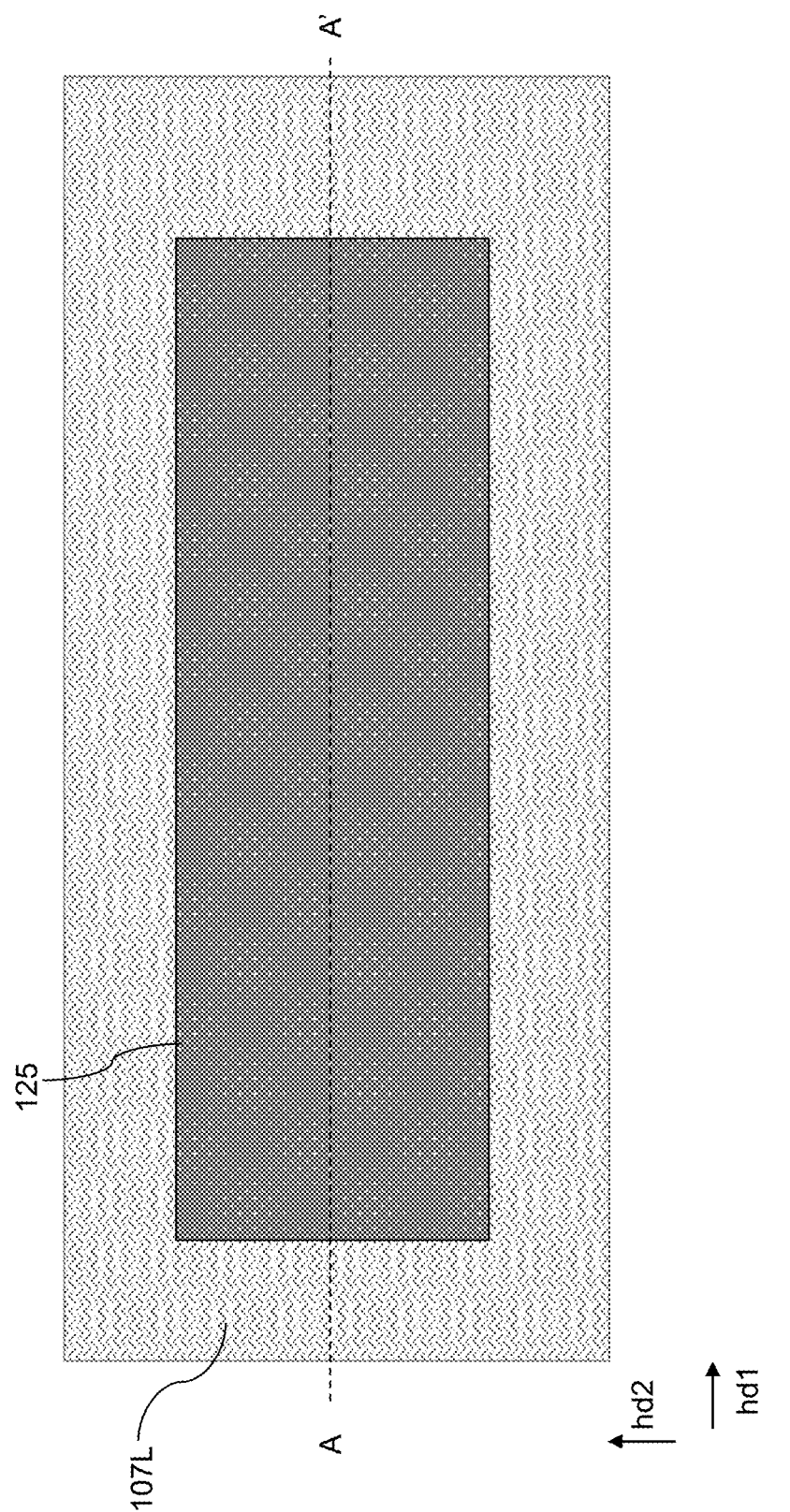
FIG. 5A is a top view of the intermediate structure illustrating a patterned mask formed over the continuous first conductivity-type semiconductor layer according to various embodiments of the present disclosure.
Figure 5B:
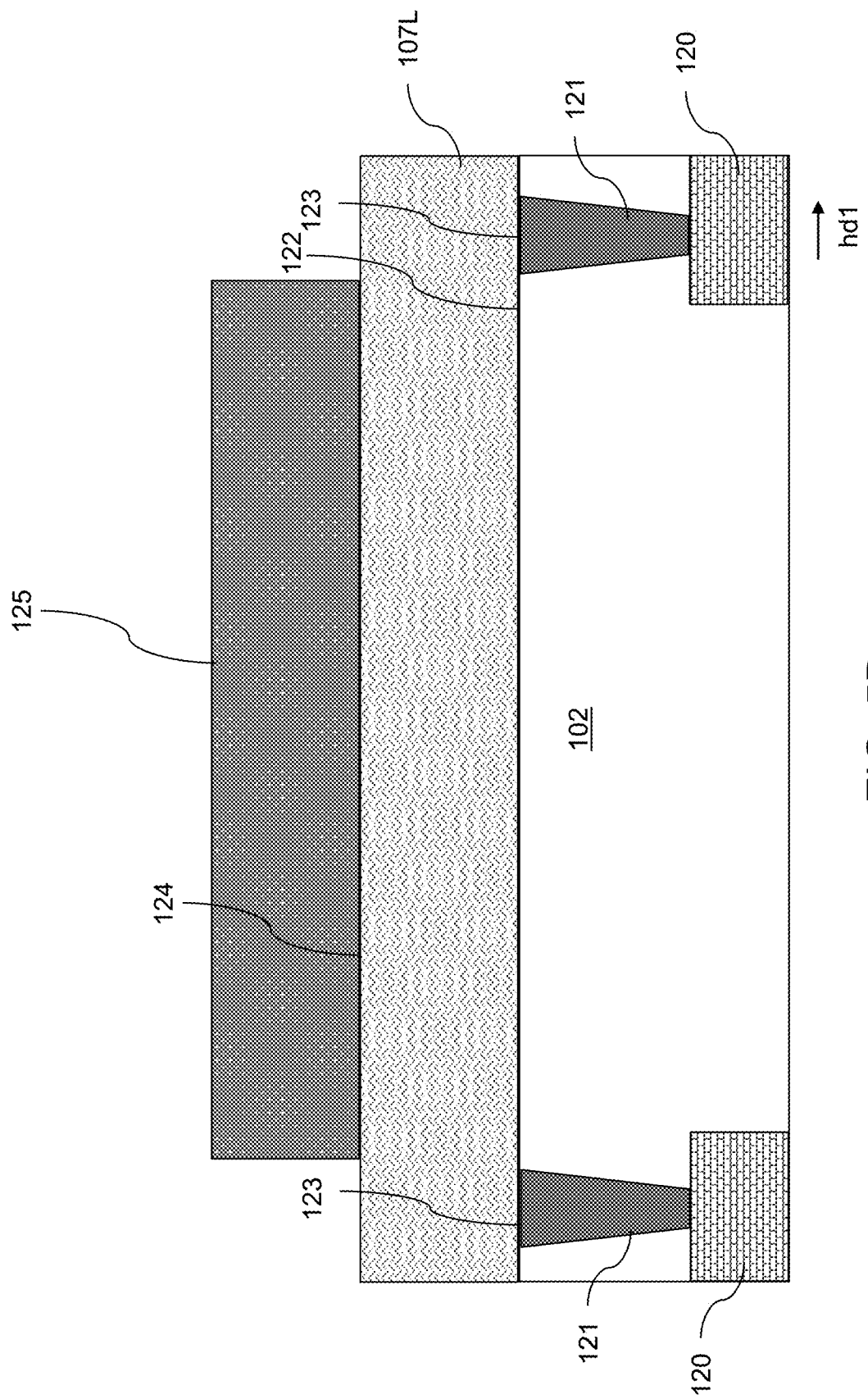
FIG. 5B is a vertical cross-section view of the intermediate structure taken along line A-A' in FIG. 5A.

FIG. 5A is a top view of the intermediate structure illustrating a patterned mask 125 formed over the continuous first conductivity-type semiconductor layer 107L according to various embodiments of the present disclosure. FIG. 5B is a vertical cross-section view of the intermediate structure taken along line A-A' in FIG. 5A. Referring to FIGS. 5A and 5B, the patterned mask 125 may be formed by depositing a layer of a photoresist material over the upper surface 124 of the continuous first conductivity-type semiconductor layer 107L and patterning the photoresist material using lithographic techniques to form a patterned photoresist mask 125 as shown in FIGS. 5A and 5B. In some embodiments, the patterned mask 125 may include a strip-shaped portion having a length along the first horizontal direction hd1 of at least about 15 nm and a width along the second horizontal direction hd2 of at least about 5 nm. The patterned mask 125 may then be used as a mask to pattern the continuous first conductivity-type semiconductor layer 107L, as described in greater detail with reference to FIGS. 6A and 6B, below.

Figure 6A:
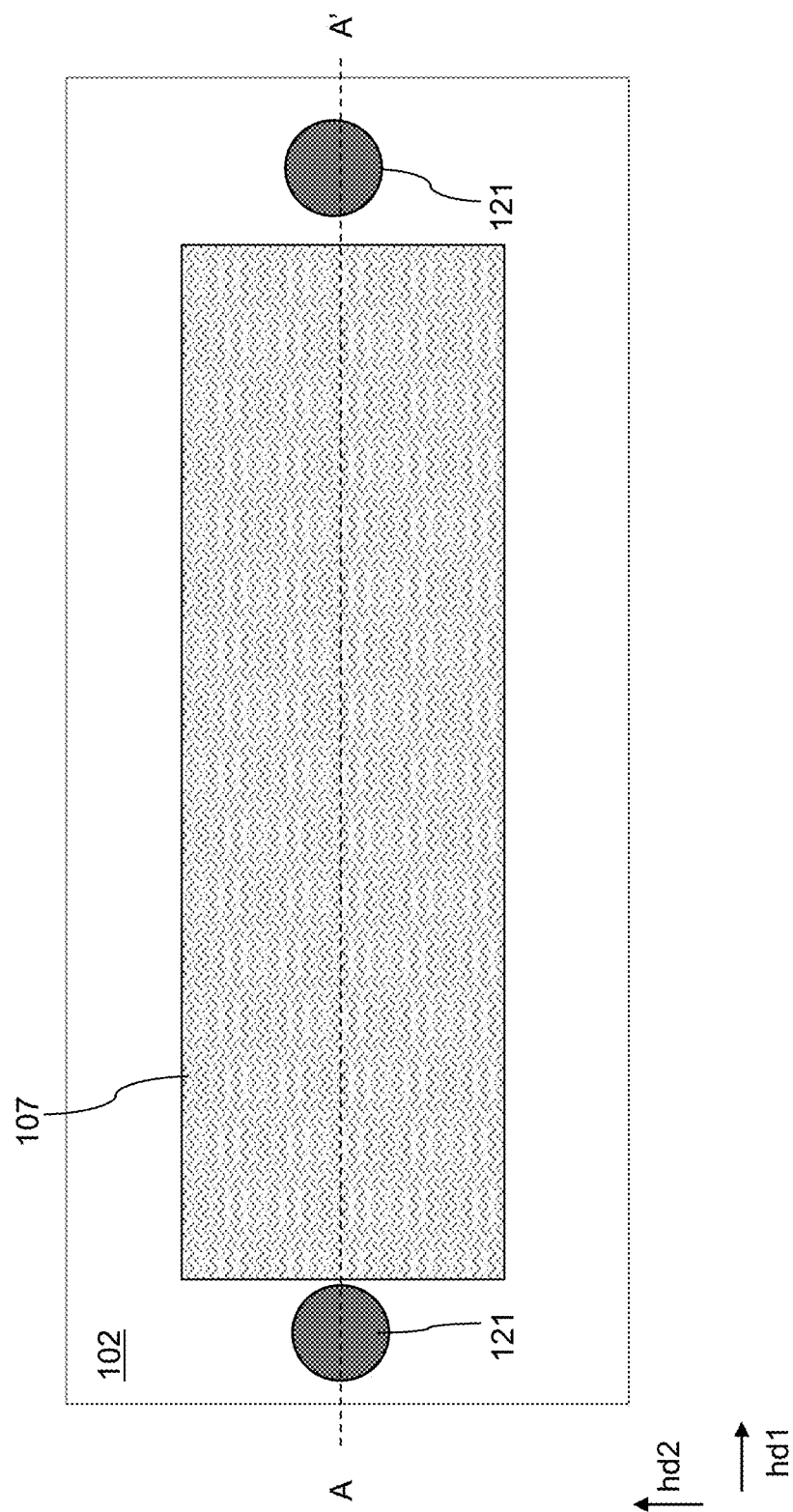
FIG. 6A is a top view of the intermediate structure illustrating a discrete first conductivity-type semiconductor layer over the first dielectric material layer according to various embodiments of the present disclosure.
Figure 6B:
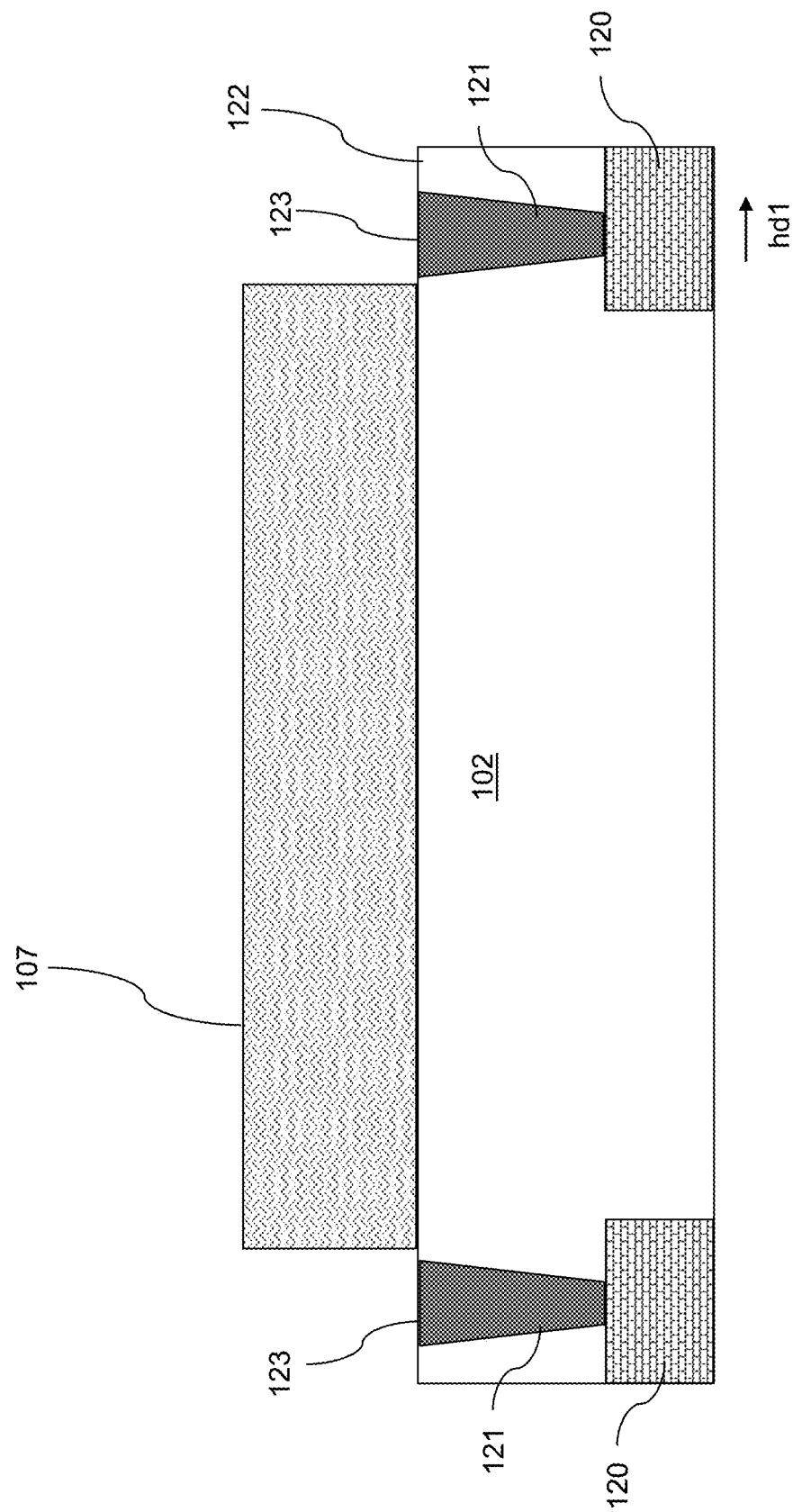
FIG. 6B is a vertical cross-section view of the intermediate structure taken along line A-A' in FIG. 6A.

FIG. 6A is a top view of the intermediate structure illustrating a discrete first conductivity-type semiconductor layer 107 over the first dielectric material layer 102 according to various embodiments of the present disclosure. FIG. 6B is a vertical cross-section view of the intermediate structure taken along line A-A' in FIG. 6A. Referring to FIGS. 6A and 6B, an anisotropic etching process may be performed to remove portions of the continuous first conductivity-type semiconductor layer 107 that are not masked by the patterned mask 125. The patterned mask 125 may then be removed by ashing or by dissolution with a solvent.

The remaining portion of the continuous first conductivity-type semiconductor layer 107 may include a discrete first conductivity-type semiconductor layer 107 over the upper surface 122 of the first dielectric material layer 102. In some embodiments, the first conductivity-type semiconductor layer 107 may have a length along the first horizontal direction hd1 of at least about 15 nm and a width along the second horizontal direction hd2 of at least about 5 nm.

Figure 7A:
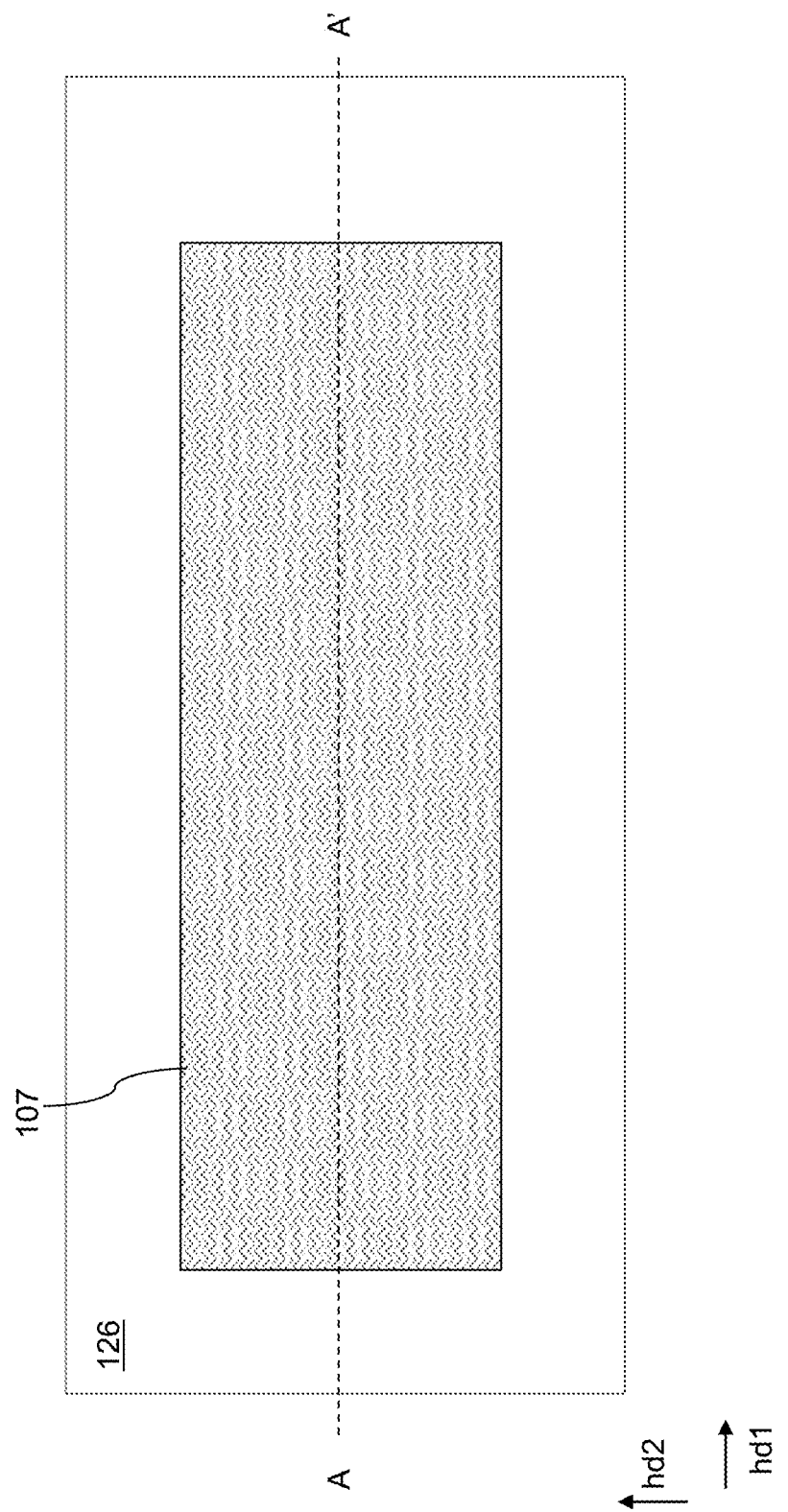
FIG. 7A is a top view of the intermediate structure illustrating a second dielectric material layer formed over the first dielectric material layer and laterally surrounding the first conductivity-type semiconductor layer according to various embodiments of the present disclosure.
Figure 7B:
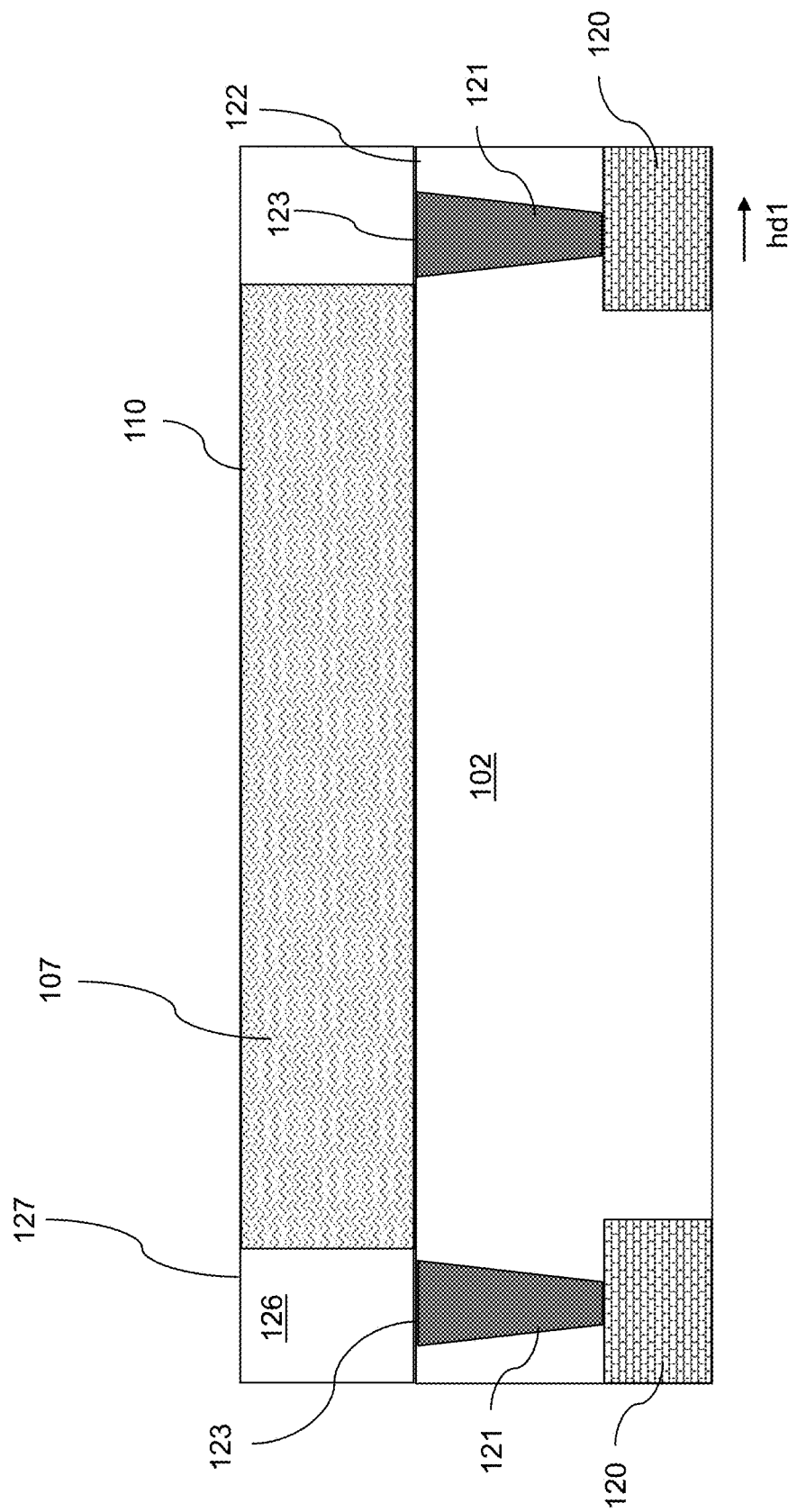
FIG. 7B is a vertical cross-section view of the intermediate structure taken along line A-A' in FIG. 7A.

FIG. 7A is a top view of the intermediate structure illustrating a second dielectric material layer 126 formed over the first dielectric material layer 102 and laterally surrounding the first conductivity-type semiconductor layer 107 according to various embodiments of the present disclosure. FIG. 7B is a vertical cross-section view of the intermediate structure taken along line A-A' in FIG. 7A. Referring to FIGS. 7A and 7B, the second dielectric material layer 126 may be deposited over the upper surface 122 of the first dielectric material layer 102, the upper surfaces 123 of the conductive vias 121, and over the upper surface 110 and side surfaces of the first conductivity-type semiconductor layer 107 via a suitable deposition method (e.g., CVD, ALD, PVD, PECVD, spin coating, etc.). The second dielectric material layer 126 may be composed of a suitable dielectric material as described above (e.g., undoped silicate glass, a doped silicate glass, organosilicate glass, silicon oxynitride, silicon carbide nitride, etc.). An optional planarization process, such as a chemical mechanical planarization (CMP) process, may be performed to remove excess portions of the second dielectric material layer 126 from over the upper surface 110 of the first conductivity-type semiconductor layer 107 and provide a planar upper surface 127 of the second dielectric material layer 126. In the embodiment of FIGS. 7A and 7D, the planar upper surface 127 of the second dielectric material layer 126 is substantially coplanar with the upper surface 110 of the first conductivity-type semiconductor layer 107. In other embodiments, the planar upper surface 127 of the second dielectric material layer 126 may extend over the upper surface 110 of the first conductivity-type semiconductor layer 107.

Figure 8A:
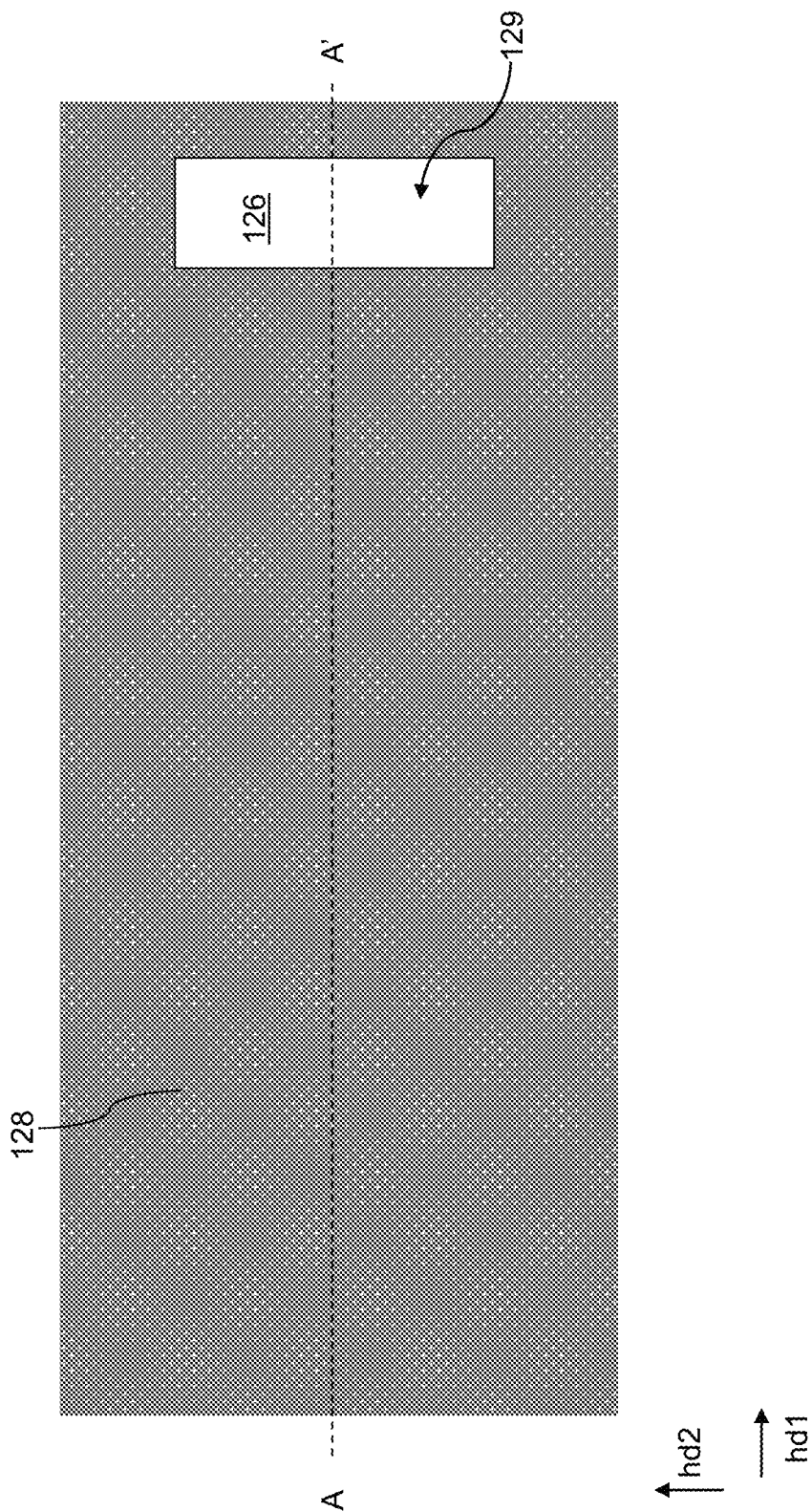
FIG. 8A is a top view of the intermediate structure illustrating a patterned mask formed over the second dielectric material layer and the first conductivity-type semiconductor layer according to various embodiments of the present disclosure.
Figure 8B:
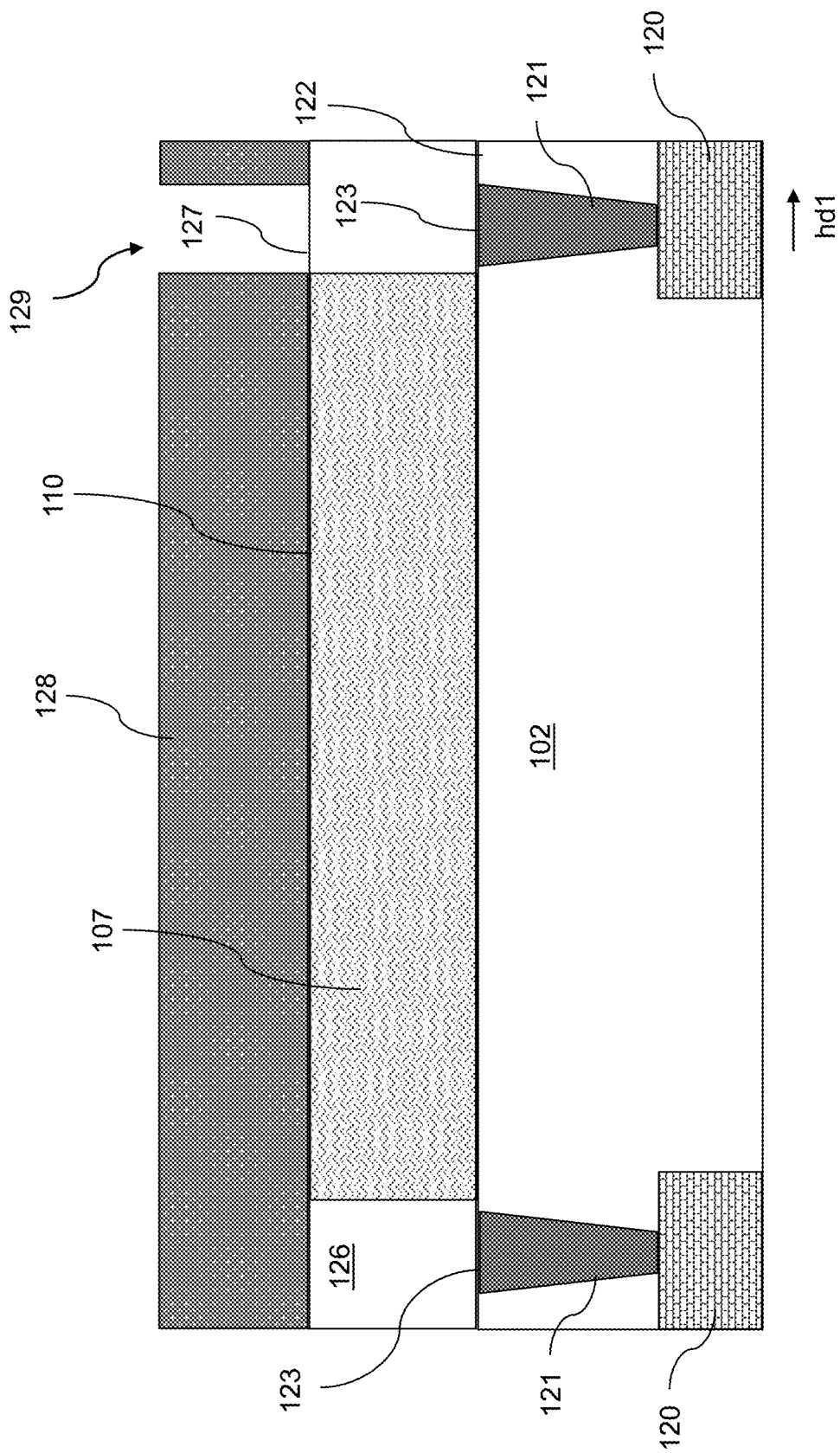
FIG. 8B is a vertical cross-section view of the intermediate structure taken along line A-A' in FIG. 8A.

FIG. 8A is a top view of the intermediate structure illustrating a patterned mask 128 formed over the second dielectric material layer 126 and the first conductivity-type semiconductor layer 107 according to various embodiments of the present disclosure. FIG. 8B is a vertical cross-section view of the intermediate structure taken along line A-A' in FIG. 8A. Referring to FIGS. 8A and 8B, the patterned mask 128 may be formed by depositing a layer of a photoresist material over the upper surface 127 of the second dielectric material layer 126 and the upper surface 110 of the first conductivity-type semiconductor layer 107 and patterning the photoresist material using lithographic techniques to form a patterned photoresist mask 128 as shown in FIGS. 8A and 8B. The patterned mask 128 may include a strip-shaped opening 129 through the patterned mask 128, where a portion of the second dielectric material layer 126 may be exposed at the bottom of the opening 129 in the patterned mask 128. In some embodiments, the opening 129 may have a dimension along the second horizontal direction hd2 that is at least about 5 nm and may be substantially equal to the width dimension of the first conductivity-type semiconductor layer 107 along the second horizontal direction hd2. The opening 129 may have a dimension along the first horizontal direction hd1 of at least about 5 nm.

Figure 9A:
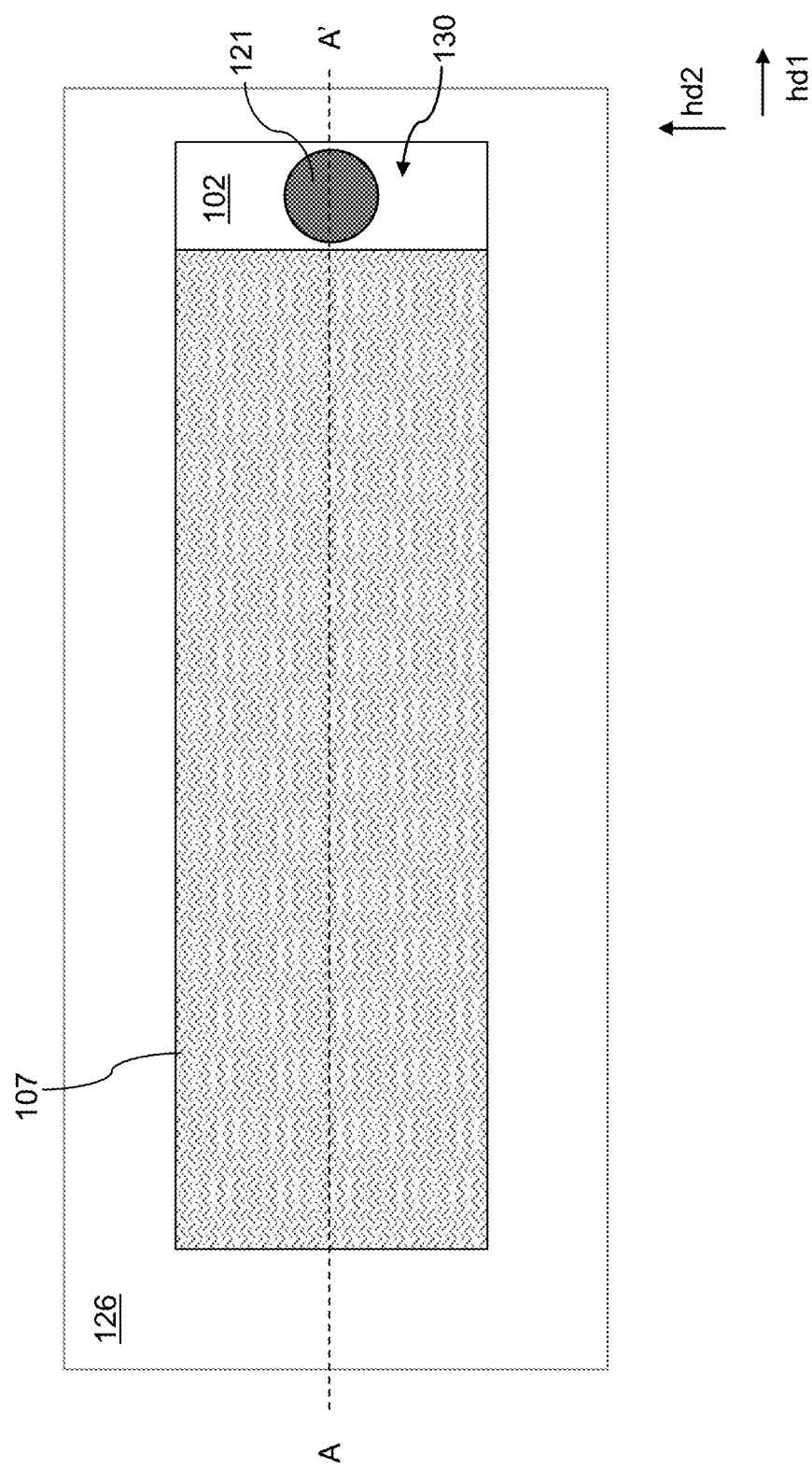
FIG. 9A is a top view of the intermediate structure illustrating an opening formed through the second dielectric material layer and exposing the upper surface of the first dielectric material layer and the upper surface of a conductive via according to various embodiments of the present disclosure.
Figure 9B:
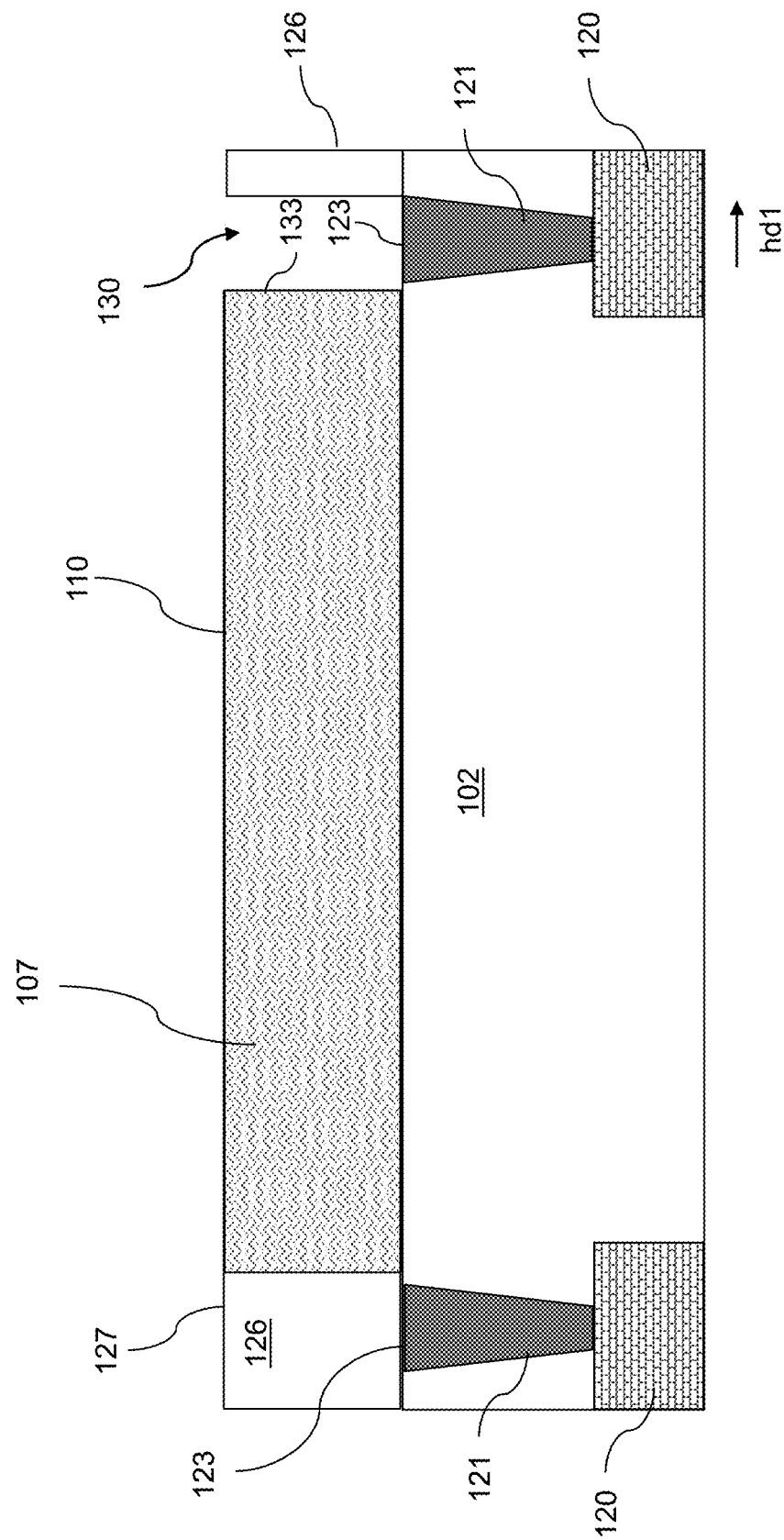
FIG. 9B is a vertical cross-section view of the intermediate structure taken along line A-A' in FIG. 9A.

FIG. 9A is a top view of the intermediate structure illustrating an opening 130 formed through the second dielectric material layer 126 and exposing the upper surface 122 of the first dielectric material layer 102 and the upper surface 123 of a conductive via 121 according to various embodiments of the present disclosure. FIG. 9B is a vertical cross-section view of the intermediate structure taken along line A-A' in FIG. 9A. Referring to FIGS. 9A and 9B, an anisotropic etching process may be performed to remove portions of the second dielectric material layer 126 that are not masked by the patterned mask 128 and form an opening 130 extending through the second dielectric material layer 126. The patterned mask 128 may then be removed by ashing or by dissolution with a solvent. Following the etching process, the upper surface 122 of the first dielectric material layer 102 and the upper surface 123 of a conductive via 121 may be exposed on the bottom of the opening 130. A side surface 133 of the first conductivity-type semiconductor layer 107 may be exposed along a side of the opening 130. In some embodiments, the opening 130 in the second dielectric material layer 126 may have a dimension along the second horizontal direction hd2 that is at least about 5 nm and may be substantially equal to the width dimension of the first conductivity-type semiconductor layer 107 along the second horizontal direction hd2. The opening 130 may have a dimension along the first horizontal direction hd1 of at least about 5 nm.

Figure 10A:
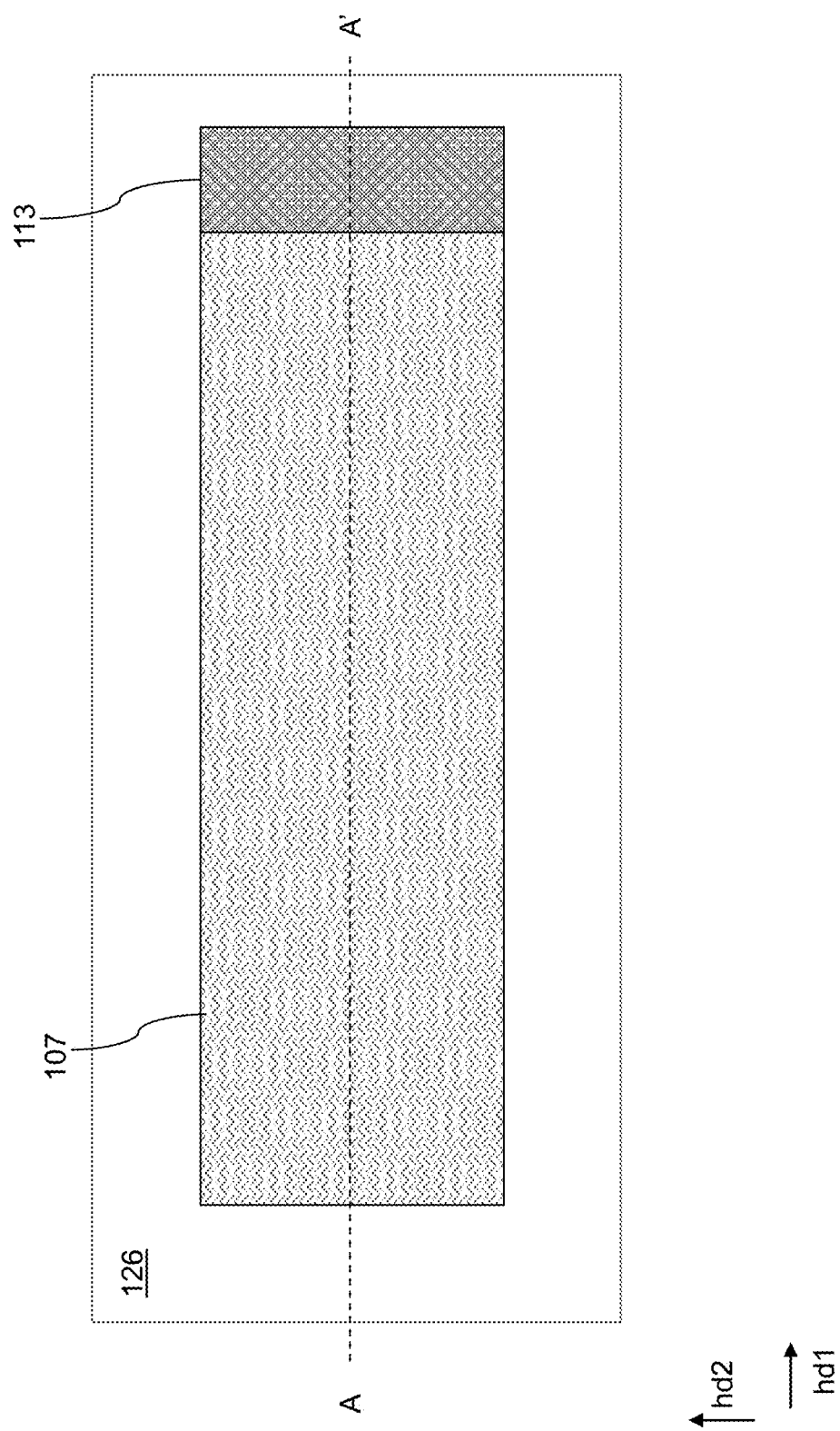
FIG. 10A is a top view of the intermediate structure illustrating a first electrode formed within the opening in the second dielectric material layer according to various embodiments of the present disclosure.
Figure 10B:
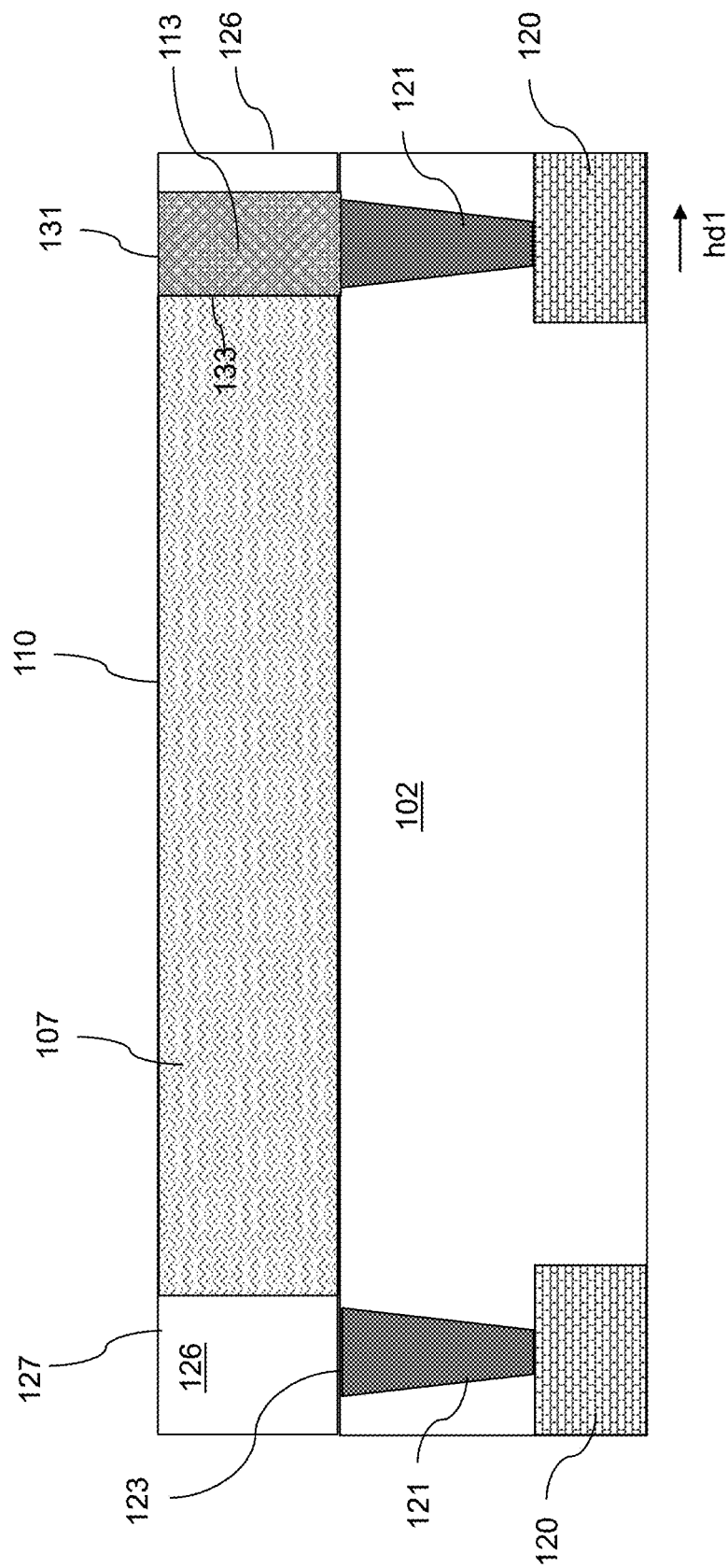
FIG. 10B is a vertical cross-section view of the intermediate structure taken along line A-A' in FIG. 10A.

FIG. 10A is a top view of the intermediate structure illustrating a first electrode 113 formed within the opening 130 in the second dielectric material layer 126 according to various embodiments of the present disclosure. FIG. 10B is a vertical cross-section view of the intermediate structure taken along line A-A' in FIG. 10A. Referring to FIGS. 10A and 10B, a conductive material may be deposited within the opening 130 in the second dielectric material layer 126 and over the upper surface 110 of the first conductivity-type semiconductor layer 107 and the upper surface 127 of the second dielectric material layer 126. In some embodiments, the conductive material may include a metallic liner material and a metallic fill material. The metallic liner material may include a conductive metallic nitride or a conductive metallic carbide such as Ti, Al, TiN, TiN/W, Ti/Al/Ti, TaN, W, Cu, WN, WCN, PdCo, TiC, TaC, and/or WC. The metallic fill material may include W, Cu, Al, Co, Ru, Mo, Ta, Ti, TiN, TaN, alloys thereof, and/or combinations thereof. Other suitable metallic liner and metallic fill materials within the contemplated scope of this disclosure may also be used. The conductive material may be formed by suitable deposition process, which may include one or more of a CVD process, a PVD process, an ALD process, an electroplating process, etc. Other suitable deposition processes are within the contemplated scope of disclosure. Excess portions of the conductive material may be removed from above a horizontal plane including the upper surface 110 of the first conductivity-type semiconductor layer 107 and the upper surface 127 of the second dielectric material layer 126 by a planarization process such as CMP, although other suitable planarization processes may be used. The remaining portion of the conductive material may form the first electrode 113. The first electrode 113 may contact a conductive via 121 on a bottom surface of the first electrode 113, and may contact a side surface 133 of the first conductivity-type semiconductor layer 107 on a side surface 133 of the first electrode 113. A width dimension of the first electrode 113 along the second horizontal direction hd2 may be substantially equal to the corresponding width dimension of the first conductivity-type semiconductor layer 107. A height dimension of the first electrode 113 (along a vertical direction) may be substantially equal to the corresponding thickness dimension of the first conductivity-type semiconductor layer 107 (i.e., the upper surface 131 of the first electrode 113 may be substantially coplanar with the upper surface 110 of the first conductivity-type semiconductor layer 107). A length dimension of the first electrode 113 along the first horizontal direction hd1 may be at least about 5 nm in various embodiments.

Figure 11A:
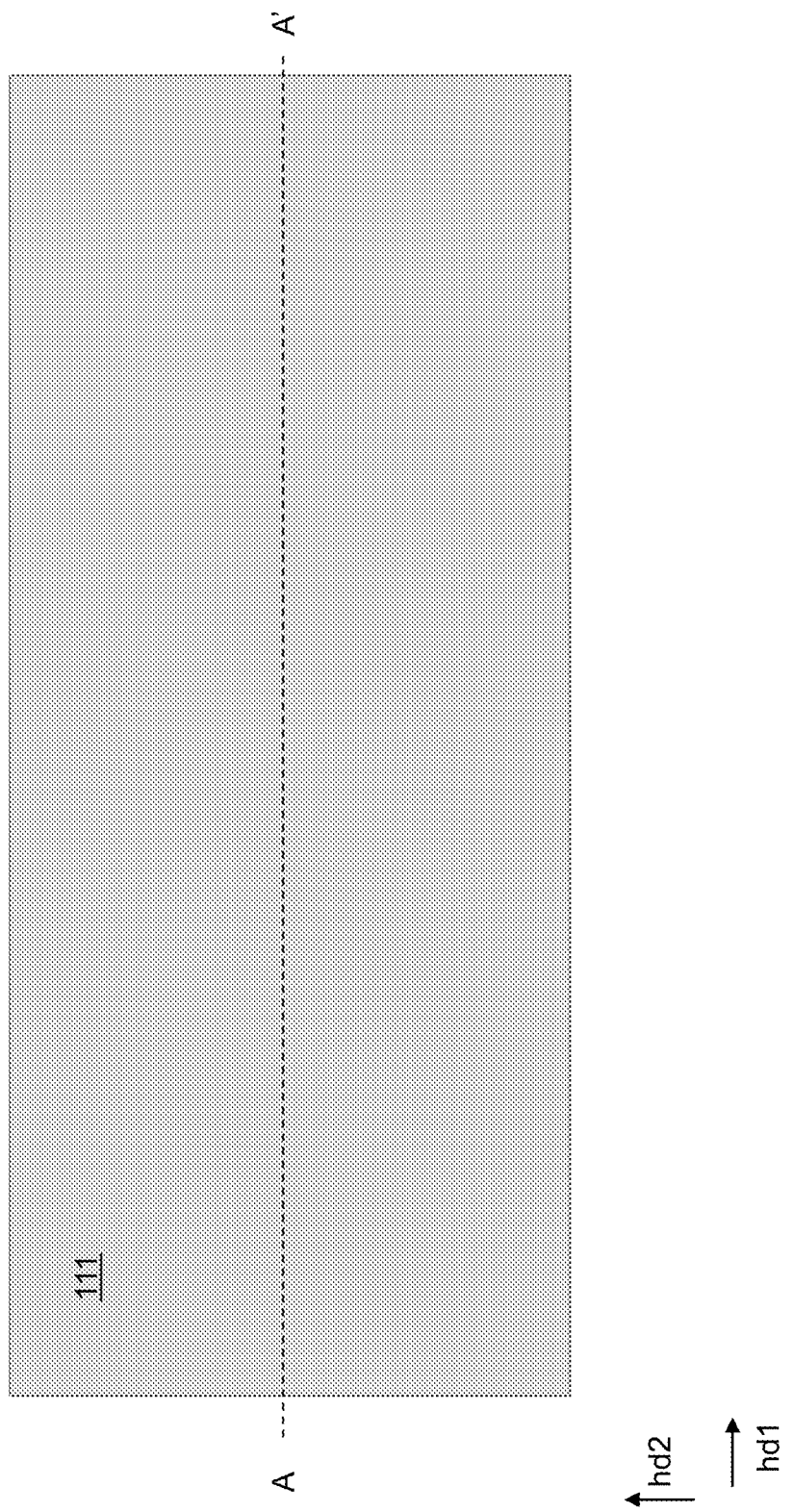
FIG. 11A is a top view of the intermediate structure illustrating a dielectric isolation layer formed over the first conductivity-type semiconductor layer, the first electrode and the second dielectric material layer according to various embodiments of the present disclosure.
Figure 11B:
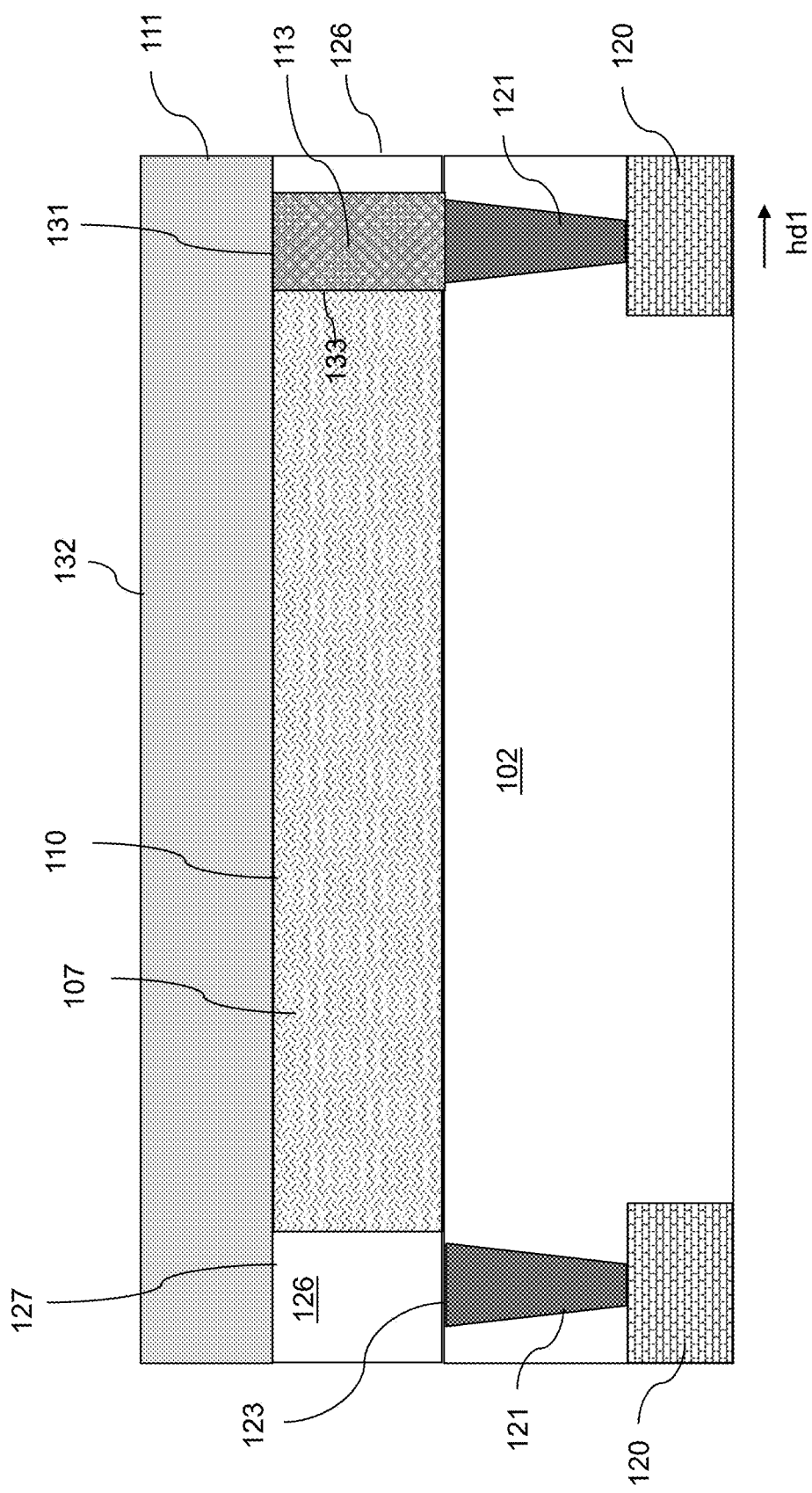
FIG. 11B is a vertical cross-section view of the intermediate structure taken along line A-A' in FIG. 11A.

FIG. 11A is a top view of the intermediate structure illustrating a dielectric isolation layer 111 formed over the first conductivity-type semiconductor layer 107, the first electrode 113 and the second dielectric material layer 126 according to various embodiments of the present disclosure. FIG. 11B is a vertical cross-section view of the intermediate structure taken along line A-A' in FIG. 11A. Referring to FIGS. 11A and 11B, a dielectric isolation layer 111 may be formed over the upper surface 110 of the first conductivity-type semiconductor layer 107, the upper surface 131 of the first electrode 113, and the upper surface 127 of the second dielectric material layer 126. The dielectric isolation layer 111 may include, but is not limited to, aluminum oxide, silicon oxide, silicon nitride, silicon oxynitride, hafnium oxide, hafnium silicon oxide, hafnium tantalum oxide, hafnium titanium oxide, hafnium zirconium oxide, zirconium oxide, titanium oxide, hafnium dioxide-alumina, or various other insulating structures such as a multi-layer stack structure including alternating insulating layers. The dielectric isolation layer may be deposited by a suitable deposition process (e.g., CVD, ALD, PVD, PECVD, spin coating, etc.) as described above. In some embodiments, a thickness of the dielectric isolation layer 111 may be at least about 5 nm (e.g., between about 5 nm and about 500 nm), although greater and lesser thicknesses may also be utilized.

Figure 12A:
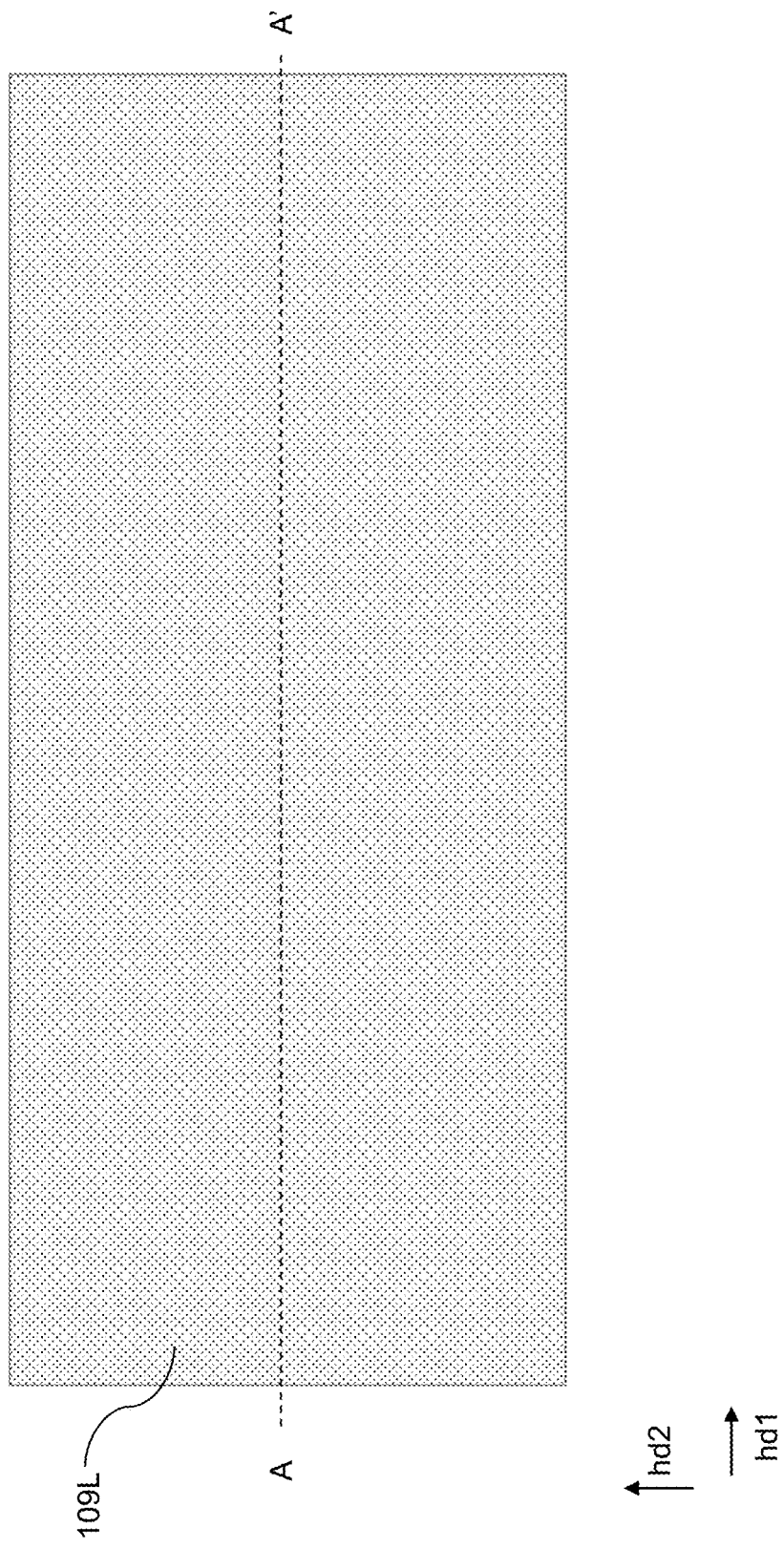
FIG. 12A is a top view of the intermediate structure illustrating a continuous second conductivity-type semiconductor layer formed over the dielectric isolation layer according to various embodiments of the present disclosure.
Figure 12B:
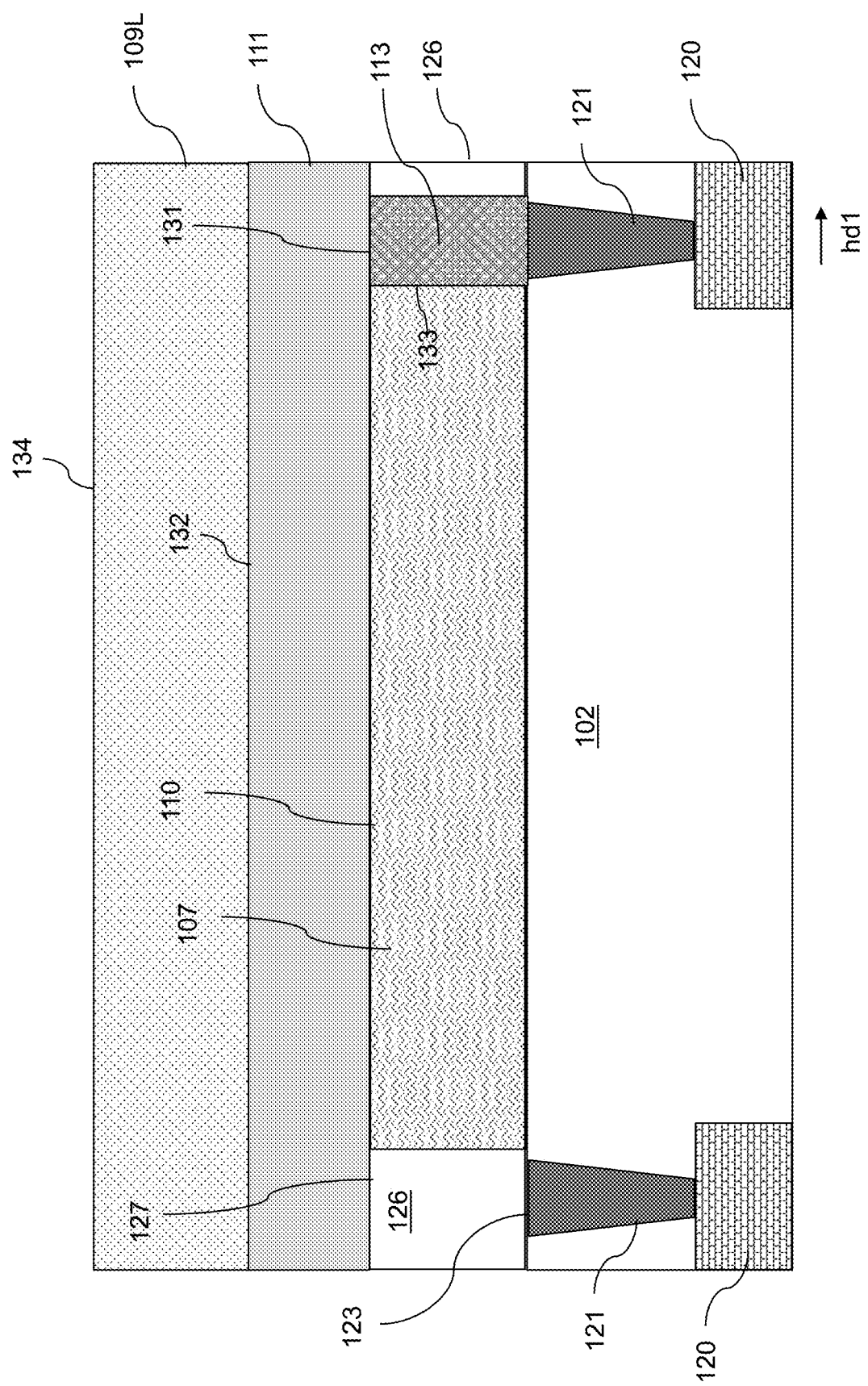
FIG. 12B is a vertical cross-sectional view of the intermediate structure taken along line A-A' in FIG. 12B.

FIG. 12A is a top view of the exemplary structure illustrating a continuous second conductivity-type semiconductor layer 109L formed over the dielectric isolation layer 111 according to various embodiments of the present disclosure. FIG. 12B is a vertical cross-sectional view of the intermediate structure taken along line A-A' in FIG. 12B. Referring to FIGS. 12A and 12B, a continuous second conductivity-type semiconductor layer 109L may be deposited over the upper surface 132 of the dielectric isolation layer 111 via a suitable deposition process, such as ALD, CVD, PECVD, PVD, etc. A thickness of the continuous second conductivity-type semiconductor layer 109L may be in a range from approximately 2 nm to approximately 50 nm, although other embodiments may include smaller and larger thicknesses. The continuous second conductivity-type semiconductor layer 109L may be composed of a suitable semiconductor material, such as a metal oxide semiconductor material.

In some embodiments, the continuous second conductivity-type semiconductor layer 109L may be an n-type semiconductor material including, but not limited to, one or more of InZnO (IZO), InSnO (indium tin oxide (ITO), $In_2O_3$, $Ga_2O_3$, InGaZnO (IGZO), $Al_2O_5Zn_2$, ZnO, InGaO, InWO, ZnO, TiOx, aluminum-doped zinc oxide (AZO), including various combinations and alloys thereof. Other suitable n-type semiconductor materials, such as amorphous silicon, III-V materials, and the like, including combinations (e.g., stacked layers) and/or alloys thereof, may also be utilized. In some embodiments, the continuous second conductivity-type semiconductor layer 109L may have a composition given by $In_x Ga_y Zn_z MO$, wherein $0<x<1$; $0 \leq y \leq 1$; $0 \leq z \leq 1$; and M is one of Ti, Al, Ag, Ce, and Sn. In other embodiments, the continuous second conductivity-type semiconductor layer 109L may include an alloy of oxygen, a group-III element, and a group-V element. Following the deposition of the second conductivity type semiconductor layer 109L, the exemplary intermediate structure may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

The continuous second conductivity-type semiconductor layer 109L may have the opposite conductivity type as the first conductivity-type semiconductor layer 107 described above. Thus, in embodiments in which the first conductivity-type semiconductor layer 107 is composed of a p-type semiconductor material, the continuous second conductivity-type semiconductor layer 109L may be composed of an n-type semiconductor material. Alternatively, the first conductivity-type semiconductor layer 107 may be composed of an n-type semiconductor material as described above, in which case the continuous second conductivity-type semiconductor layer 109L may be composed of a suitable p-type semiconductor material as described above with reference to FIGS. 4A and 4B.

Figure 13A:
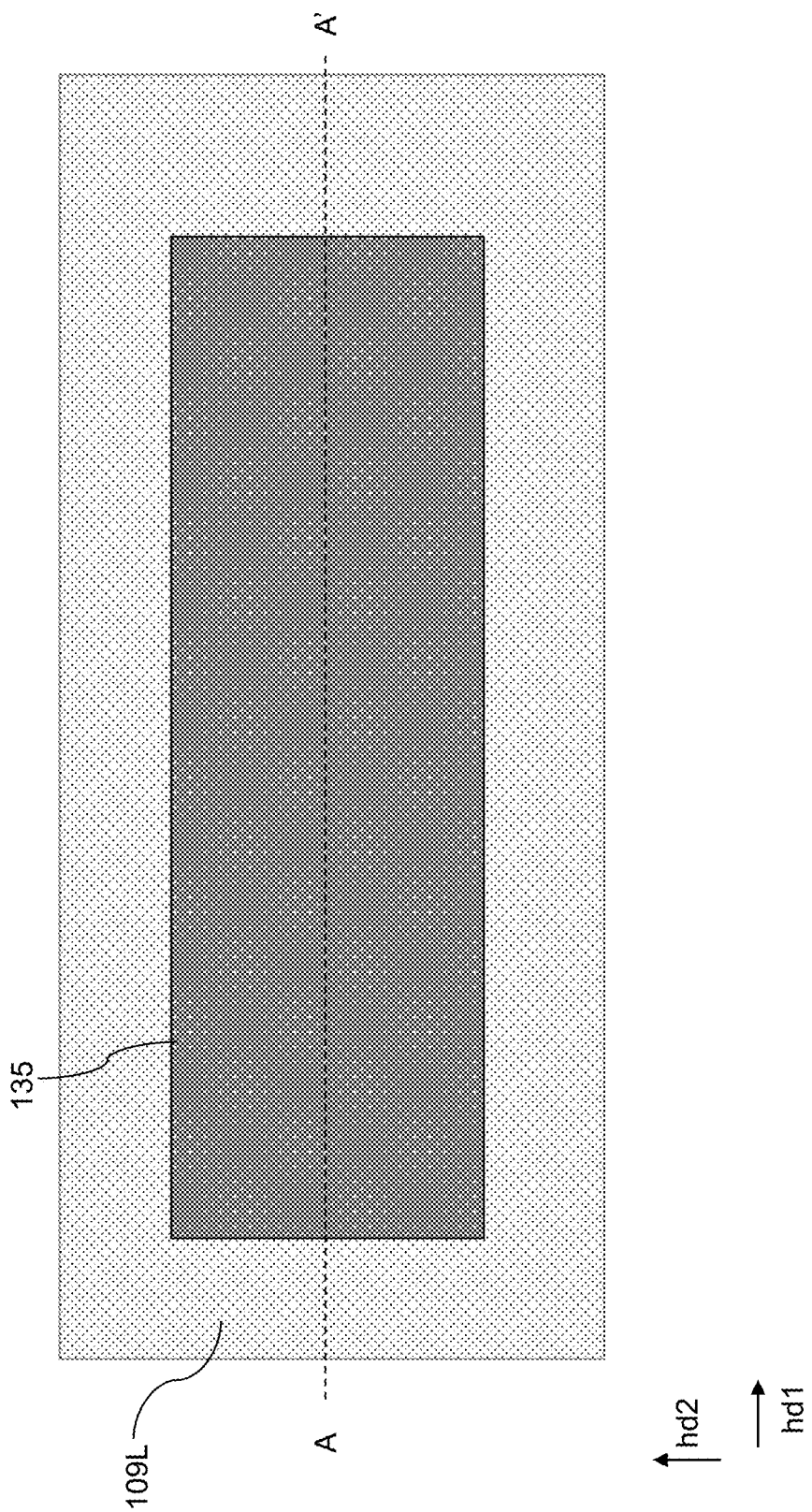
FIG. 13A is a top view of the intermediate structure illustrating a patterned mask formed over the continuous second conductivity-type semiconductor layer according to various embodiments of the present disclosure.
Figure 13B:
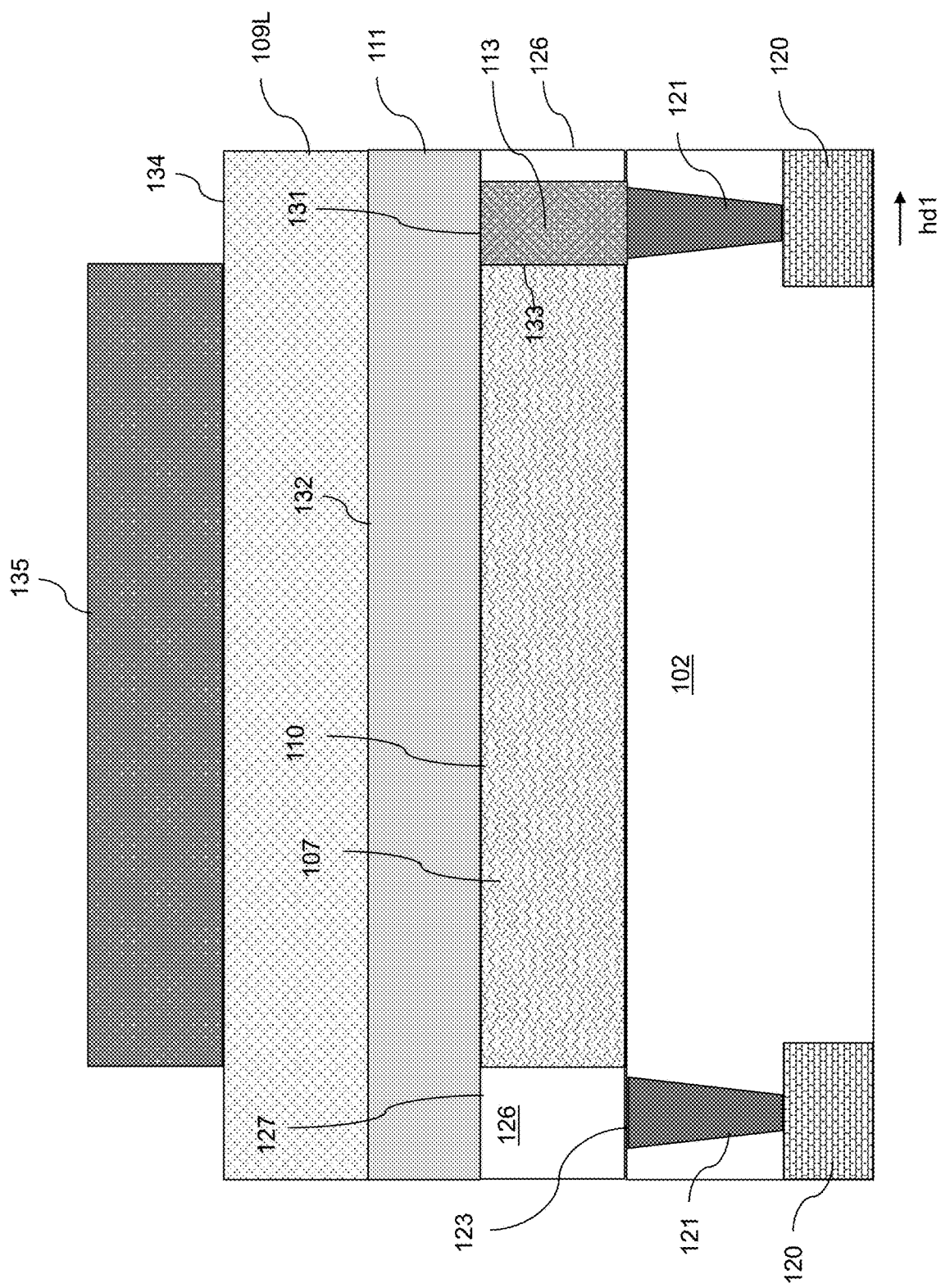
FIG. 13B is a vertical cross-section view of the intermediate structure taken along line A-A' in FIG. 13A.

FIG. 13A is a top view of the intermediate structure illustrating a patterned mask 135 formed over the continuous second conductivity-type semiconductor layer 109L according to various embodiments of the present disclosure. FIG. 13B is a vertical cross-section view of the intermediate structure taken along line A-A' in FIG. 13A. Referring to FIGS. 13A and 13B, the patterned mask 135 may be formed by depositing a layer of a photoresist material over the upper surface 134 of the continuous second conductivity-type semiconductor layer 109L and patterning the photoresist material using lithographic techniques to form a patterned photoresist mask 135 as shown in FIGS. 13A and 13B. In some embodiments, the patterned mask 135 may include a strip-shaped portion having a length along the first horizontal direction hd1 of at least about 15 nm and a width along the second horizontal direction hd2 of at least about 5 nm. In some embodiments, the patterned mask 135 may have substantially the same length and width dimensions as the underlying first conductivity-type semiconductor layer 107 and may be vertically aligned over the first conductivity-type semiconductor layer 107. The patterned mask 135 may then be used as a mask to pattern the continuous second conductivity-type semiconductor layer 109L, as described in greater detail with reference to FIGS. 14A and 14B, below.

Figure 14A:
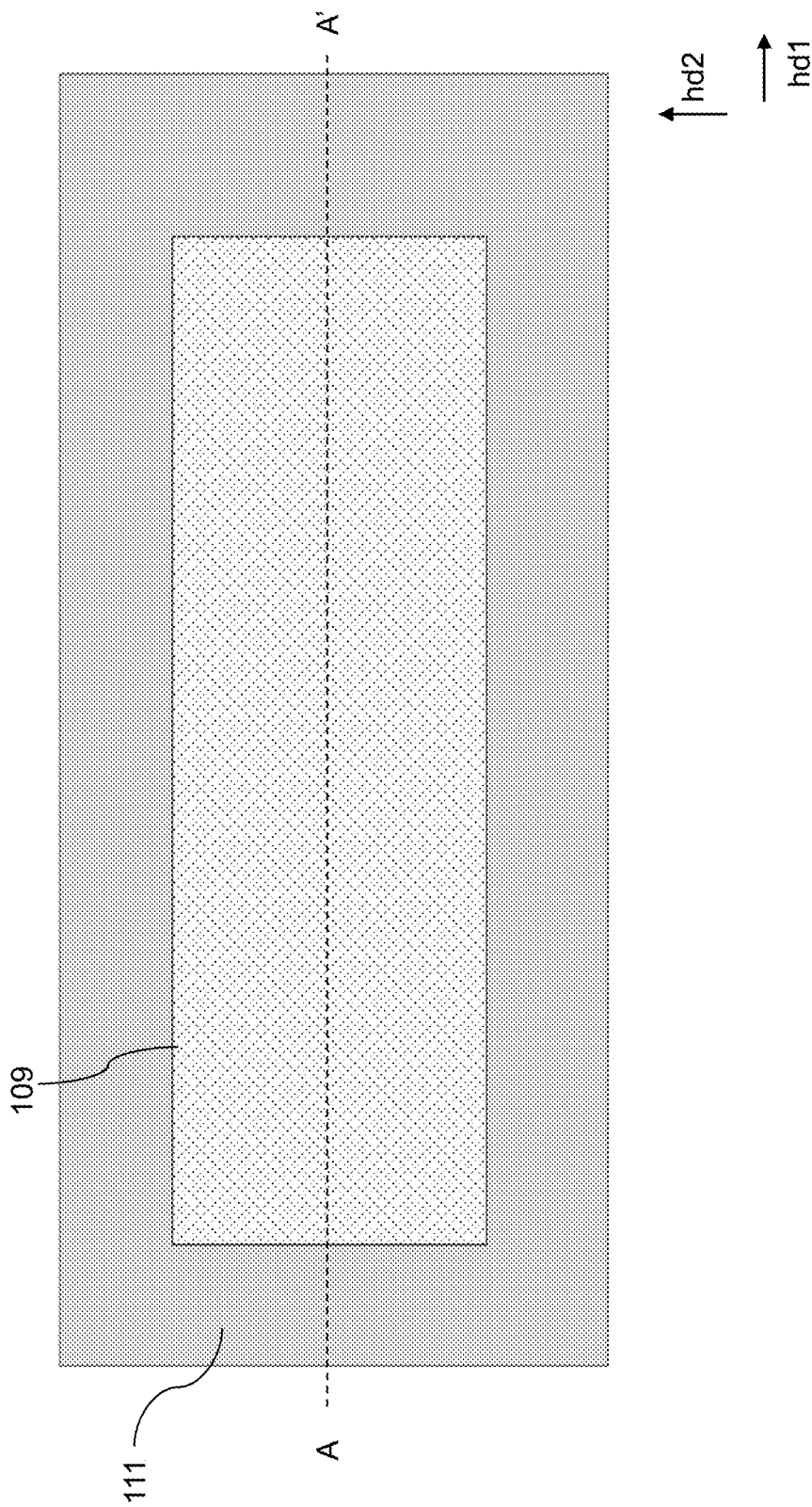
FIG. 14A is a top view of the intermediate structure illustrating a discrete second conductivity-type semiconductor layer over the dielectric isolation layer according to various embodiments of the present disclosure.
Figure 14B:
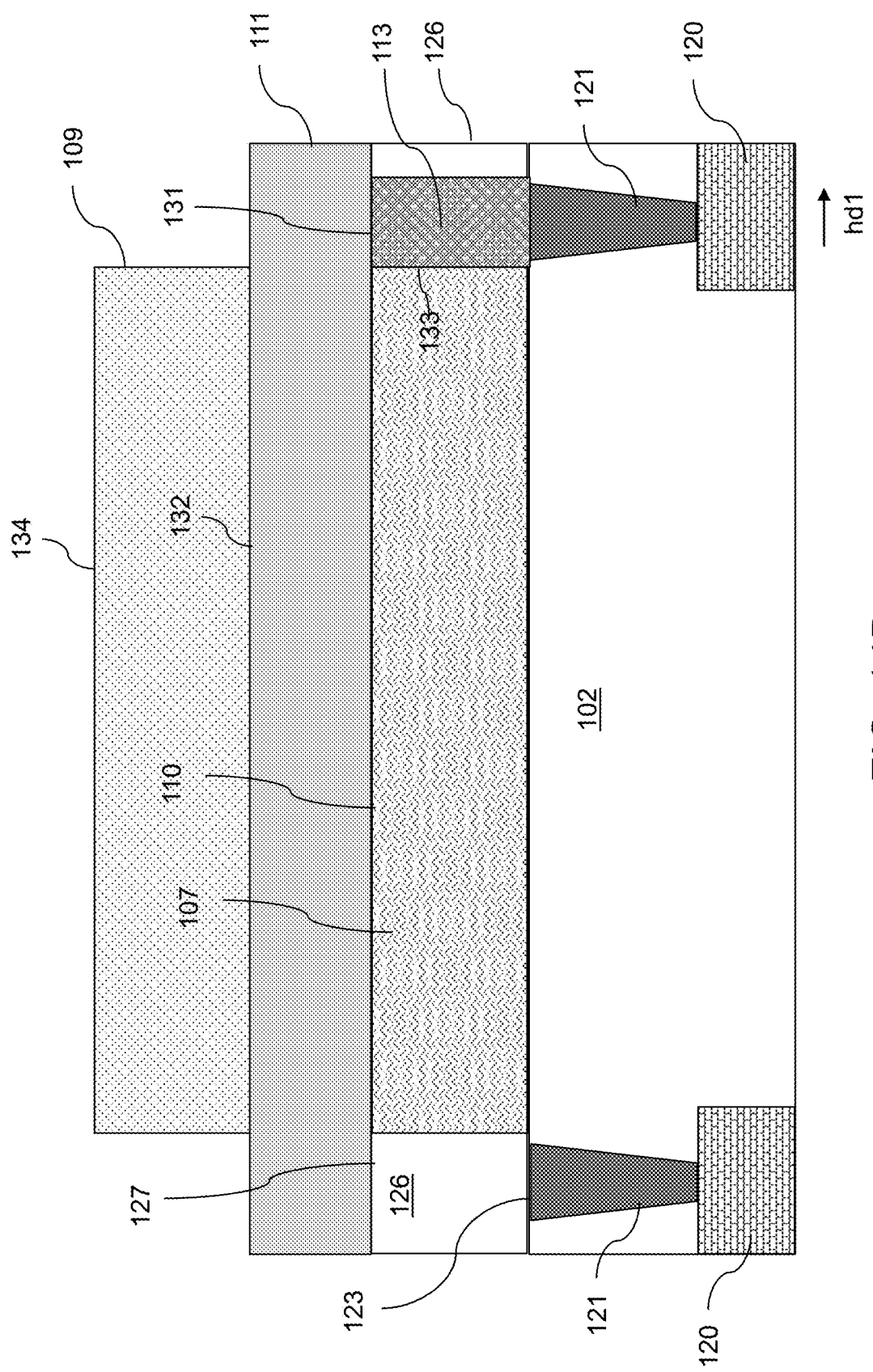
FIG. 14B is a vertical cross-section view of the intermediate structure taken along line A-A' in FIG. 14A.

FIG. 14A is a top view of the intermediate structure illustrating a discrete second conductivity-type semiconductor layer 109 over the dielectric isolation layer 111 according to various embodiments of the present disclosure. FIG. 14B is a vertical cross-section view of the intermediate structure taken along line A-A' in FIG. 14A. Referring to FIGS. 14A and 14B, an anisotropic etching process may be performed to remove portions of the continuous second conductivity-type semiconductor layer 109L that are not masked by the patterned mask 135. The patterned mask 135 may then be removed by ashing or by dissolution with a solvent. The remaining portion of the continuous first conductivity-type semiconductor layer 109L may include a discrete first conductivity-type semiconductor layer 109 over the upper surface 132 of the dielectric isolation layer 111. In some embodiments, the second conductivity-type semiconductor layer 109 may have a length along the first horizontal direction hd1 of at least about 15 nm and a width along the second horizontal direction hd2 of at least about 5 nm. In some embodiments, the second conductivity-type semiconductor layer 109 may have substantially the same length and width dimensions as the underlying first conductivity-type semiconductor layer 107 and may be vertically aligned over the first conductivity-type semiconductor layer 107. In this regard, side surfaces of the second conductivity-type semiconductor layer 109 may be substantially aligned with the corresponding side surfaces of the underlying first conductivity-type semiconductor layer 107.

Figure 15A:
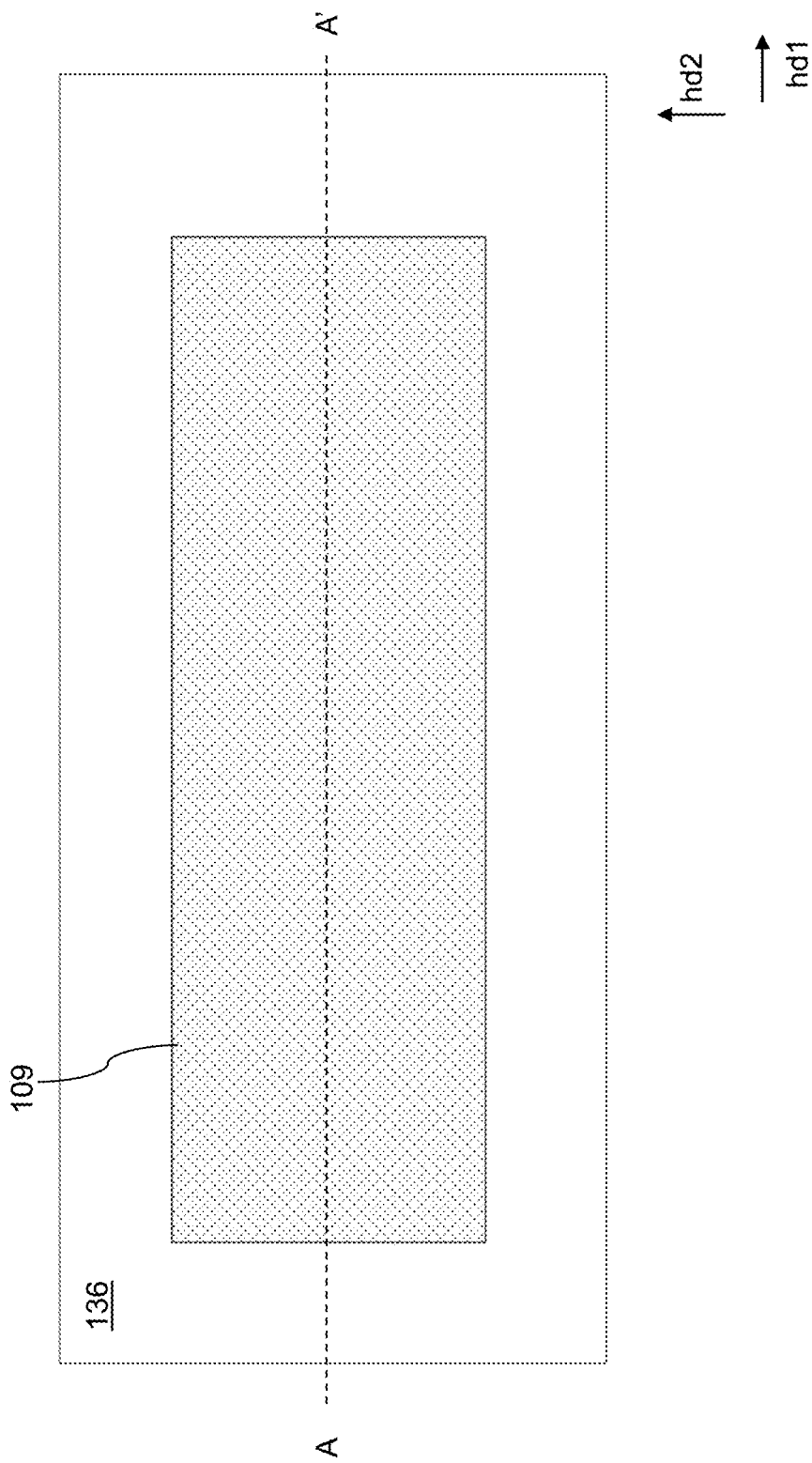
FIG. 15A is a top view of the intermediate structure illustrating a third dielectric material layer formed over the second dielectric material layer and laterally surrounding the second conductivity-type semiconductor layer according to various embodiments of the present disclosure.
Figure 15B:
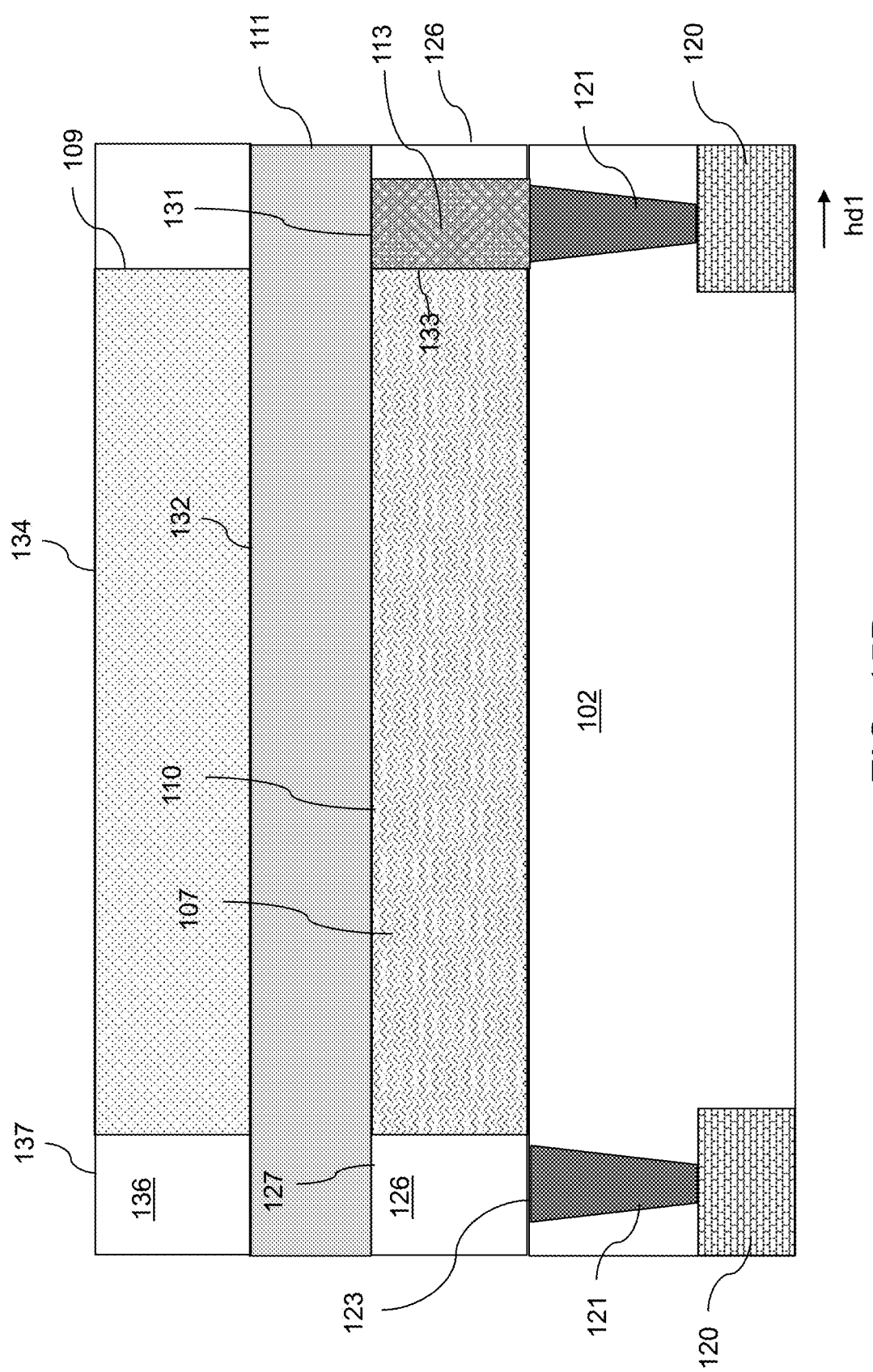
FIG. 15B is a vertical cross-section view of the intermediate structure taken along line A-A' in FIG. 15A.

FIG. 15A is a top view of the intermediate structure illustrating a third dielectric material layer 136 formed over the second dielectric material layer 126 and laterally surrounding the second conductivity-type semiconductor layer 109 according to various embodiments of the present disclosure. FIG. 15B is a vertical cross-section view of the intermediate structure taken along line A-A' in FIG. 15A. Referring to FIGS. 15A and 15B, the third dielectric material layer 136 may be deposited over the upper surface 127 of the second dielectric material layer 126 and the upper surface 134 and side surfaces of the second conductivity-type semiconductor layer 109 via a suitable deposition method (e.g., CVD, ALD, PVD, PECVD, spin coating, etc.). The third dielectric material layer 136 may be composed of a suitable dielectric material as described above (e.g., undoped silicate glass, a doped silicate glass, organosilicate glass, silicon oxynitride, silicon carbide nitride, etc.). An optional planarization process, such as a chemical mechanical planarization (CMP) process, may be performed to remove excess portions of the third dielectric material layer 136 from over the upper surface 134 of the second conductivity-type semiconductor layer 109 and provide a planar upper surface 137 of the third dielectric material layer 136. In the embodiment of FIGS. 15A and 15B, the planar upper surface 137 of the third dielectric material layer 136 is substantially coplanar with the upper surface 134 of the second conductivity-type semiconductor layer 109. In other embodiments, the planar upper surface 137 of the third dielectric material layer 136 may extend over the upper surface 134 of the second conductivity-type semiconductor layer 109.

Figure 16A:
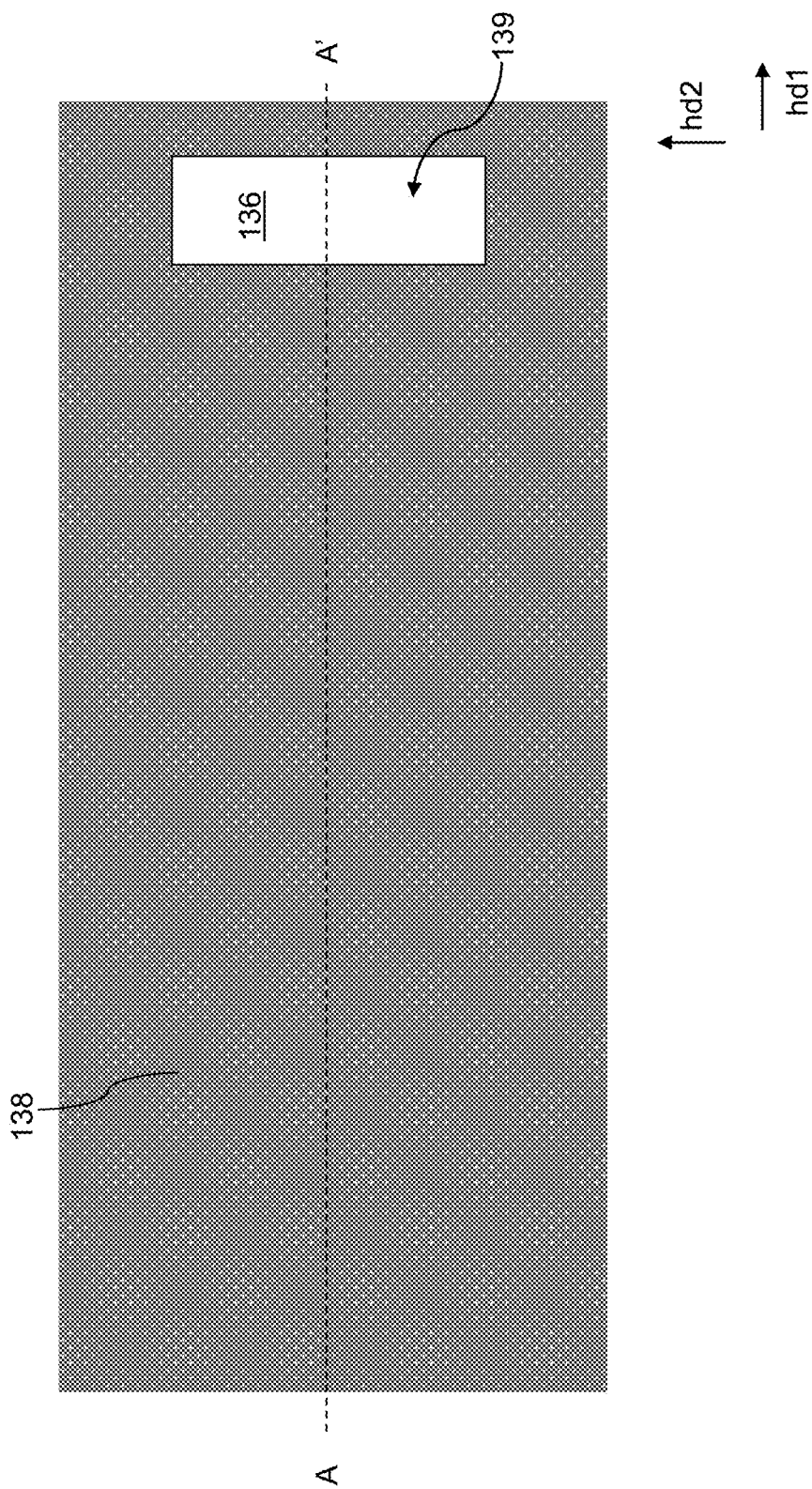
FIG. 16A is a top view of the intermediate structure illustrating a patterned mask formed over the third dielectric material layer and the second conductivity-type semiconductor layer according to various embodiments of the present disclosure.
Figure 16B:
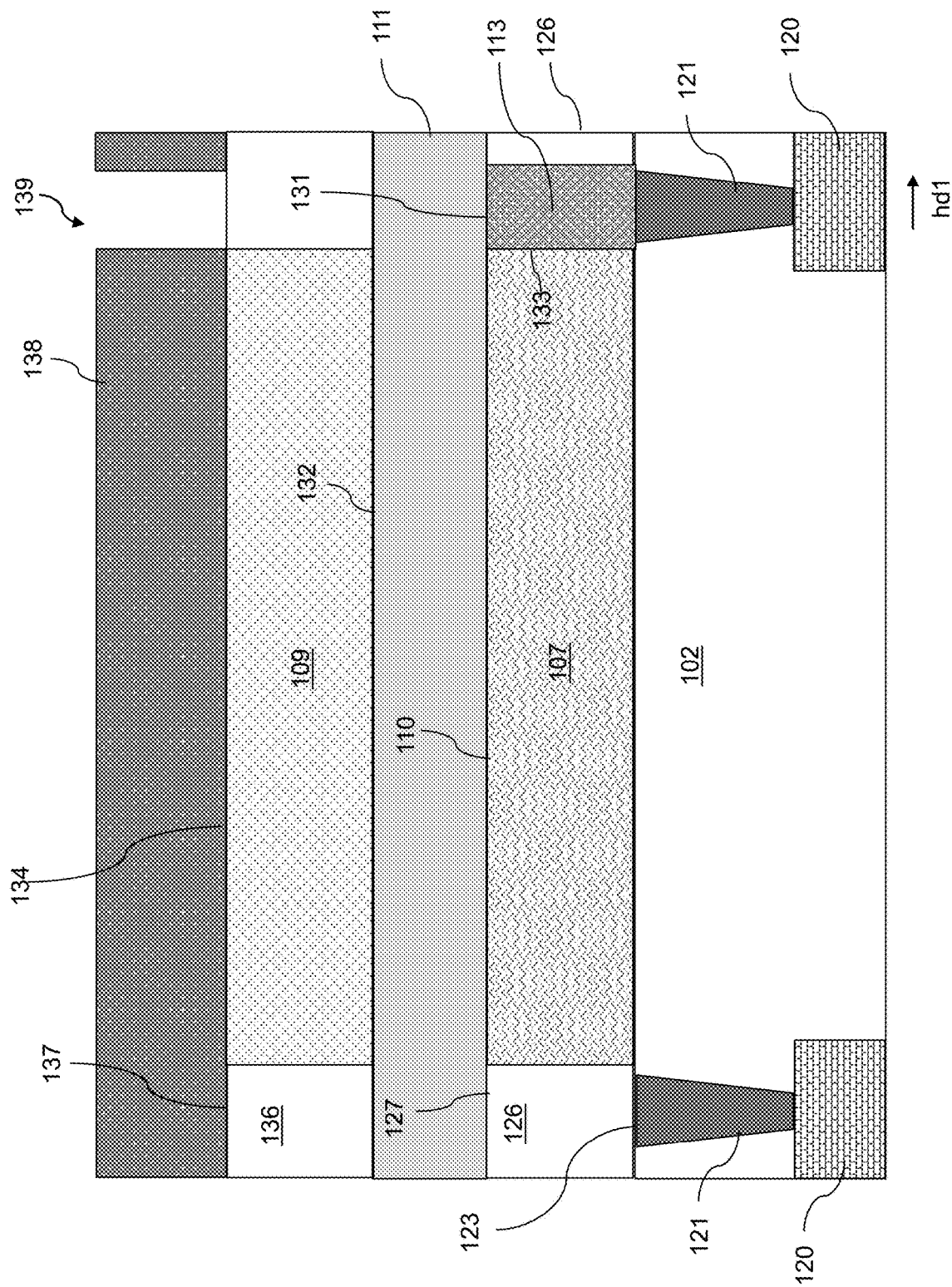
FIG. 16B is a vertical cross-section view of the intermediate structure taken along line A-A' in FIG. 16A.

FIG. 16A is a top view of the intermediate structure illustrating a patterned mask 138 formed over the third dielectric material layer 136 and the second conductivity-type semiconductor layer 109 according to various embodiments of the present disclosure. FIG. 16B is a vertical cross-section view of the intermediate structure taken along line A-A' in FIG. 16A. Referring to FIGS. 16A and 16B, the patterned mask 138 may be formed by depositing a layer of a photoresist material over the upper surface 137 of the third dielectric material layer 136 and the upper surface 134 of the second conductivity-type semiconductor layer 109 and patterning the photoresist material using lithographic techniques to form a patterned photoresist mask 138 as shown in FIGS. 16A and 16B. The patterned mask 138 may include a strip-shaped opening 139 through the patterned mask 138, where a portion of the third dielectric material layer 136 may be exposed at the bottom of the opening 139 in the patterned mask 138. In some embodiments, the opening 139 may have a dimension along the second horizontal direction hd2 that is at least about 5 nm and may be substantially equal to the width dimension of the second conductivity-type semiconductor layer 109 along the second horizontal direction hd2. The opening 139 may have a dimension along the first horizontal direction hd1 of at least about 5 nm. In some embodiments, the dimensions of the opening 139 along the first and second horizontal directions hd1 and hd2 may be substantially identical as the corresponding dimensions of the underlying first electrode 113, and the opening 129 may be vertically aligned over the first electrode 113.

Figure 17A:
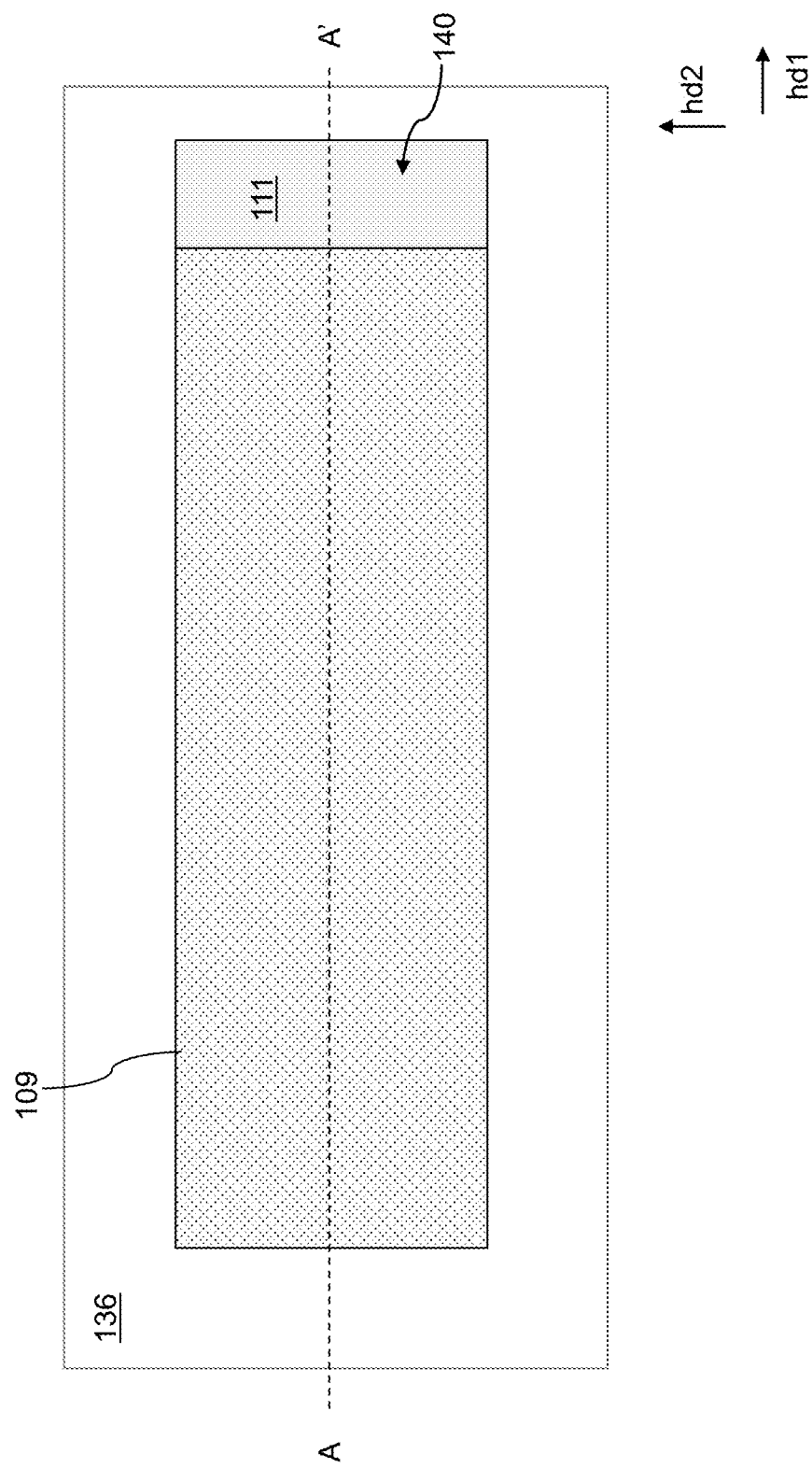
FIG. 17A is a top view of the intermediate structure illustrating an opening formed through the third dielectric material layer and exposing the upper surface of the dielectric isolation layer according to various embodiments of the present disclosure.
Figure 17B:
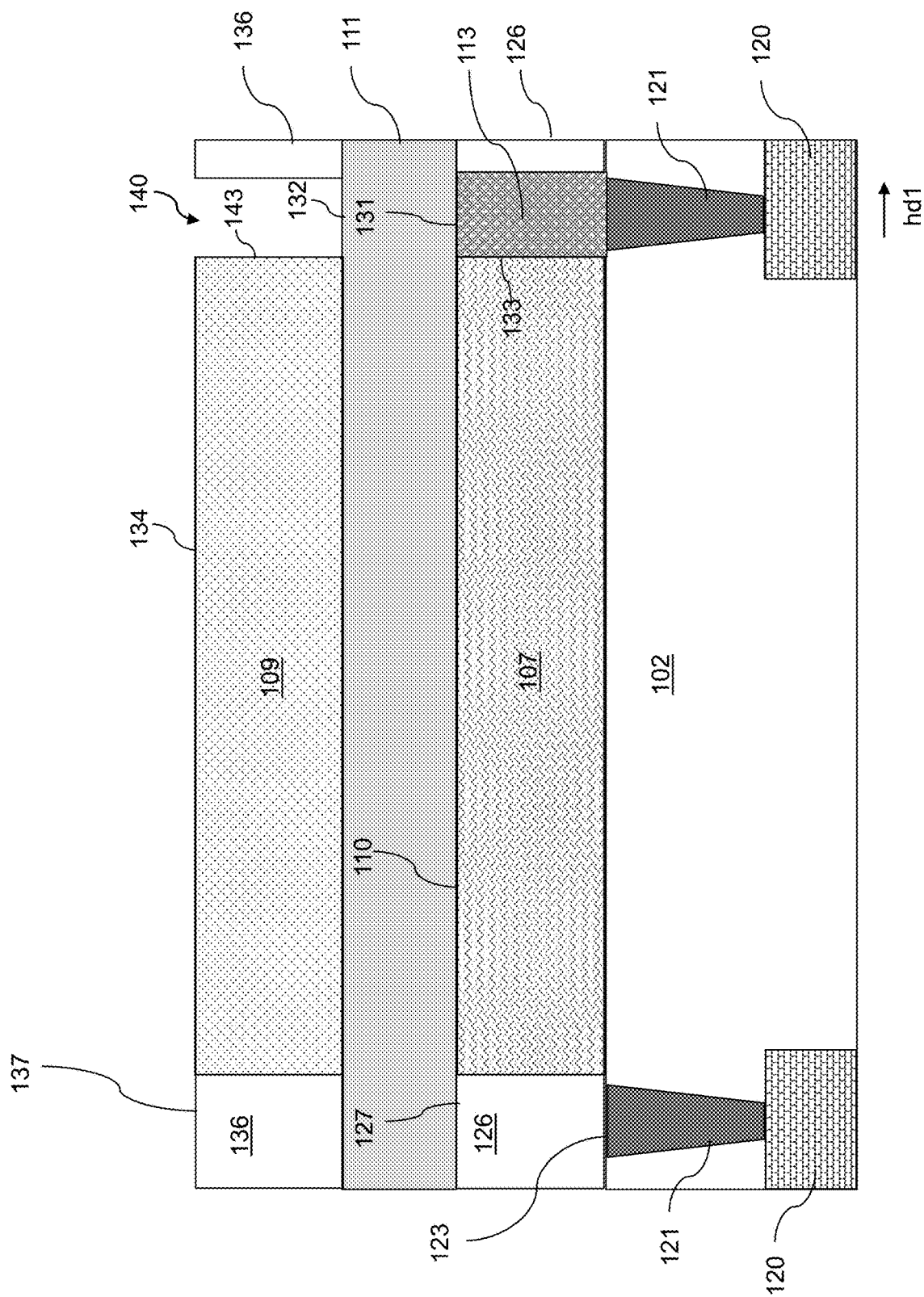
FIG. 17B is a vertical cross-section view of the intermediate structure taken along line A-A' in FIG. 17A.

FIG. 17A is a top view of the intermediate structure illustrating an opening 140 formed through the third dielectric material layer 136 and exposing the upper surface 132 of the dielectric isolation layer 111 according to various embodiments of the present disclosure. FIG. 17B is a vertical cross-section view of the intermediate structure taken along line A-A' in FIG. 17A. Referring to FIGS. 17A and 17B, an anisotropic etching process may be performed to remove portions of the third dielectric material layer 136 that are not masked by the patterned mask 138 and form an opening 140 extending through the third dielectric material layer 136. The patterned mask 138 may then be removed by ashing or by dissolution with a solvent. Following the etching process, the upper surface 132 of the dielectric isolation layer 111 may be exposed on the bottom of the opening 140. A side surface 143 of the second conductivity-type semiconductor layer 109 may be exposed along a side of the opening 140. In some embodiments, the opening 140 in the third dielectric material layer 136 may have a dimension along the second horizontal direction hd2 that is at least about 5 nm and may be substantially equal to the width dimension of the second conductivity-type semiconductor layer 109 along the second horizontal direction hd2. The opening 140 may have a dimension along the first horizontal direction hd1 of at least about 5 nm. In some embodiments, the dimensions of the opening 140 along the first and second horizontal directions hd1 and hd2 may be substantially identical as the corresponding dimensions of the underlying first electrode 113, and the opening 140 may be vertically aligned over the first electrode 113.

Figure 18A:
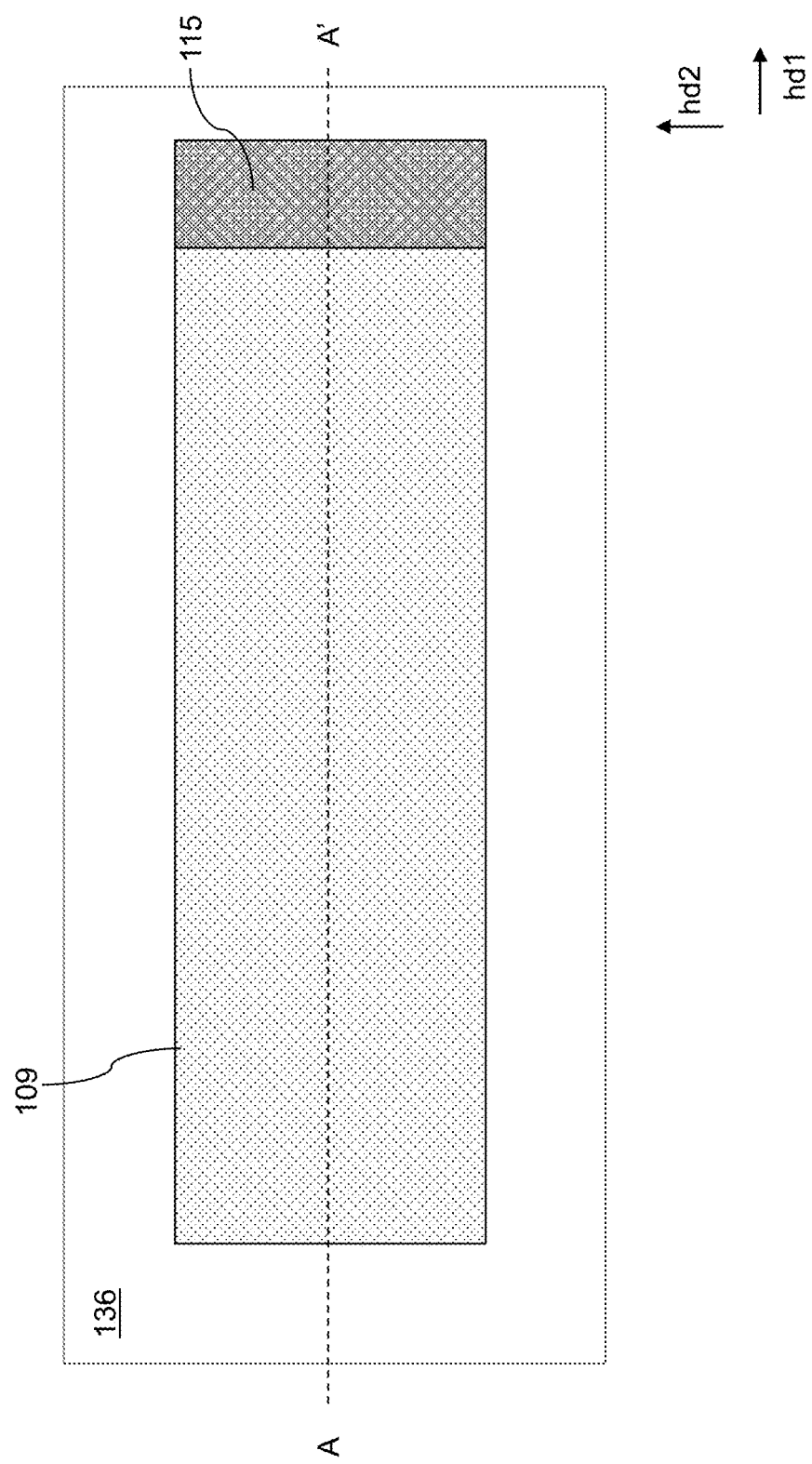
FIG. 18A is a top view of the intermediate structure illustrating a second electrode formed within the opening in the third dielectric material layer according to various embodiments of the present disclosure.
Figure 18B:
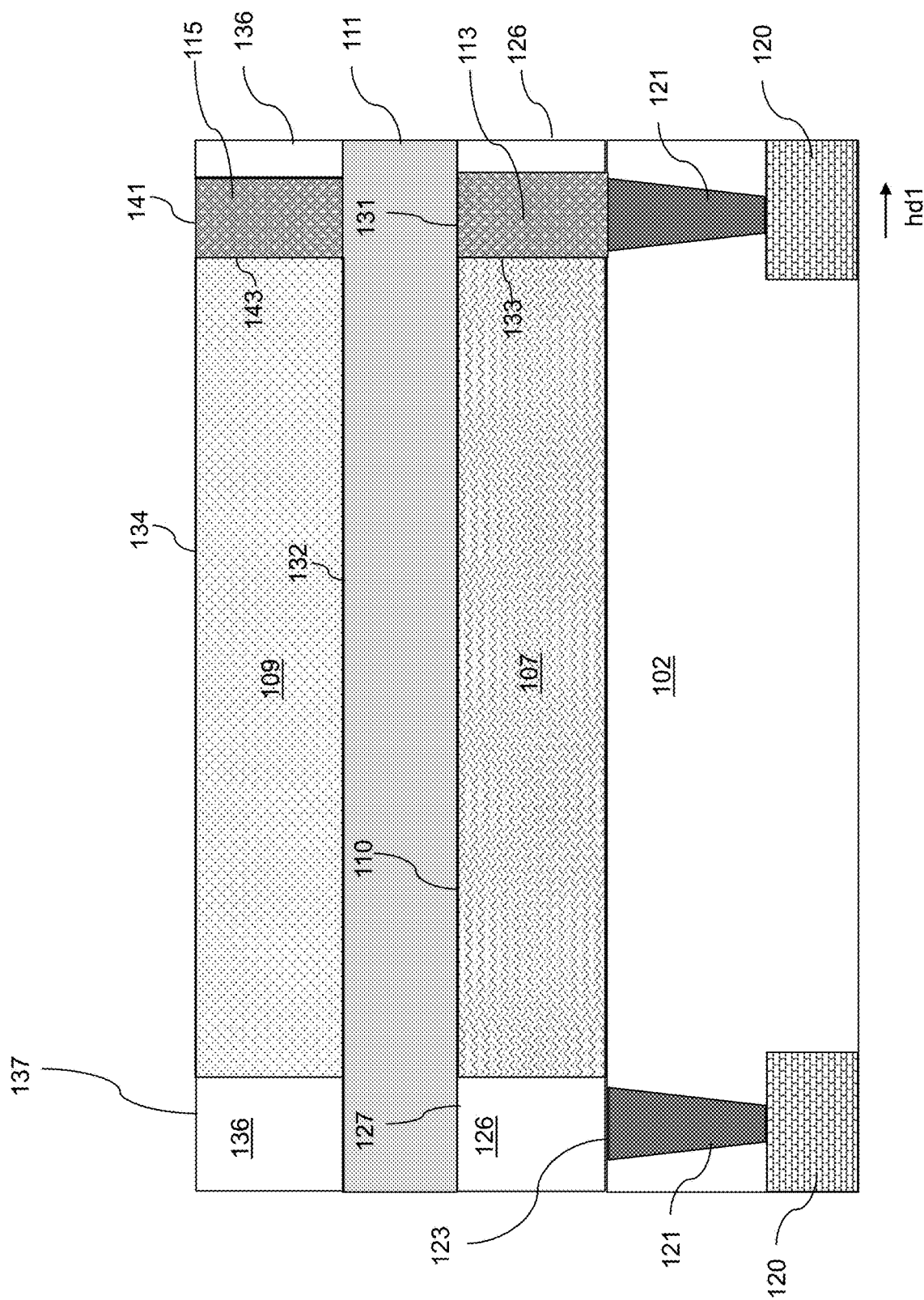
FIG. 18B is a vertical cross-section view of the intermediate structure taken along line A-A' in FIG. 18A.

FIG. 18A is a top view of the intermediate structure illustrating a second electrode 115 formed within the opening 140 in the third dielectric material layer 136 according to various embodiments of the present disclosure. FIG. 18B is a vertical cross-section view of the intermediate structure taken along line A-A' in FIG. 18A. Referring to FIGS. 18A and 18B, a conductive material may be deposited within the opening 140 in the third dielectric material layer 136 and over the upper surface 134 of the second conductivity-type semiconductor layer 109 and the upper surface 137 of the third dielectric material layer 136. The conductive material may be composed of one or more suitable conductive materials, such as a metallic liner material and a metallic fill material as described above with reference to the first electrode 113. The conductive material may be formed by suitable deposition process, such as one or more of a CVD process, a PVD process, an ALD process, an electroplating process, etc. Other suitable deposition processes are within the contemplated scope of disclosure. Excess portions of the conductive material may be removed from above a horizontal plane including the upper surface 134 of the second conductivity-type semiconductor layer 109 and the upper surface 137 of the third dielectric material layer 136 by a planarization process such as CMP, although other suitable planarization processes may be used. The remaining portion of the conductive material may form the second electrode 115. The second electrode 115 may contact a side surface 143 of the second conductivity-type semiconductor layer 109 on a side surface of the second electrode 115. A width dimension of the second electrode 115 along the second horizontal direction hd2 may be substantially equal to the corresponding width dimension of the second conductivity-type semiconductor layer 109. A height dimension of the second electrode 115 (along a vertical direction) may be substantially equal to the corresponding width dimension of the second conductivity-type semiconductor layer 109 (i.e., the upper surface 141 of the second electrode 115 may be substantially coplanar with the upper surface 134 of the second conductivity-type semiconductor layer 109). A length dimension of the second electrode 115 along the first horizontal direction hd1 may be at least about 5 nm in various embodiments. In some embodiments, the dimensions of the second electrode 115 along the first and second horizontal directions hd1 and hd2 may be substantially identical as the corresponding dimensions of the underlying first electrode 113, and the second electrode 115 may be vertically aligned over the first electrode 113. In this regard, side surfaces of the second electrode 115 may be substantially aligned with the corresponding side surfaces of the underlying first electrode 113. The dielectric isolation layer 111 may be located between the second electrode 115 and the first electrode 113.

Figure 19A:
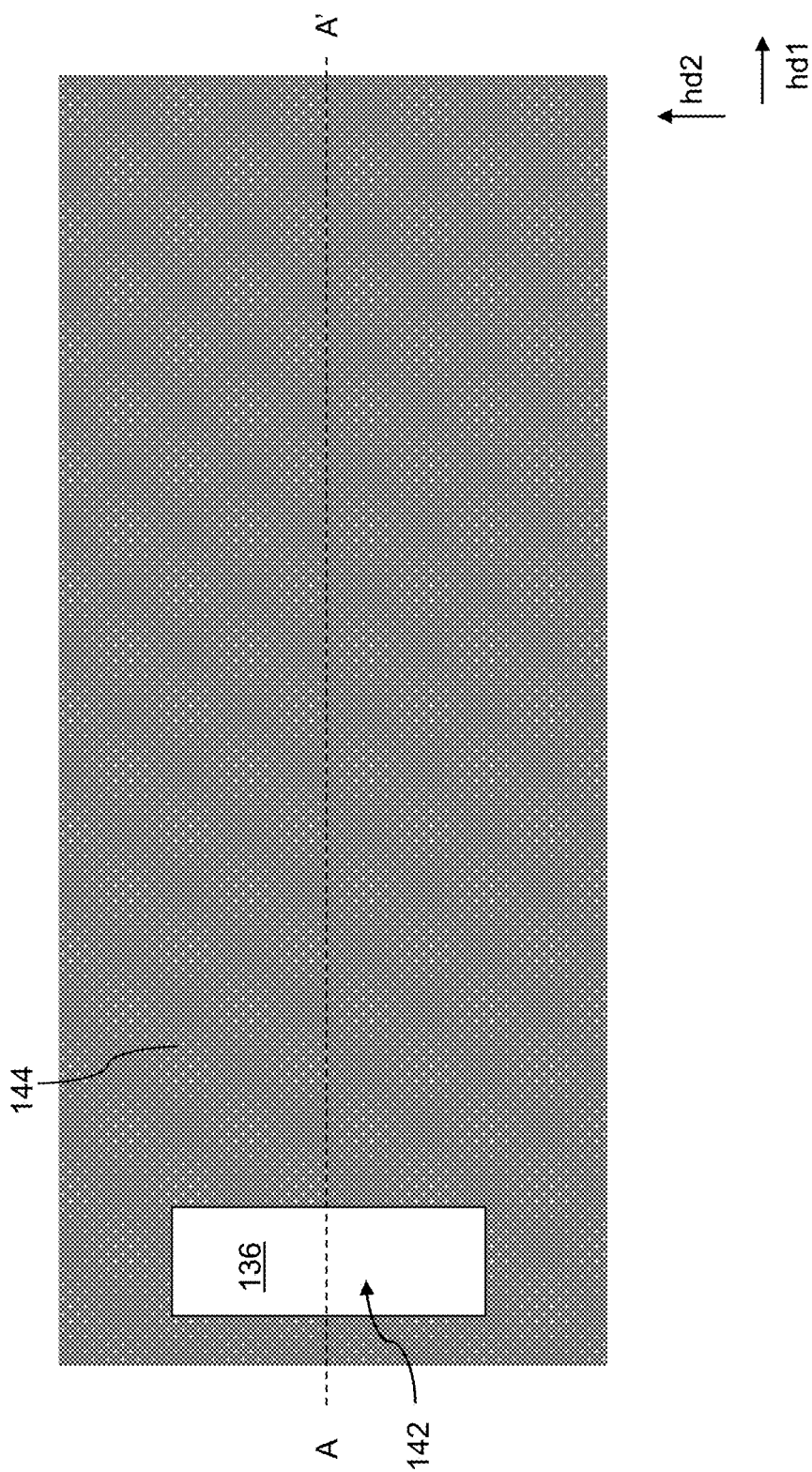
FIG. 19A is a top view of the intermediate structure illustrating a patterned mask formed over the third dielectric material layer, the second conductivity-type semiconductor layer, and the second electrode according to various embodiments of the present disclosure.
Figure 19B:
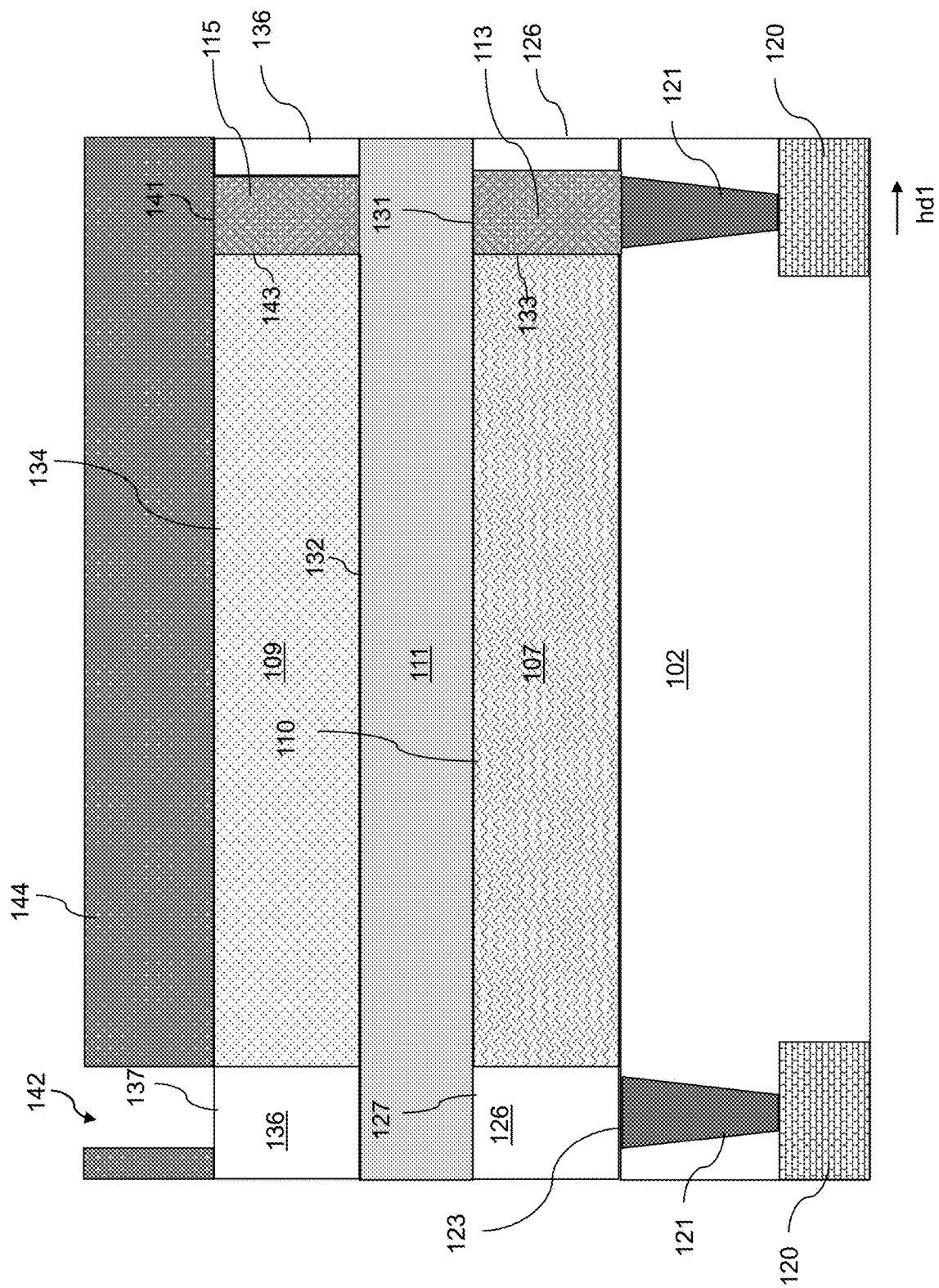
FIG. 19B is a vertical cross-section view of the intermediate structure taken along line A-A' in FIG. 19A.

FIG. 19A is a top view of the intermediate structure illustrating a patterned mask 144 formed over the third dielectric material layer 136, the second conductivity-type semiconductor layer 109, and the second electrode 115 according to various embodiments of the present disclosure. FIG. 19B is a vertical cross-section view of the intermediate structure taken along line A-A' in FIG. 19A. Referring to FIGS. 19A and 19B, the patterned mask 144 may be formed by depositing a layer of a photoresist material over the upper surface 137 of the third dielectric material layer 136, the upper surface 134 of the second conductivity-type semiconductor layer 109, and the upper surface 141 of the second electrode 115 and patterning the photoresist material using lithographic techniques to form a patterned photoresist mask 144 as shown in FIGS. 19A and 19B. The patterned mask 144 may include a strip-shaped opening 142 through the patterned mask 144, where a portion of the third dielectric material layer 136 may be exposed at the bottom of the opening 142 in the patterned mask 144. In some embodiments, the opening 142 may have a dimension along the second horizontal direction hd2 that is at least about 5 nm and may be substantially equal to the width dimension(s) of the second conductivity-type semiconductor layer 109 and/or the second electrode 115 along the second horizontal direction hd2. The opening 142 may have a dimension along the first horizontal direction hd1 of at least about 5 nm. The opening 142 may be located adjacent to a side surface of the second conductivity-type semiconductor layer 109 that is opposite to the side surface 143 of the second conductivity-type semiconductor layer 109 that contacts the second electrode 115.

Figure 20A:
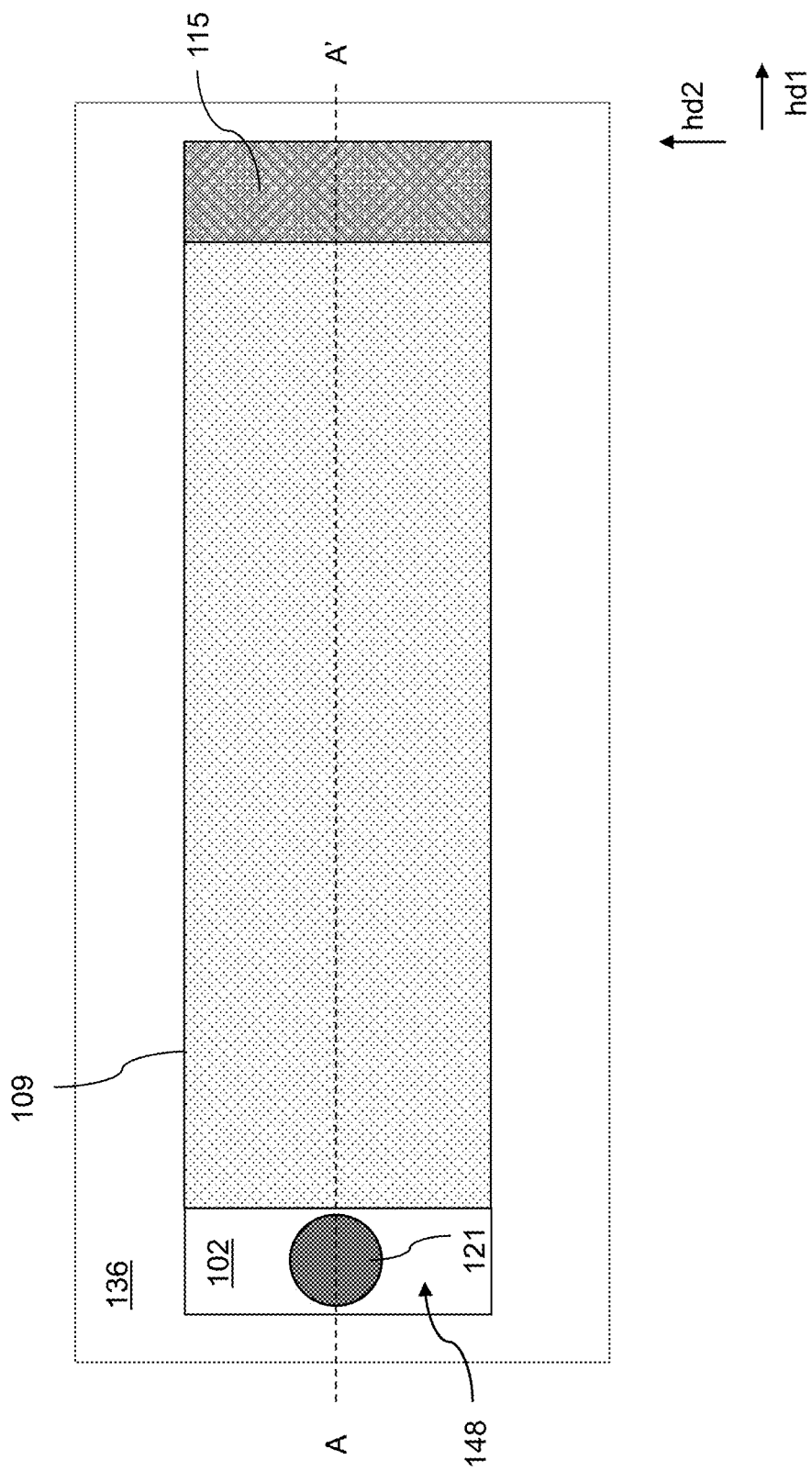
FIG. 20A is a top view of the intermediate structure illustrating an opening formed through the third dielectric material layer, the dielectric isolation layer, and the second dielectric material layer and exposing the upper surface of the first dielectric layer according to various embodiments of the present disclosure.
Figure 20B:
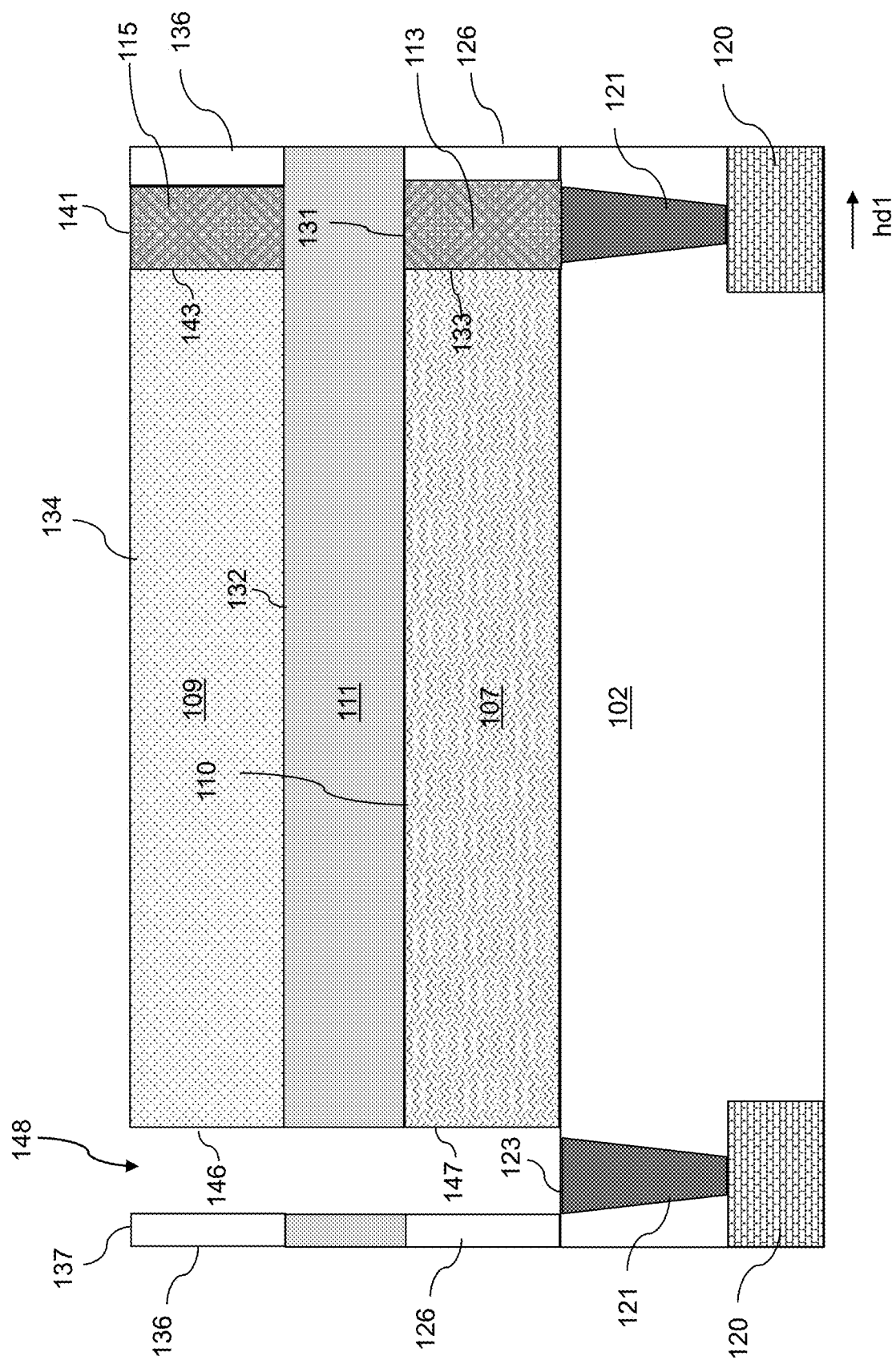
FIG. 20B is a vertical cross-section view of the intermediate structure taken along line A-A' in FIG. 20A.

FIG. 20A is a top view of the intermediate structure illustrating an opening 148 formed through the third dielectric material layer 136, the dielectric isolation layer 111, and the second dielectric material layer 126 and exposing the upper surface 122 of the first dielectric layer 102 according to various embodiments of the present disclosure. FIG. 20B is a vertical cross-section view of the intermediate structure taken along line A-A' in FIG. 20A. Referring to FIGS. 20A and 20B, an anisotropic etching process may be performed to remove portions of the third dielectric material layer 136, the dielectric isolation layer 111, and the second dielectric material layer 126 that are not masked by the patterned mask 144 and form an opening 148 extending through the third dielectric material layer 136, the dielectric isolation layer 111, and the second dielectric material layer 126. The patterned mask 144 may then be removed by ashing or by dissolution with a solvent. Following the etching process, the upper surface 122 of the first dielectric material layer 102 and the upper surface 123 of a conductive via 121 may be exposed on the bottom of the opening 148. A side surface 146 of the second conductivity-type semiconductor layer 109 that is opposite the side surface 143 of the second conductivity-type semiconductor layer 109 that contacts the second electrode 115 may be exposed along a side of the opening 148. In addition, a side surface 147 of the first conductivity-type semiconductor layer 107 that is opposite the side surface 133 of the first conductivity-type semiconductor layer 109 that contacts the first electrode 113 may also be exposed along a side of the opening 148. In some embodiments, the opening 148 may have a dimension along the second horizontal direction hd2 that is at least about 5 nm and may be substantially equal to the width dimension(s) of the second conductivity-type semiconductor layer 109 and/or the first conductivity-type semiconductor layer 107 along the second horizontal direction hd2. The opening 148 may have a dimension along the first horizontal direction hd1 of at least about 5 nm.

Figure 21A:
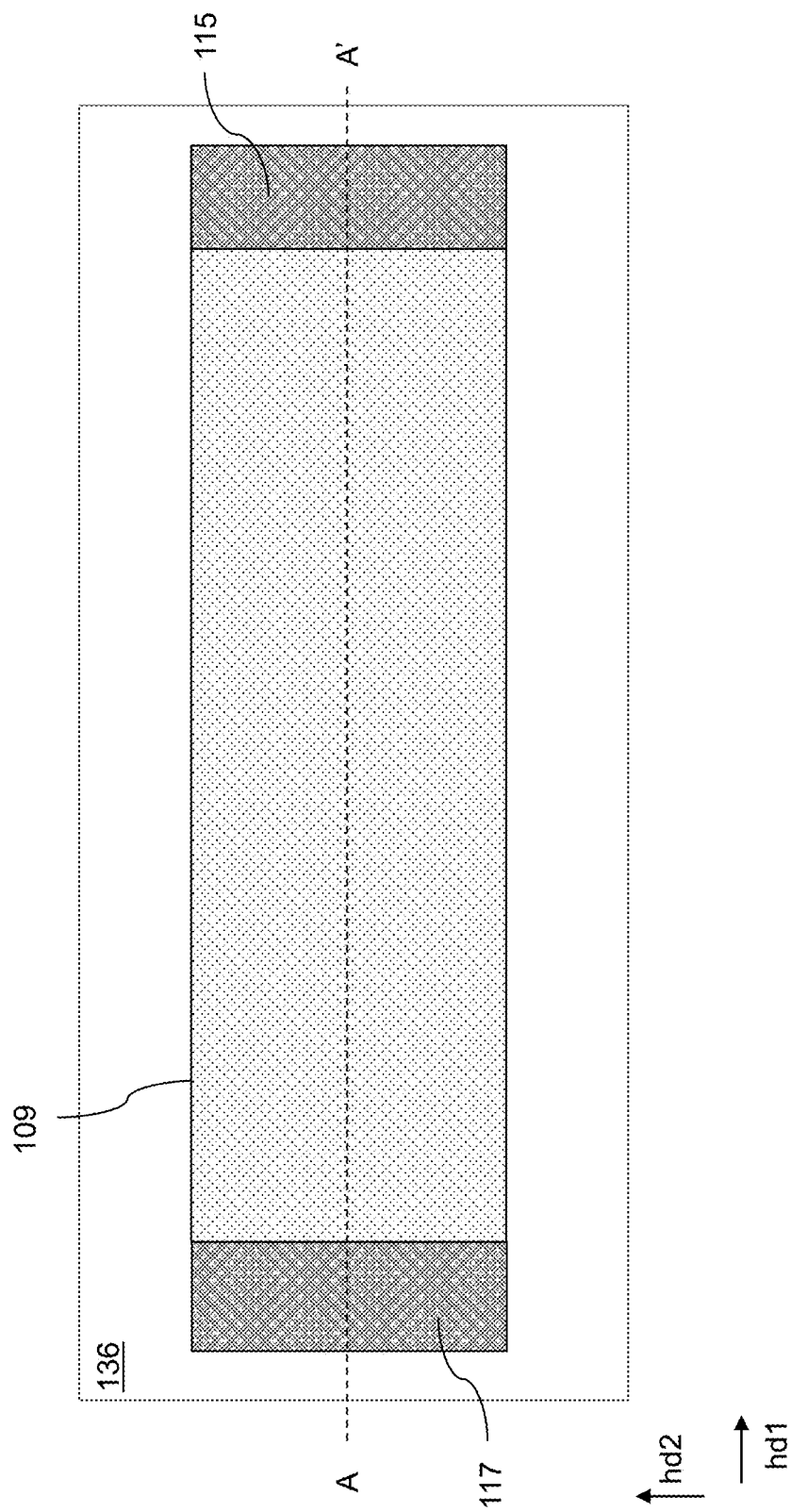
FIG. 21A is a top view of the intermediate structure illustrating a third electrode formed within the opening in the third dielectric material layer, the dielectric isolation layer, and the second dielectric material layer according to various embodiments of the present disclosure.
Figure 21B:
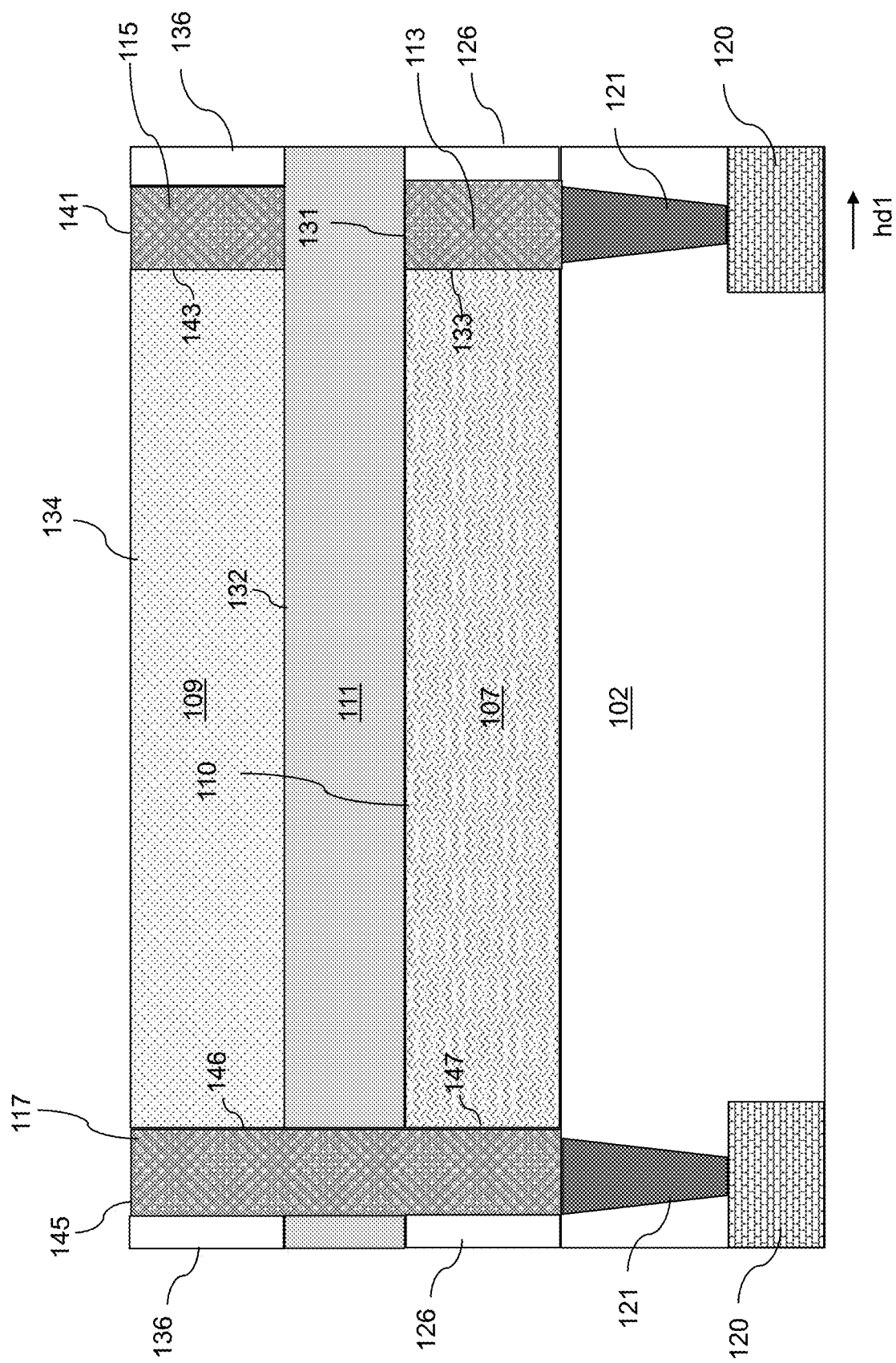
FIG. 21B is a vertical cross-section view of the intermediate structure taken along line A-A' in FIG. 21B.
Figure 21B:
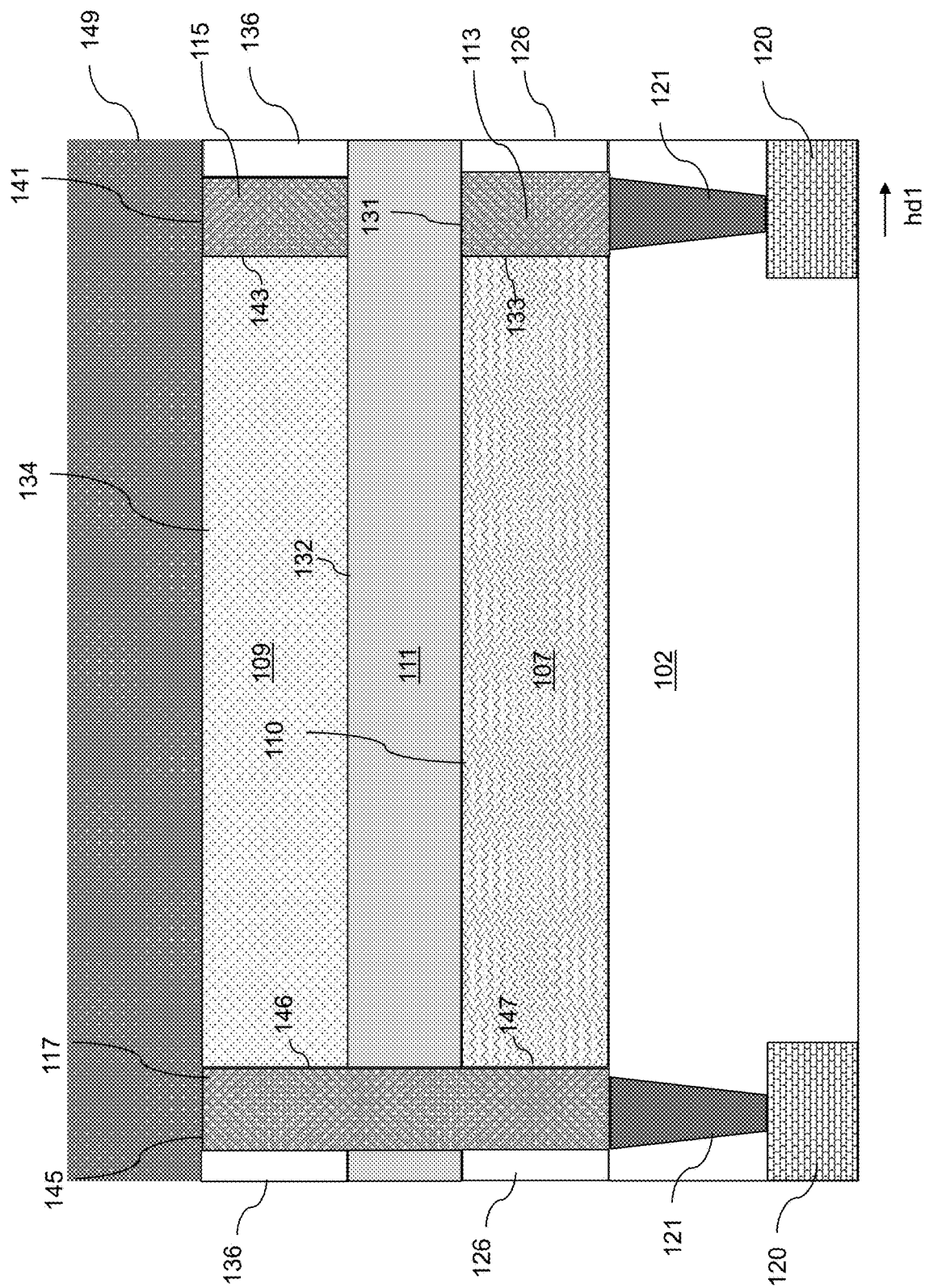

FIG. 21A is a top view of the intermediate structure illustrating a third electrode 117 formed within the opening 148 in the third dielectric material layer 136, the dielectric isolation layer 111, and the second dielectric material layer 126 according to various embodiments of the present disclosure. FIG. 21B is a vertical cross-section view of the intermediate structure taken along line A-A' in FIG. 21B. Referring to FIGS. 21A and 21B, a conductive material may be deposited within the opening 148 in the third dielectric material layer 136, the dielectric isolation layer 111, and the second dielectric material layer 126, and over the upper surface 134 of the second conductivity-type semiconductor layer 109, the upper surface 137 of the third dielectric material layer 136, and the upper surface 141 of the second electrode 115. The conductive material may be composed of one or more suitable conductive materials, such as a metallic liner material and a metallic fill material as described above with reference to the first electrode 113. The conductive material may be formed by suitable deposition process, such as one or more of a CVD process, a PVD process, an ALD process, an electroplating process, etc. Other suitable deposition processes are within the contemplated scope of disclosure. Excess portions of the conductive material may be removed from above a horizontal plane including the upper surface 134 of the second conductivity-type semiconductor layer 109, the upper surface 137 of the third dielectric material layer 136, and the upper surface 141 of the second electrode 115 by a planarization process such as CMP, although other suitable planarization processes may be used. The remaining portion of the conductive material may form the third electrode 117. The third electrode 117 may contact a conductive via 121 on the bottom surface of the third electrode 117. A side surface of the third electrode 117 may also contact a side surface 146 of the second conductivity-type semiconductor layer 109 that is opposite the side surface 143 of the second conductivity-type semiconductor layer 109 that contacts the second electrode 115, and a side surface 147 of the first conductivity-type semiconductor layer 107 that is opposite the side surface 133 of the first conductivity-type semiconductor layer 109 that contacts the first electrode 113. In some embodiments, the third electrode 117 may have a dimension along the second horizontal direction hd2 that is at least about 5 nm and may be substantially equal to the width dimension(s) of the second conductivity-type semiconductor layer 109 and/or the first conductivity-type semiconductor layer 107 along the second horizontal direction hd2. The third electrode 117 may have a dimension along the first horizontal direction hd1 of at least about 5 nm. The third electrode 117 may have a height dimension that is equal to the combined height dimensions of the first conductivity-type semiconductor layer 107, the dielectric isolation layer 111, and the second conductivity-type semiconductor layer 109 (i.e., an upper surface 145 of the third electrode 117 may be substantially coplanar with the upper surface 134 of the second conductivity-type semiconductor layer 109 and the upper surface 141 of the second electrode 115).

Figure 22A:
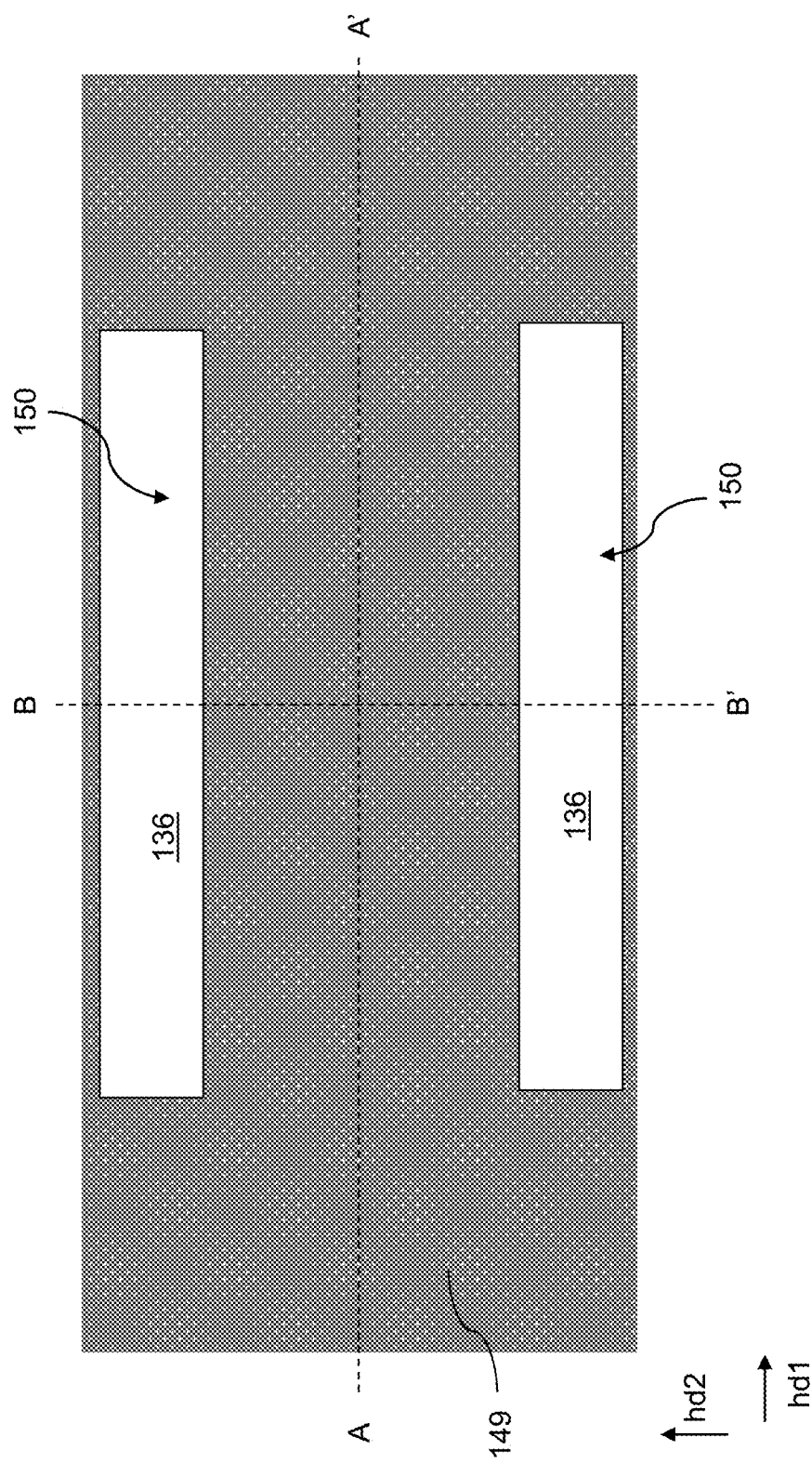
FIG. 22A is a top view of the intermediate structure illustrating a patterned mask formed over the third dielectric material layer, the second conductivity-type semiconductor layer, the second electrode, and the third electrode according to various embodiments of the present disclosure.
Figure 22B:
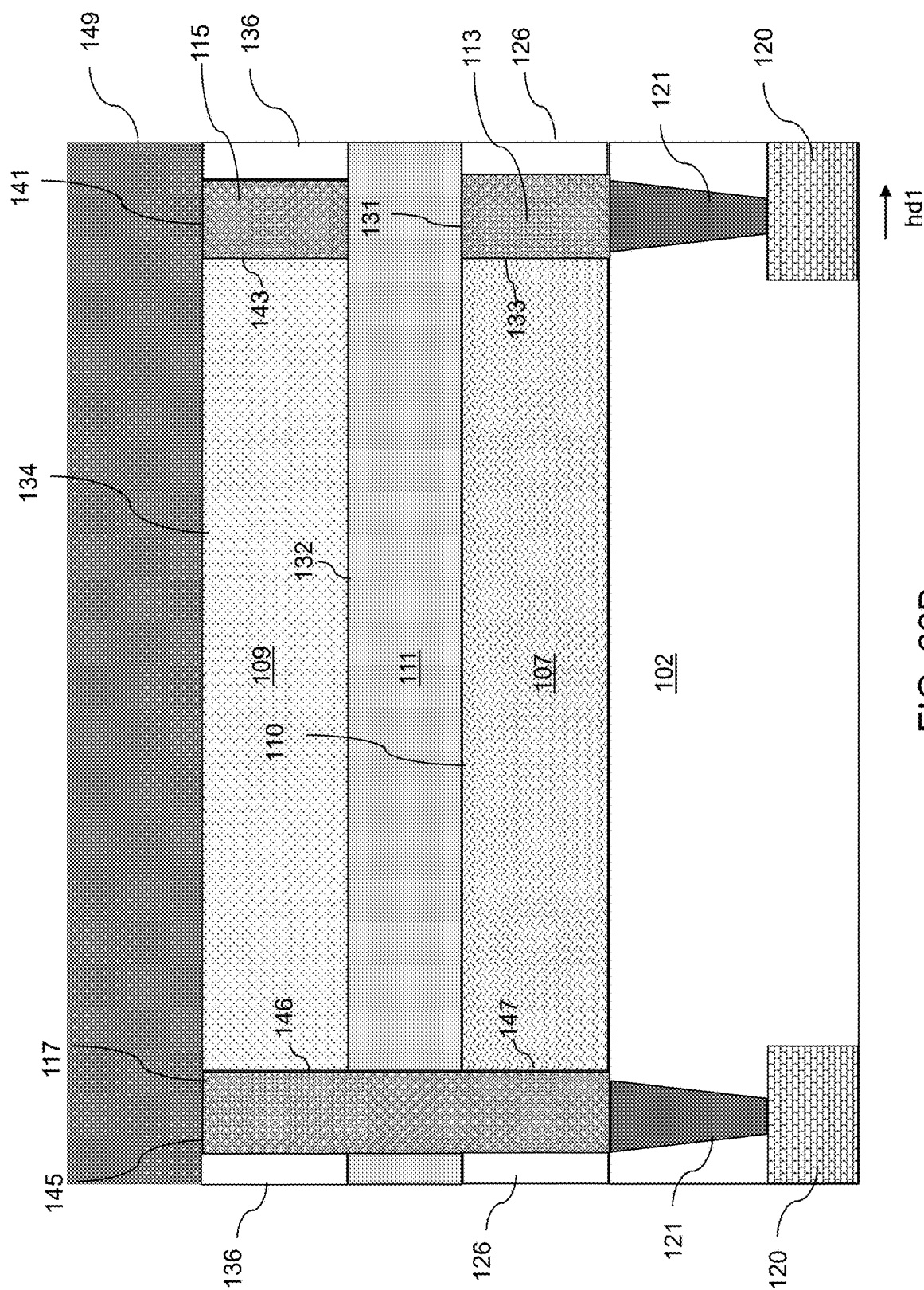
FIG. 22B is a vertical cross-section view of the intermediate structure taken along line A-A' in FIG. 22A.
Figure 22C:
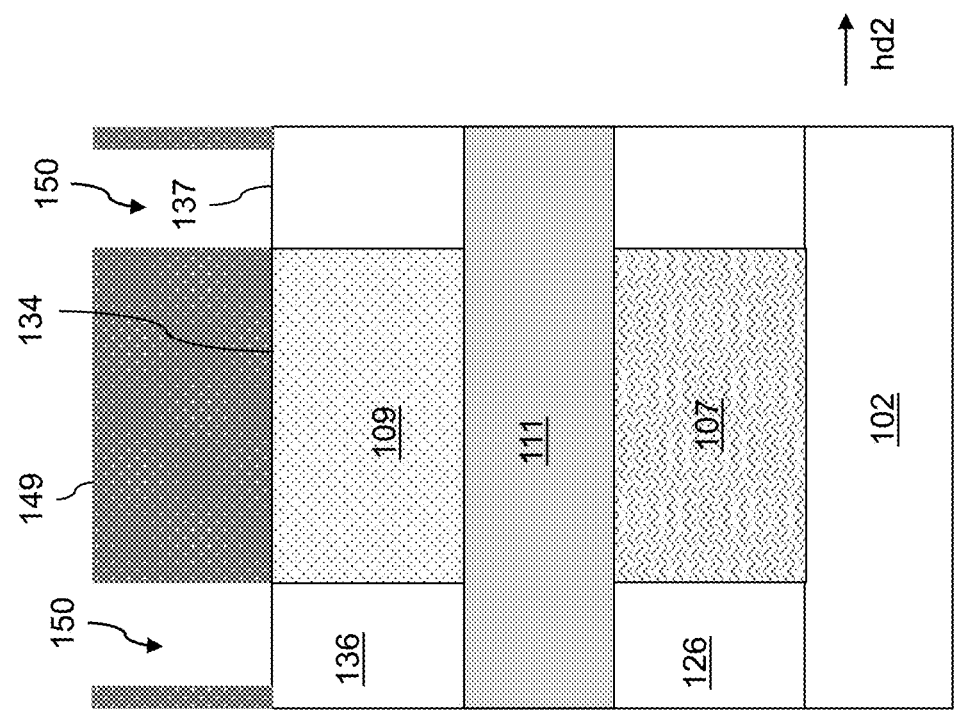
FIG. 22C is a vertical cross-section view of the intermediate structure taken along line B-B' in FIG. 22A.

FIG. 22A is a top view of the intermediate structure illustrating a patterned mask 149 formed over the third dielectric material layer 136, the second conductivity-type semiconductor layer 109, the second electrode 115, and the third electrode 117 according to various embodiments of the present disclosure. FIG. 22B is a vertical cross-section view of the intermediate structure taken along line A-A' in FIG. 22A. FIG. 22C is a vertical cross-section view of the exemplary intermediate structure taken along line B-B' in FIG. 22A. Referring to FIGS. 22A-22C, the patterned mask 149 may be formed by depositing a layer of a photoresist material over the upper surface 137 of the third dielectric material layer 136, the upper surface 134 of the second conductivity-type semiconductor layer 109, the upper surface 141 of the second electrode 115, and the upper surface 145 of the third electrode 117 and patterning the photoresist material using lithographic techniques to form a patterned photoresist mask 149 as shown in FIGS. 22A and 22B. The patterned mask 149 may include a pair of strip-shaped openings 150 through the patterned mask 149, where portions of the third dielectric material layer 136 may be exposed at the bottom of each of the openings 150 in the patterned mask 149. The openings 150 may extend parallel to one another along the first horizontal direction hd1. Each of the openings 150 may be located adjacent to a side surface of the second conductivity-type semiconductor layer 109, as is shown in FIG. 22C.

Figure 23A:
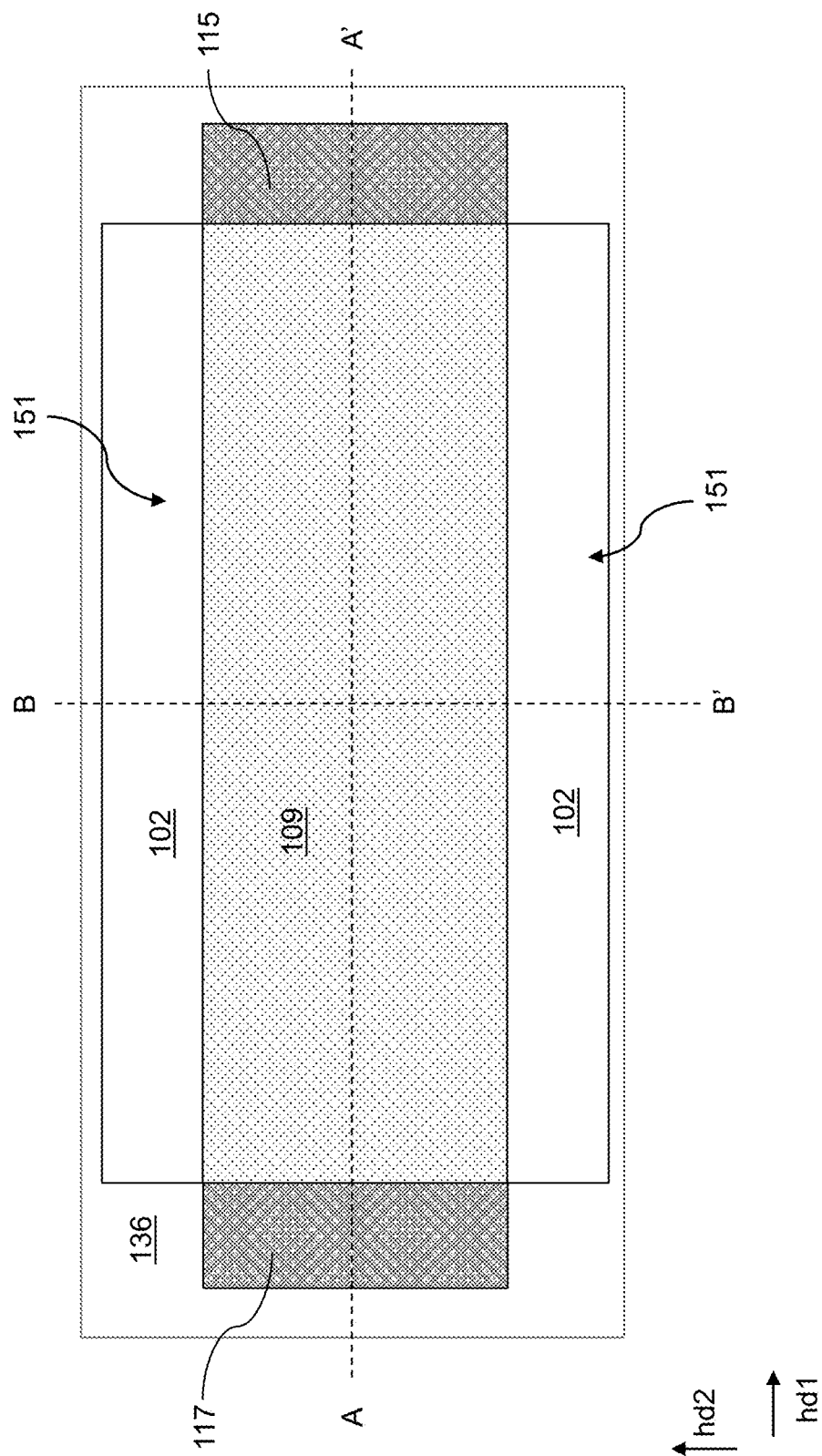
FIG. 23A is a top view of the intermediate structure illustrating a pair of trench openings formed through the third dielectric material layer, the dielectric isolation layer, and the second dielectric material layer and exposing the upper surface of the first dielectric layer according to various embodiments of the present disclosure.
Figure 23B:
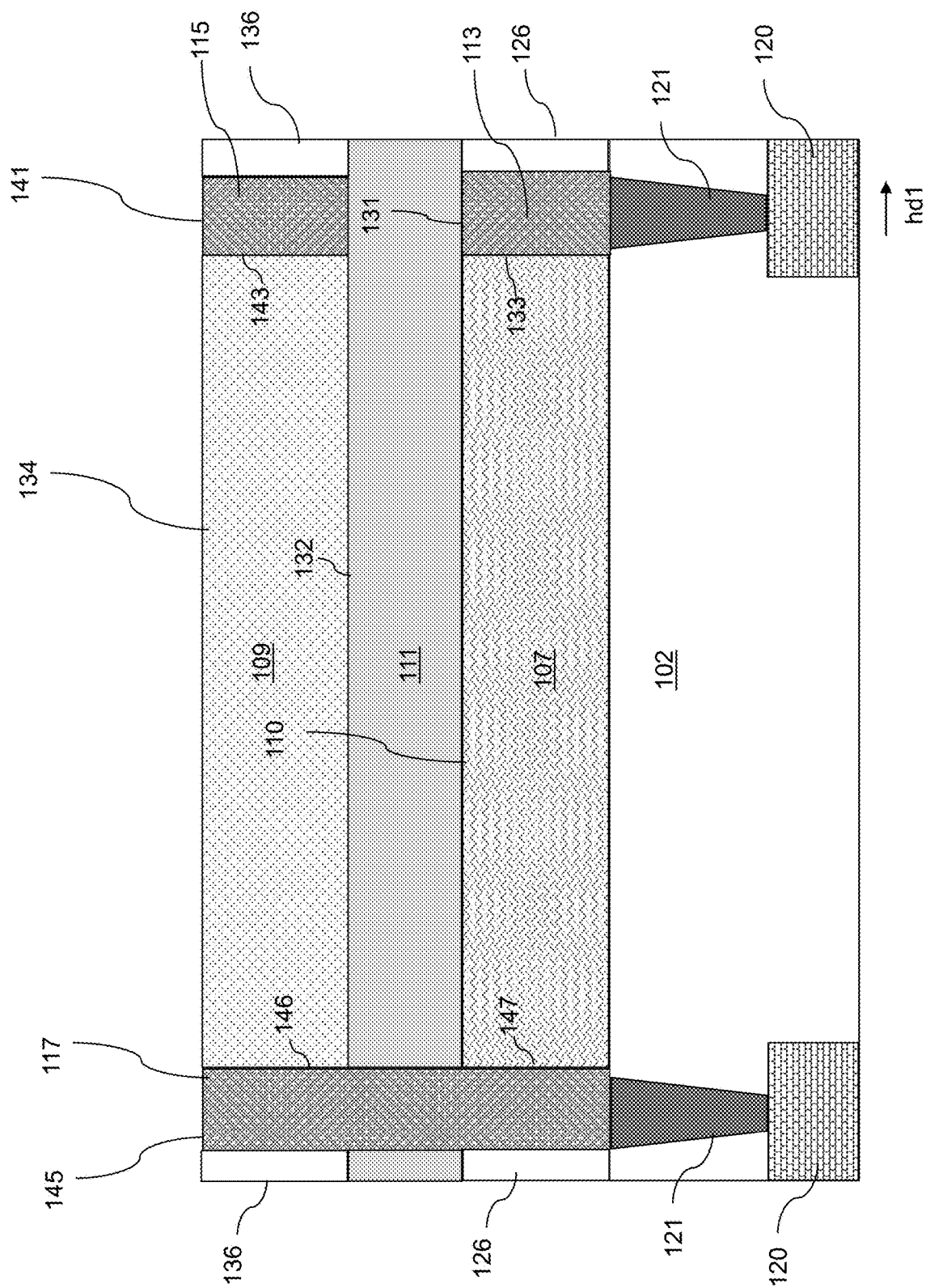
FIG. 23B is a vertical cross-section view of the intermediate structure taken along line A-A' in FIG. 23A.
Figure 23C:
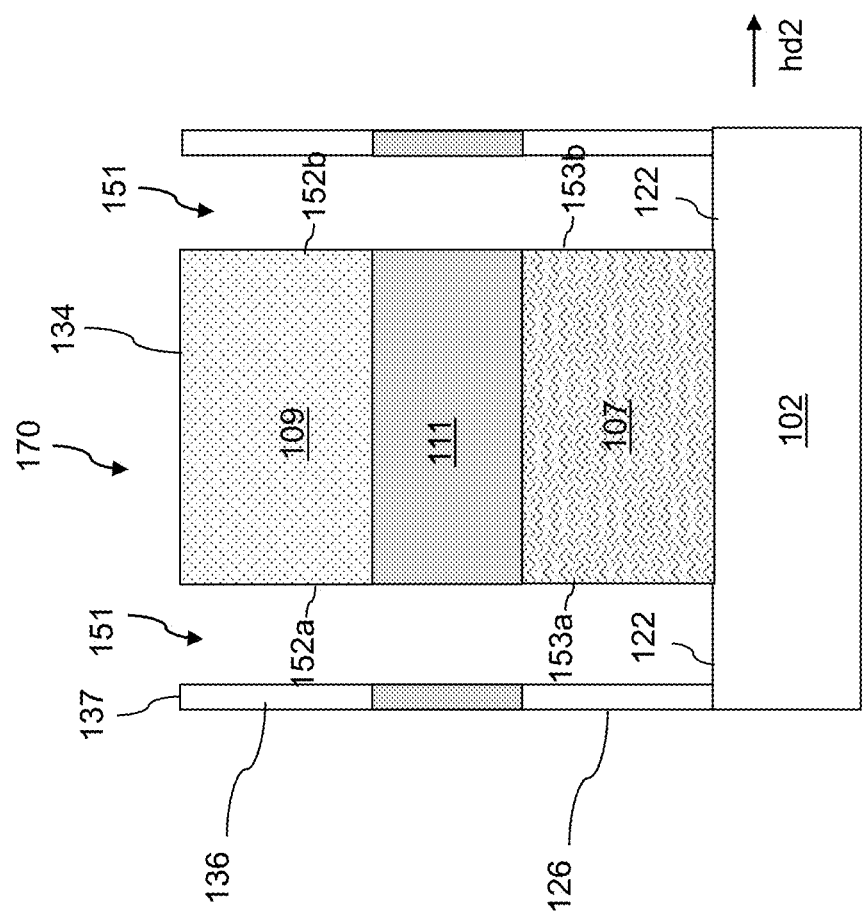
FIG. 23C is a vertical cross-section view of the exemplary intermediate structure taken along line B-B' in FIG. 23A.

FIG. 23A is a top view of the intermediate structure illustrating a pair of trench openings 151 formed through the third dielectric material layer 136, the dielectric isolation layer 111, and the second dielectric material layer 126 and exposing the upper surface 122 of the first dielectric layer 102 according to various embodiments of the present disclosure. FIG. 23B is a vertical cross-section view of the intermediate structure taken along line A-A' in FIG. 23A. FIG. 23C is a vertical cross-section view of the intermediate structure taken along line B-B' in FIG. 23A. Referring to FIGS. 23A-23C, an anisotropic etching process may be performed to remove portions of the third dielectric material layer 136, the dielectric isolation layer 111, and the second dielectric material layer 126 that are not masked by the patterned mask 149 and form a pair of trench openings 151 extending through the third dielectric material layer 136, the dielectric isolation layer 111, and the second dielectric material layer 126. The patterned mask 149 may then be removed by ashing or by dissolution with a solvent. Following the etching process, the upper surface 122 of the first dielectric material layer 102 may be exposed on the bottom of each of the trench openings 151. The trench openings 151 may extend parallel to one another along the first horizontal direction hd1. Referring to FIG. 23C, remaining portions of the first conductivity-type semiconductor layer 107, the dielectric isolation layer 111, and the second conductivity-type semiconductor layer 109 located between the pair of trench openings 151 may form a layer stack 170 having continuous side surfaces on opposite sides of the layer stack 170 that form outer sidewalls of each of the trench openings 151. Opposite side surfaces 152a and 152b of the second conductivity-type semiconductor layer 109 and opposite side surfaces 153a and 153b of the first conductivity-type semiconductor layer 107 may be exposed along the outer sidewalls of the trench openings 151.

Figure 24A:
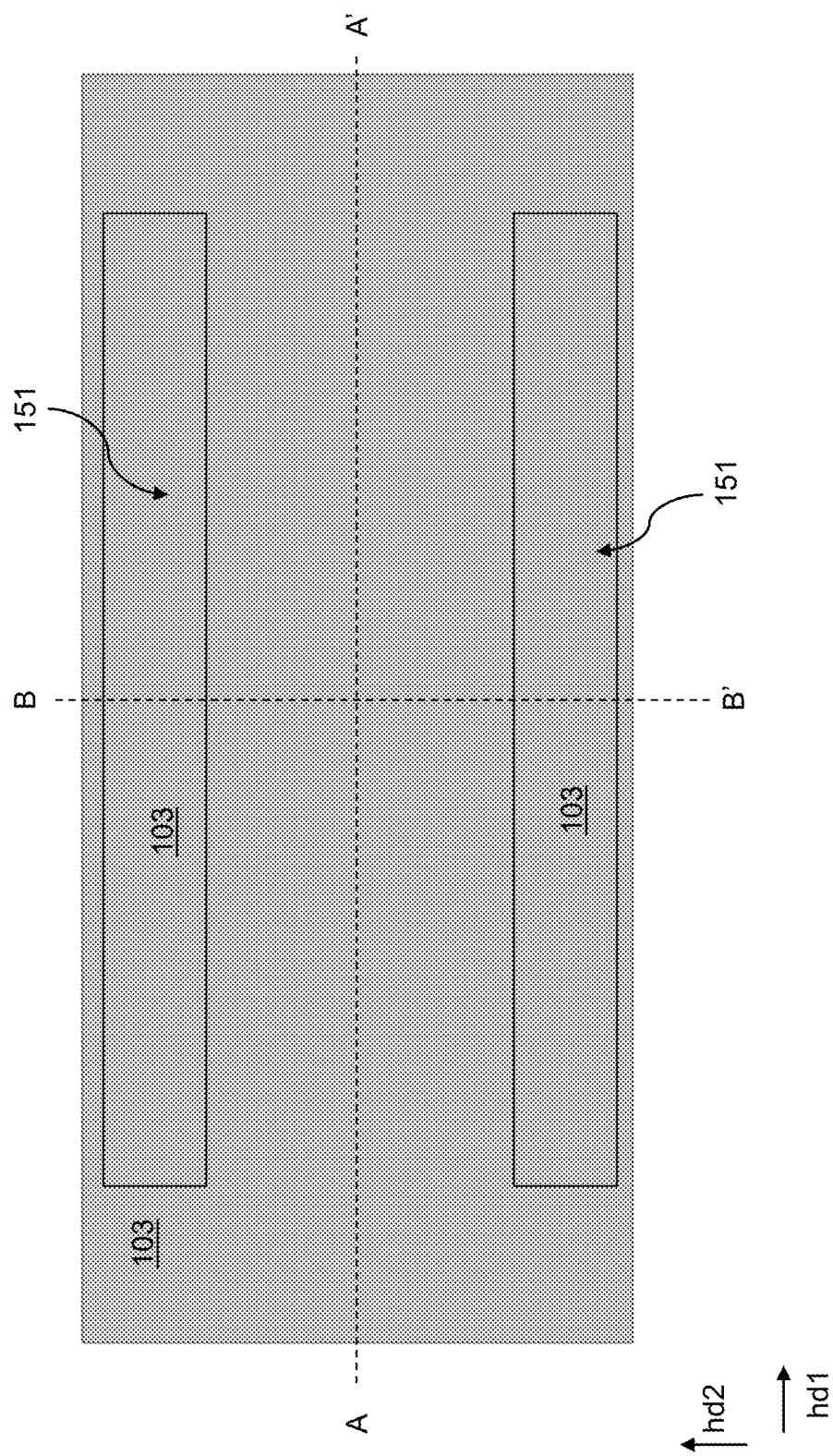
FIG. 24A is a top view of the intermediate structure illustrating a gate dielectric layer formed over the third dielectric material layer, the second conductivity-type semiconductor layer, the second electrode, and the third electrode and over the sidewalls and bottom surface of the trench openings according to various embodiments of the present disclosure.
Figure 24B:
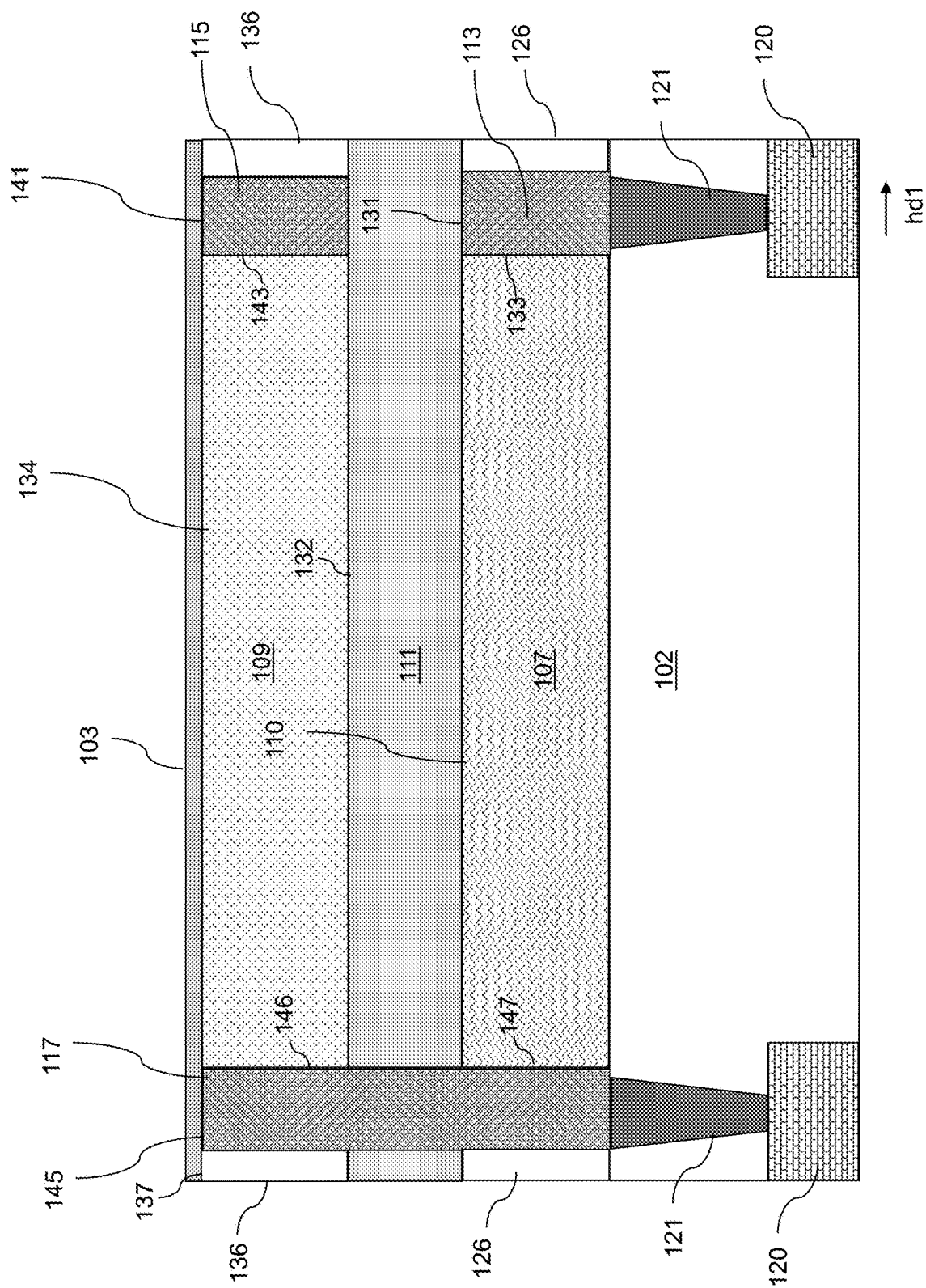
FIG. 24B is a vertical cross-section view of the intermediate structure taken along line A-A' in FIG. 24A.
Figure 24C:
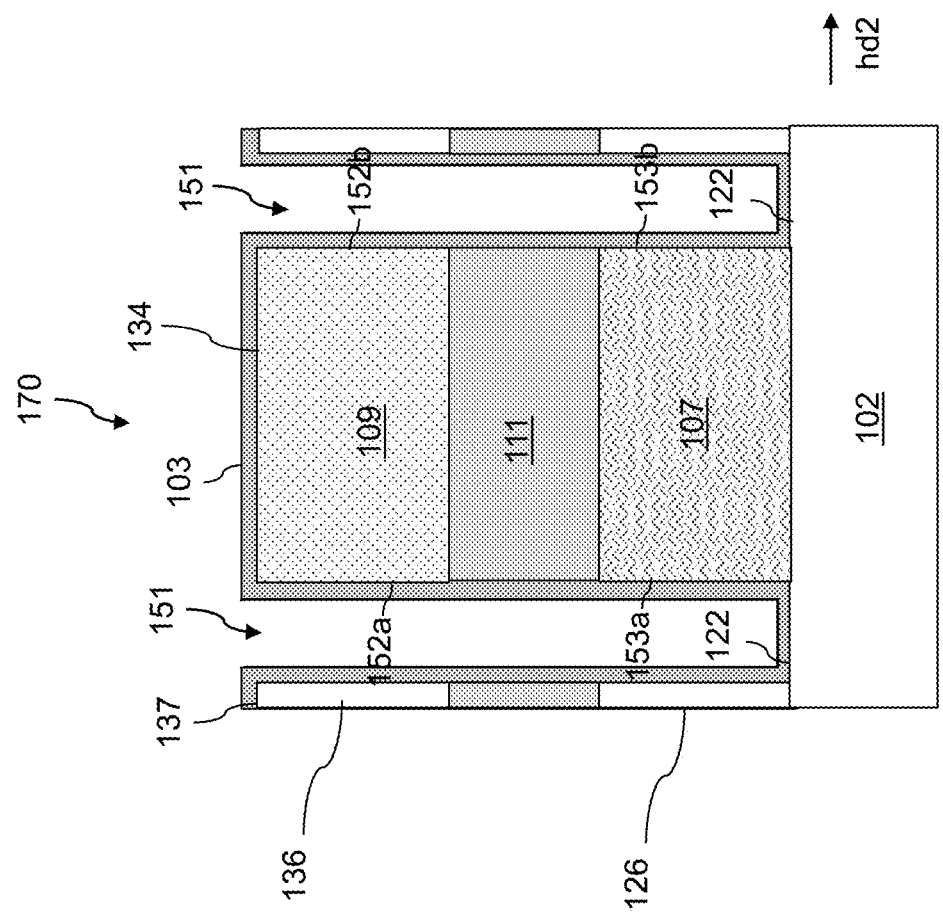
FIG. 24C is a vertical cross-section view of the intermediate structure taken along line B-B' in FIG. 24A.

FIG. 24A is a top view of the intermediate structure illustrating a gate dielectric layer 103 formed over the third dielectric material layer 136, the second conductivity-type semiconductor layer 109, the second electrode 115, and the third electrode 117 and over the sidewalls and bottom surface of the trench openings 151 according to various embodiments of the present disclosure. FIG. 24B is a vertical cross-section view of the intermediate structure taken along line A-A' in FIG. 24A. FIG. 24C is a vertical cross-section view of the intermediate structure taken along line B-B' in FIG. 24A. Referring to FIGS. 24A-24C, a gate dielectric layer 103 may be deposited over the upper surface 137 of the third dielectric material layer 136, the upper surface 134 of the second conductivity-type semiconductor layer 109, the upper surface 141 of the second electrode 115 and the upper surface 145 of the third electrode 117, and along the sidewalls and bottom surfaces of each of the trench openings 151. The gate dielectric layer 103 may include a suitable dielectric material, such as, for example, one or more of silicon oxide, silicon nitride, silicon oxynitride, hafnium oxide, hafnium silicon oxide, tantalum oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable dielectric materials are within the contemplated scope of disclosure. In various embodiments, the gate dielectric layer 103 may be formed by a suitable conformal deposition process such as ALD, CVD, PECVD, PVD, etc. A thickness of the gate dielectric layer 103 may be in a range from approximately 2 nm to approximately 20 nm, although other embodiments may include smaller and larger thicknesses. Following the deposition of the gate dielectric layer 103, the intermediate structure may optionally be annealed. The optional annealing process may be performed at a temperature in a range from 200° C. to 400° C. using a rapid thermal annealing or furnace annealing process. The annealing may be performed in an environment of nitrogen, oxygen, or a mixture thereof.

Figure 25A:
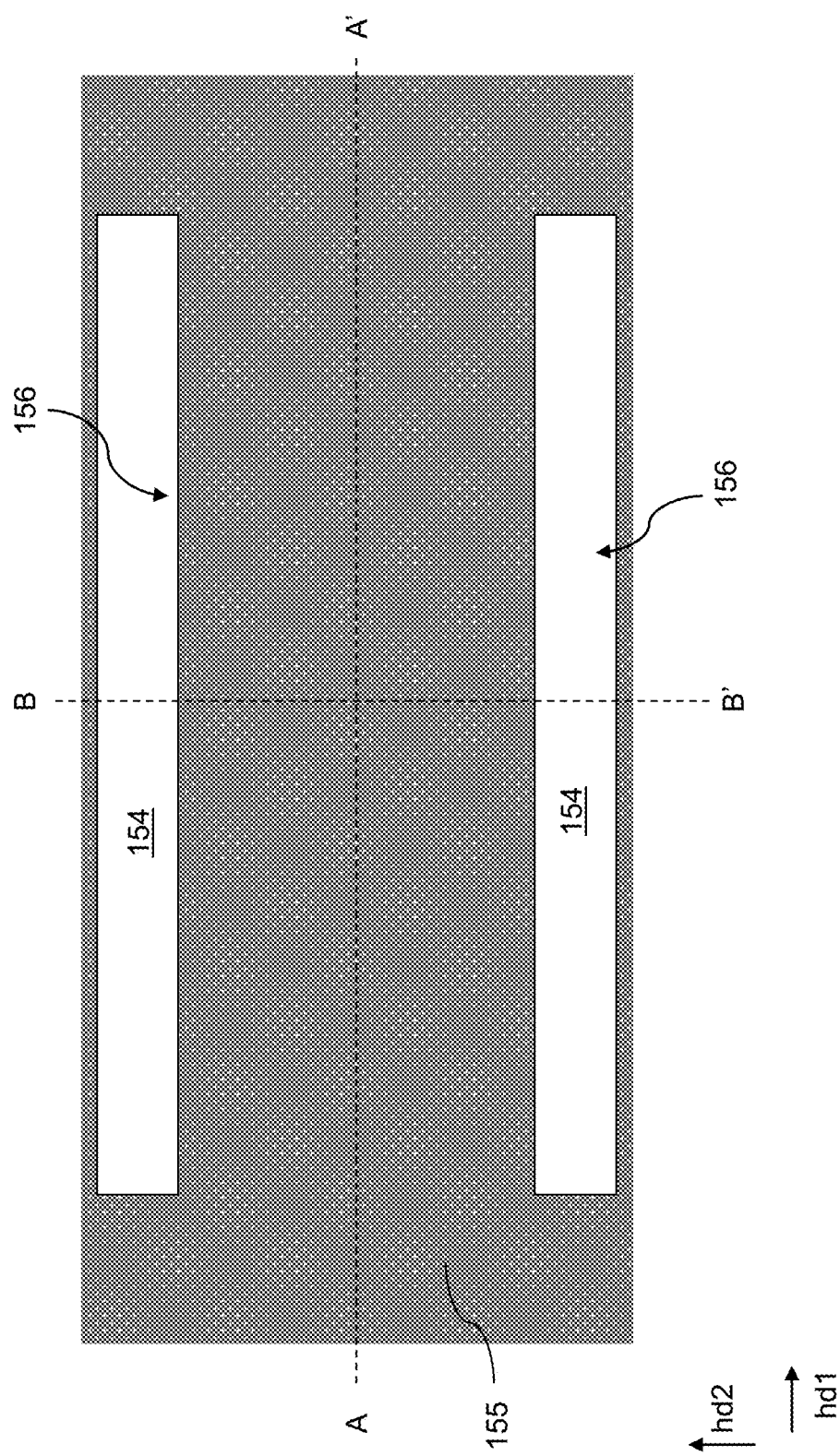
FIG. 25A is a top view of the intermediate structure illustrating a dielectric fill layer formed over the gate dielectric layer and filling a remaining volume of the trench openings and a patterned mask formed over the dielectric fill layer according to various embodiments of the present disclosure.
Figure 25B:
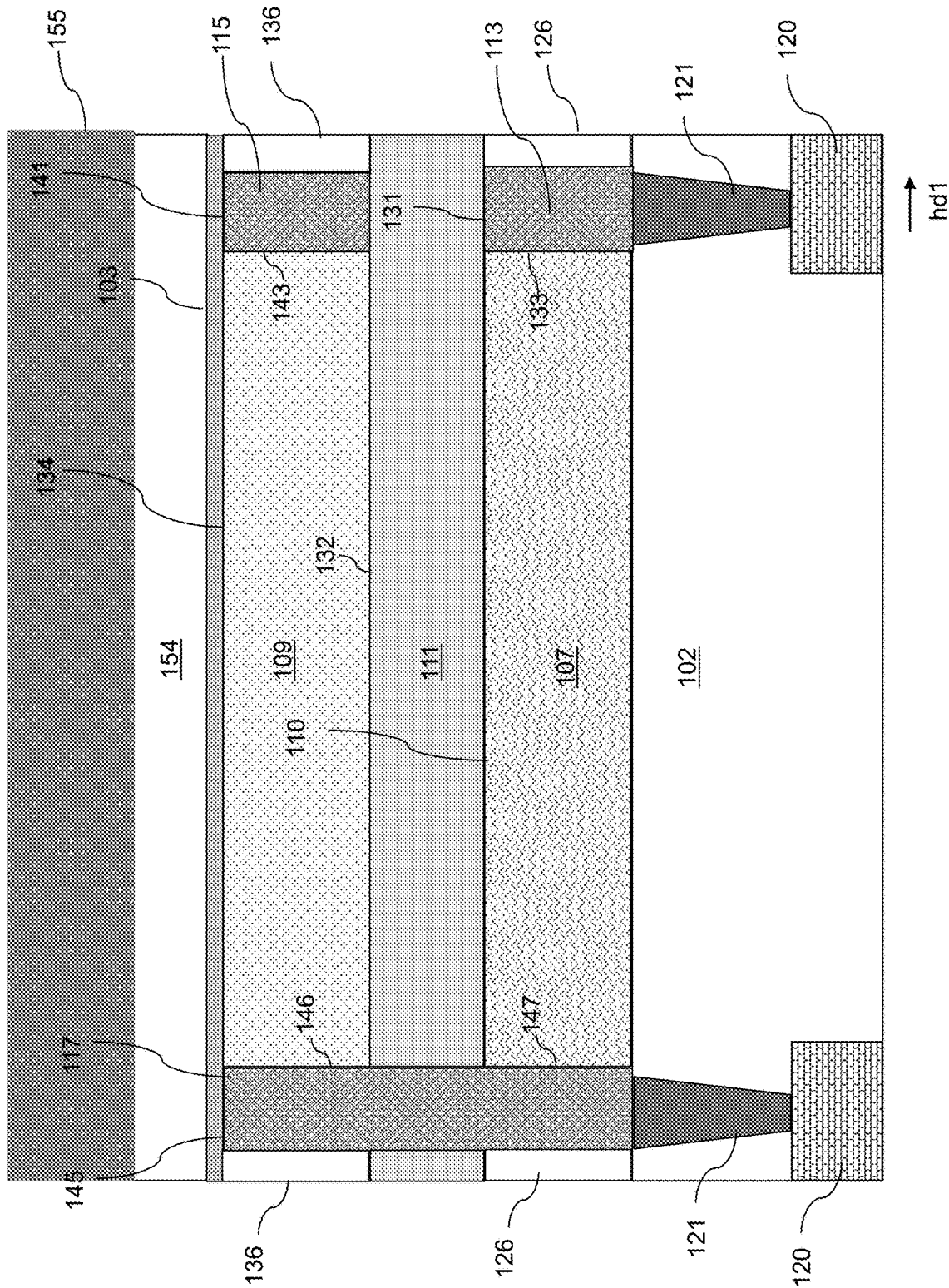
FIG. 25B is a vertical cross-section view of the intermediate structure taken along line A-A' in FIG. 25A.
Figure 25C:
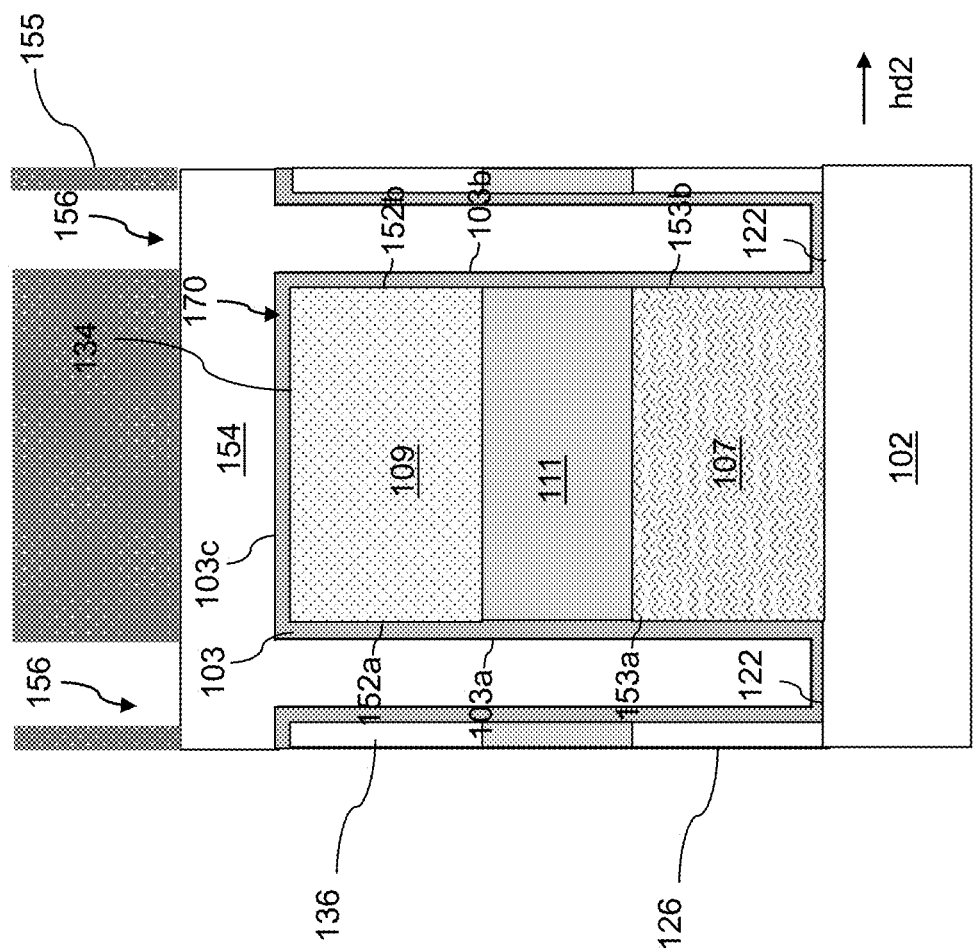
FIG. 25C is a vertical cross-section view of the intermediate structure taken along line B-B' in FIG. 25A.

FIG. 25A is a top view of the intermediate structure illustrating a dielectric fill layer 154 formed over the gate dielectric layer 103 and filling a remaining volume of the trench openings 151 and a patterned mask 155 formed over the dielectric fill layer 154 according to various embodiments of the present disclosure. FIG. 25B is a vertical cross-section view of the intermediate structure taken along line A-A' in FIG. 25A. FIG. 25C is a vertical cross-section view of the exemplary intermediate structure taken along line B-B' in FIG. 25A. Referring to FIGS. 25A-25C, a dielectric fill layer 154 may be deposited over the upper surface of the gate dielectric layer 103 via a suitable deposition method (e.g., CVD, ALD, PVD, PECVD, spin coating, etc.). The dielectric fill layer 154 may fill the remaining volume of the pair of trench openings 151. The dielectric fill layer 154 may be composed of a suitable dielectric material as described above. An optional planarization process, such as a chemical mechanical planarization (CMP) process, may be performed to provide a planar upper surface of the dielectric fill layer 154.

A patterned mask 155 may be formed over the dielectric fill layer 154 by depositing a layer of a photoresist material over the upper surface of the dielectric fill layer 154 and patterning the photoresist material using lithographic techniques to form a patterned photoresist mask 155 as shown in FIGS. 25A-25C. The patterned mask 155 may be similar to the patterned mask 149 described above with reference to FIGS. 22A-22C and may include a pair of strip-shaped openings 156 extending parallel to one another along the first horizontal direction hd1. The dielectric fill layer 154 may be exposed at the bottom of each of the openings 156 in the patterned mask 155. In some embodiments, a length dimension of each of the openings 156 along the first horizontal direction hd1 may be at least about 10 nm. In some embodiments, the length dimension of the openings 156 may be substantially commensurate with a distance between the third electrode 117 and the second electrode 115 along the first horizontal direction hd1. In various embodiments, a width dimension of each of the openings 156 along the second horizontal direction hd2 may be at least about 10 nm. As shown in FIG. 25C, the patterned mask 155 may overlie a horizontally-extending 103c portion of the gate dielectric layer 103 located over the upper surface 134 of the second conductivity-type semiconductor layer 109 and vertically-extending portions 103a and 103b of the gate dielectric layer 103 that contact side surfaces 152a and 152b of the second conductivity-type semiconductor layer 109 and side surfaces 153a and 153b of the first conductivity-type semiconductor layer 107.

Figure 26A:
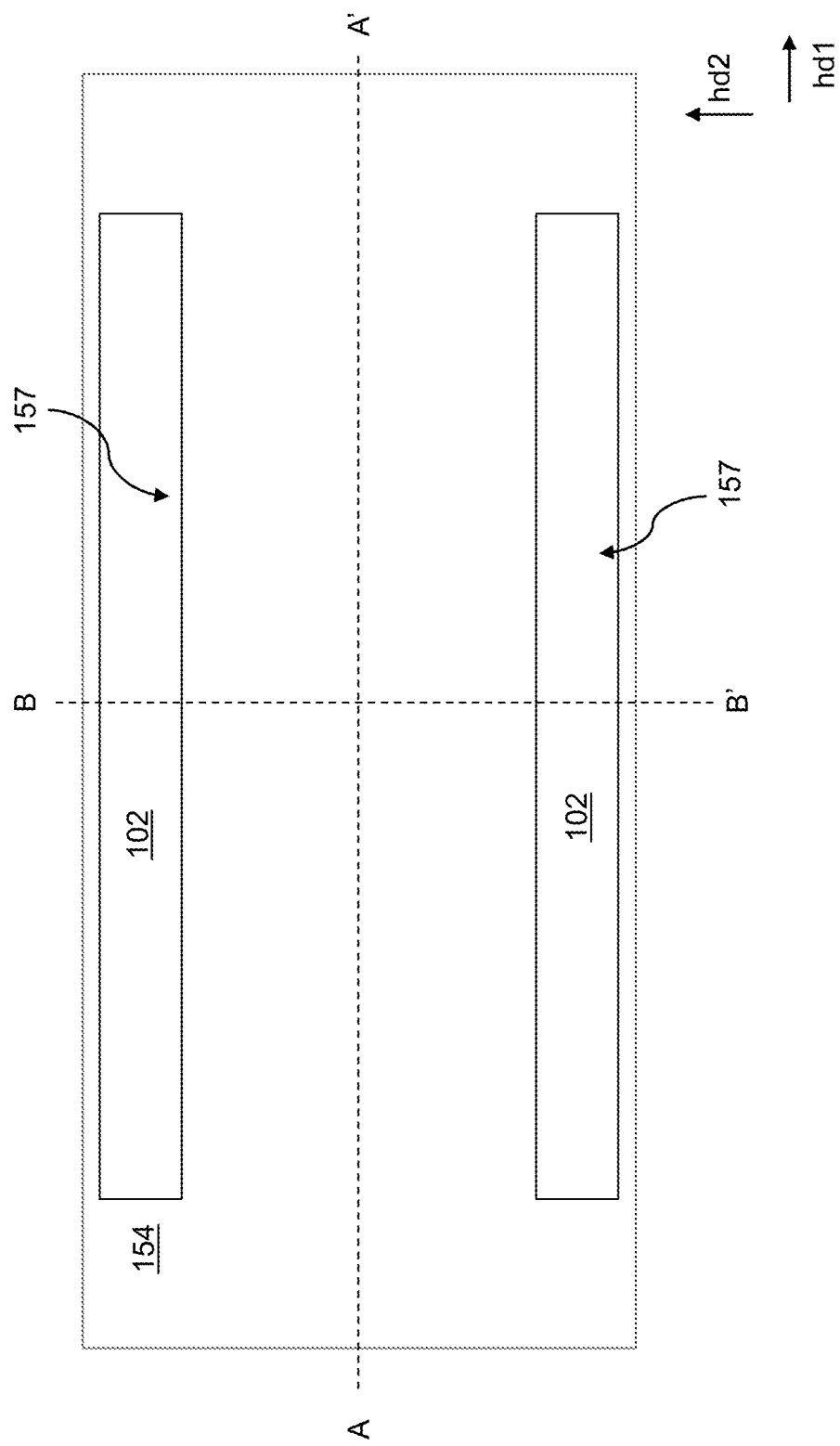
FIG. 26A is a top view of the intermediate structure illustrating a pair of trench openings formed through the dielectric fill layer and portions of the gate dielectric layer and exposing the upper surface of the first dielectric layer according to various embodiments of the present disclosure.
Figure 26B:
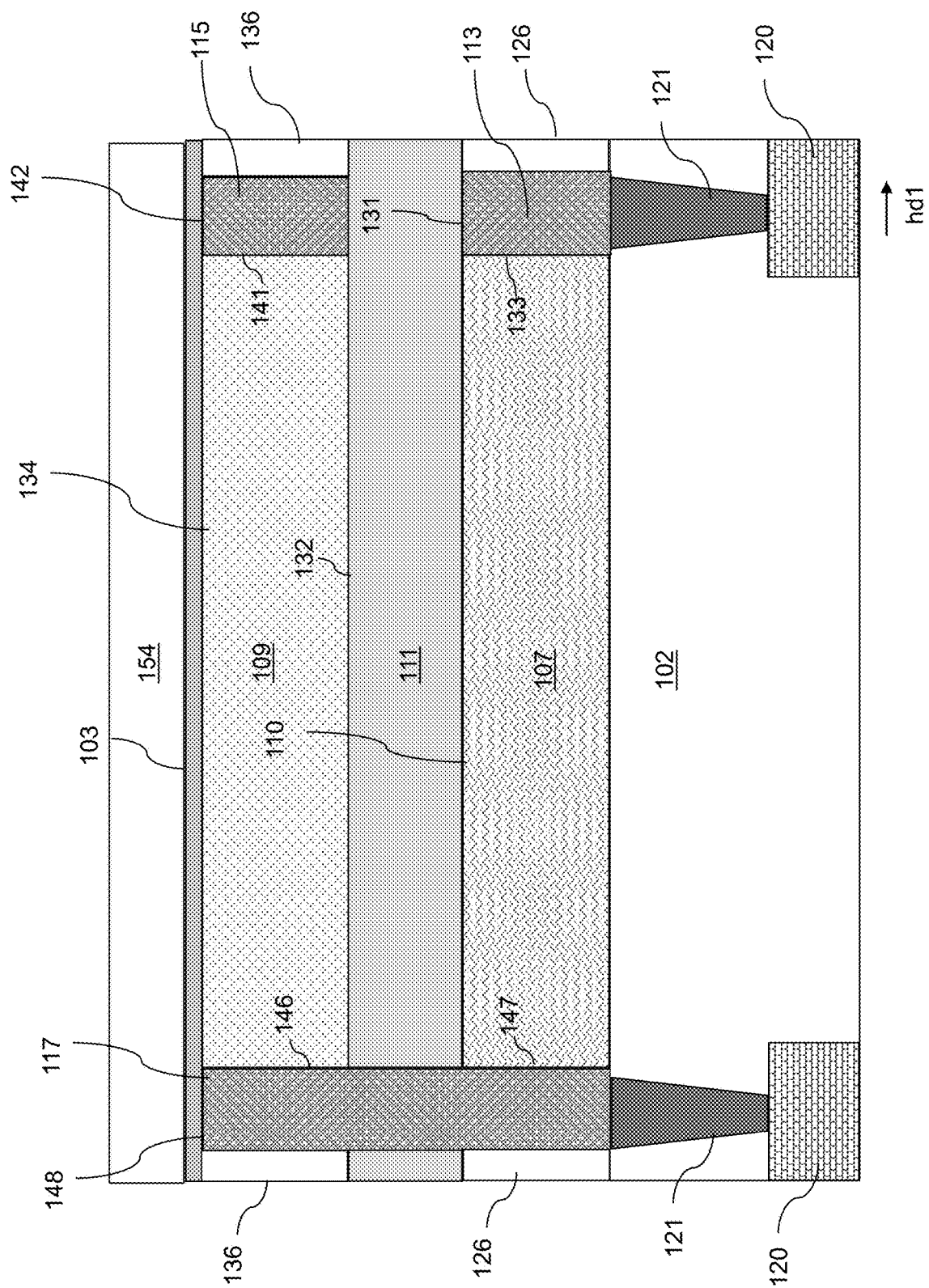
FIG. 26B is a vertical cross-section view of the intermediate structure taken along line A-A' in FIG. 26A.
Figure 26C:
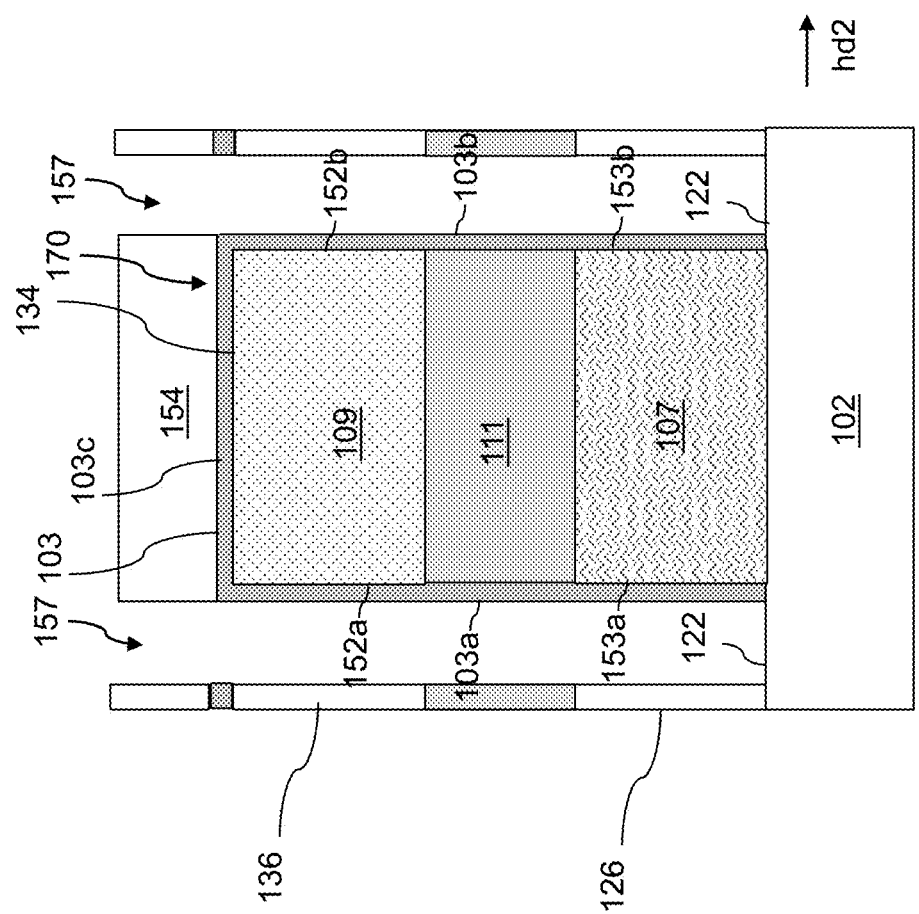
FIG. 26C is a vertical cross-section view of the intermediate structure taken along line B-B' in FIG. 26A.

FIG. 26A is a top view of the intermediate structure illustrating a pair of trench openings 157 formed through the dielectric fill layer 154 and portions of the gate dielectric layer 103 and exposing the upper surface 122 of the first dielectric layer 102 according to various embodiments of the present disclosure. FIG. 26B is a vertical cross-section view of the intermediate structure taken along line A-A' in FIG. 26A. FIG. 26C is a vertical cross-section view of the intermediate structure taken along line B-B' in FIG. 26A. Referring to FIGS. 26A-26C, an anisotropic etching process may be performed to remove portions of the dielectric fill layer 154 and the gate dielectric layer 103, and optionally portions of the third dielectric layer 136, the dielectric isolation layer 111, and the second dielectric layer 126 to provide a pair of trench openings 157 extending parallel to one another along the first horizontal direction hd1. The patterned mask 155 may then be removed by ashing or by dissolution with a solvent. Following the etching process, the upper surface 122 of the first dielectric layer 102 may be exposed at the bottom of each of the trench openings 157. As shown in FIG. 26C, a portion of the gate dielectric layer 103 may surround the layer stack 170 over two side surfaces and an upper surface of the layer stack 170. That is, a first vertically-extending portion 103a of the gate dielectric layer 103 may extend over and contact a first side surface 153a of the first conductivity-type semiconductor layer 107, a first side surface of the dielectric isolation layer 111, and a first side surface 152a of the second conductivity-type semiconductor layer 109. A second vertically-extending portion 103b of the gate dielectric layer 103 may extend over and contact a second side surface 153b of the first conductivity-type semiconductor layer 107, a second side surface of the dielectric isolation layer 111, and a second side surface 152b of the second conductivity-type semiconductor layer 109. A horizontally-extending portion 103c of the gate dielectric layer 103 may extend over and contact the upper surface 134 of the second conductivity-type semiconductor layer 109 between the first vertically-extending portion 103a and the second vertical-extending portion 103b of the dielectric layer 103. The first vertically-extending portion 103a and the second vertical-extending portion 103b of the gate dielectric layer 103 may each form an outer sidewall of a respective trench opening 157.

Figure 27A:
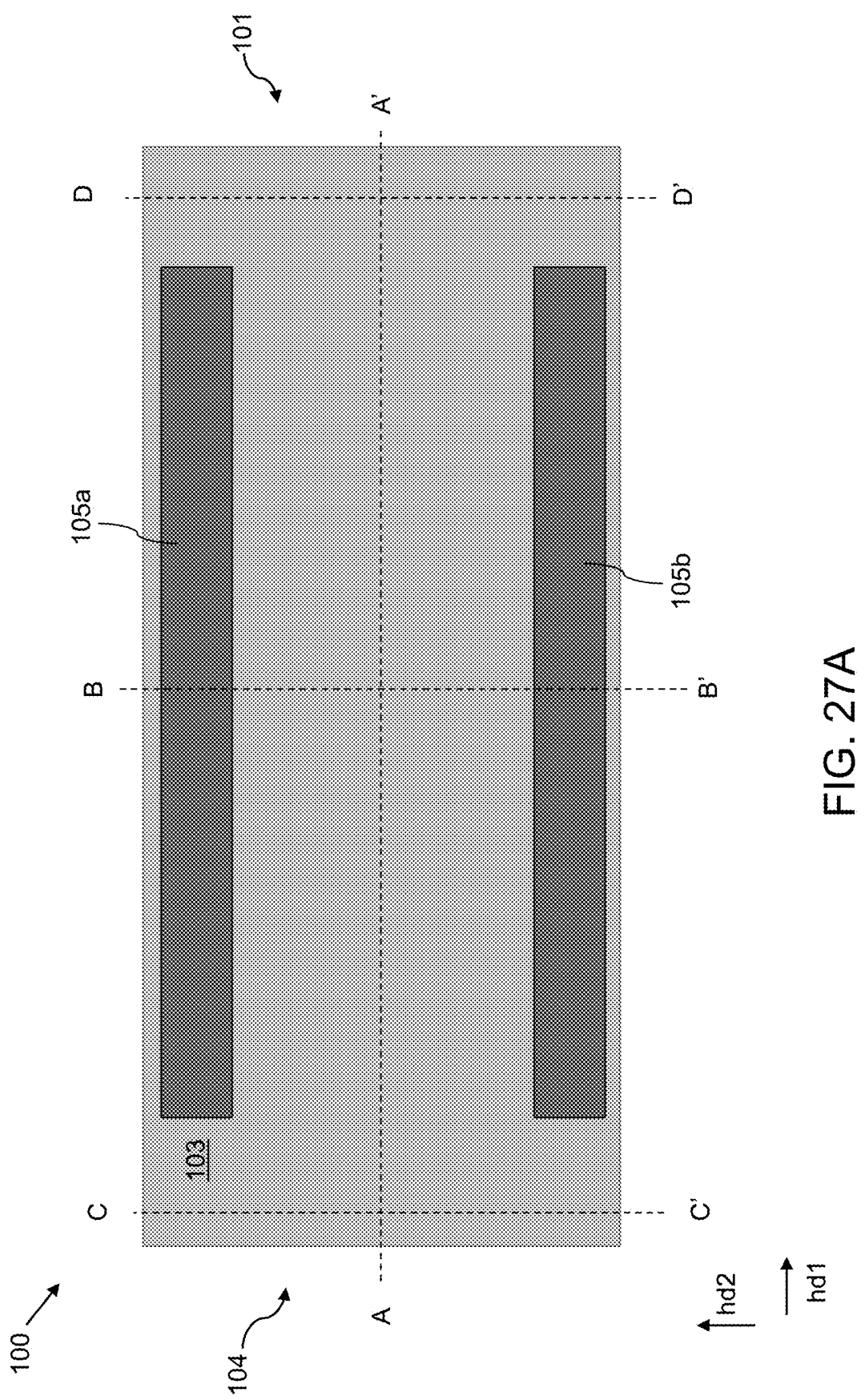
FIG. 27A is a top view of a semiconductor device structure including a pair of gate electrodes extending on opposite sides of a layer stack according to various embodiments of the present disclosure.
Figure 27B:
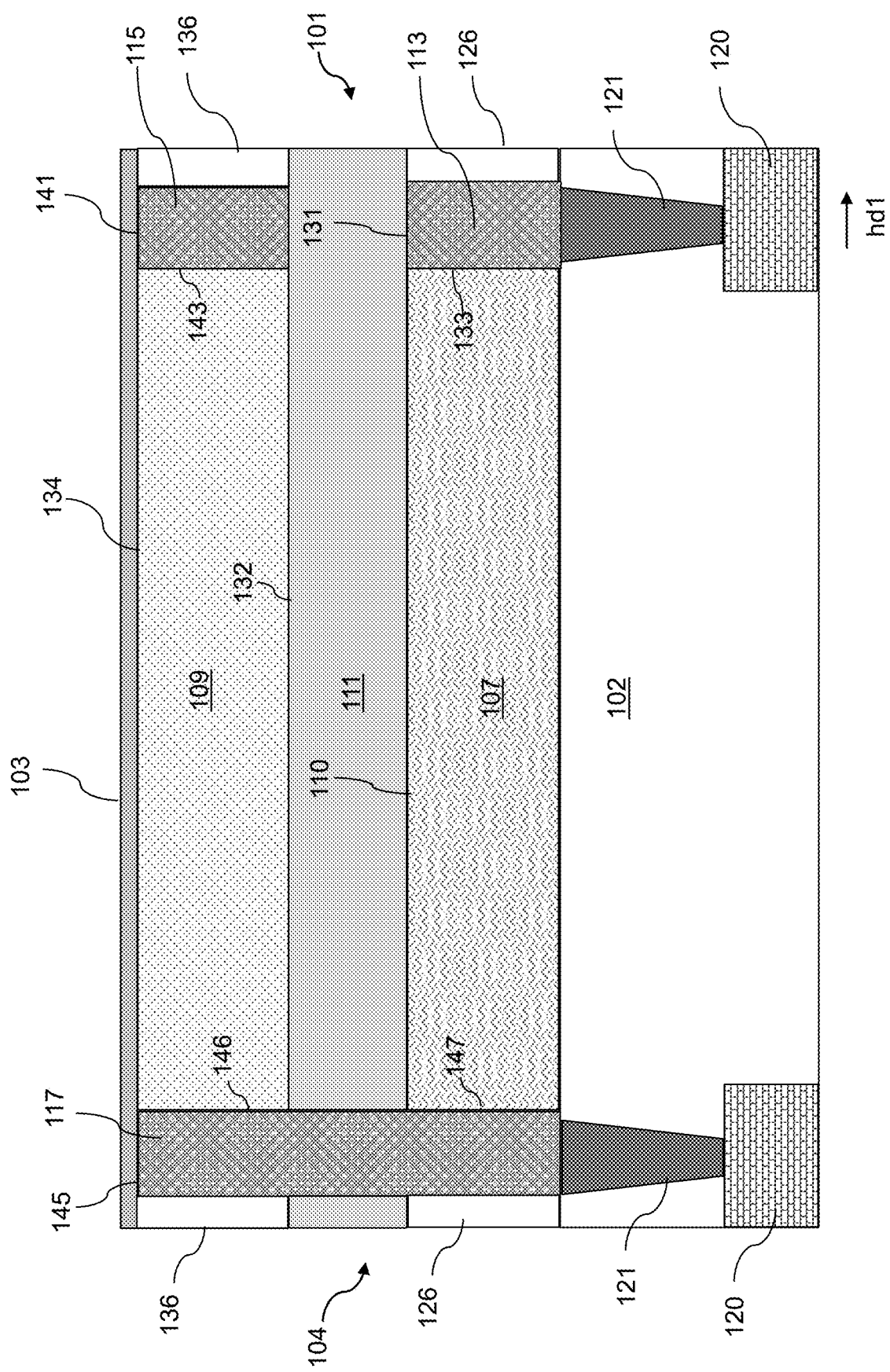
FIG. 27B is a vertical cross-section view of the intermediate structure taken along line A-A' in FIG. 27A.
Figure 27C:
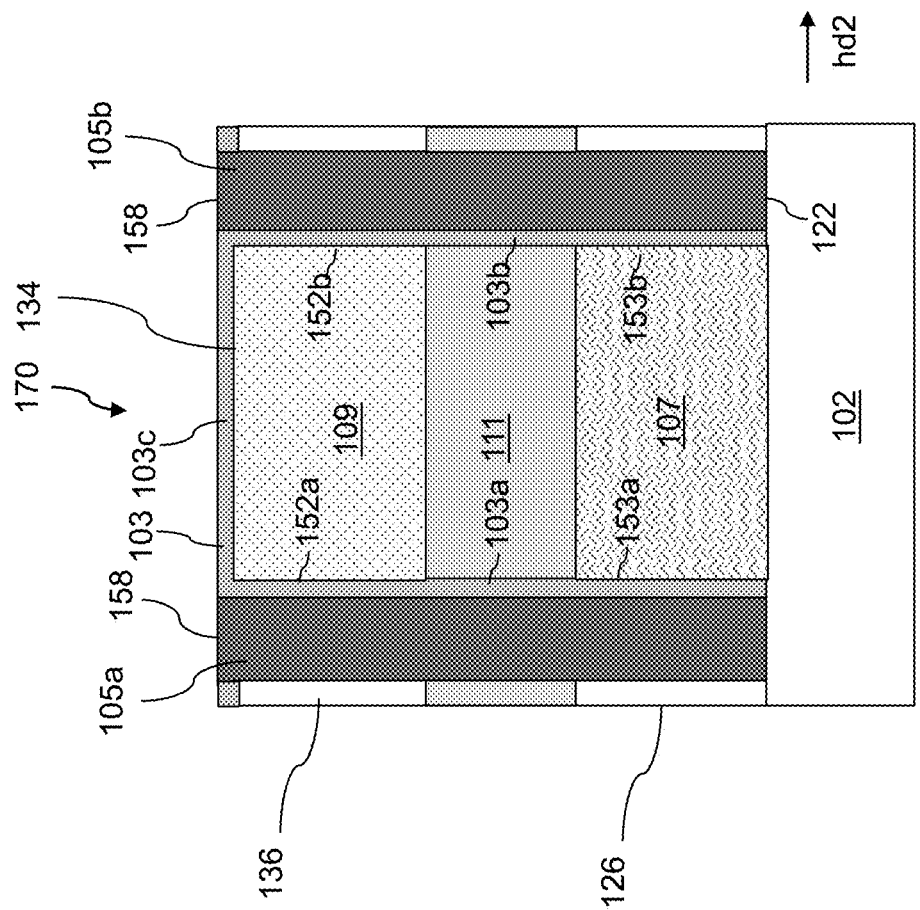
FIG. 27C is a vertical cross-section view of the intermediate structure taken along line B-B' in FIG. 27A.
Figure 27E:
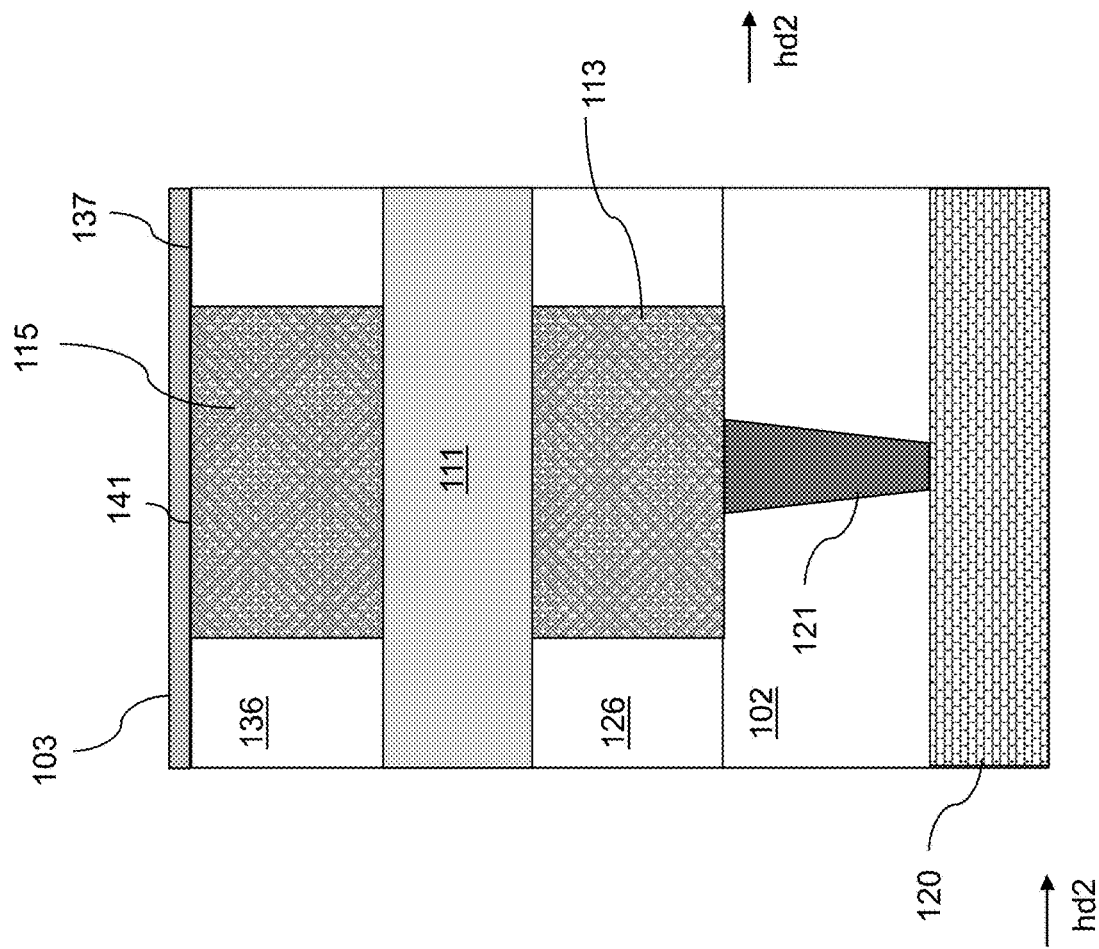
FIG. 27E is a vertical cross-section view of the intermediate structure taken along line D-D' in FIG. 27A.
Figure 27D:
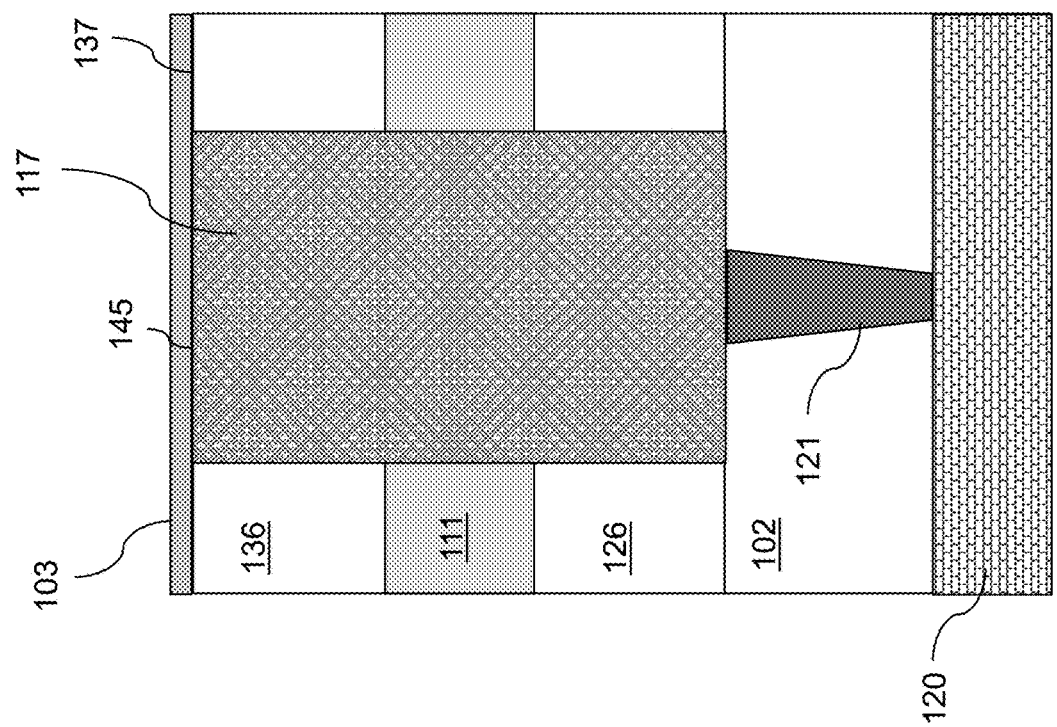
FIG. 27D is a vertical cross-section view of the intermediate structure taken along line C-C' in FIG. 27A.

FIG. 27A is a top view of a semiconductor device structure 100 including a pair of gate electrodes 105a and 105b extending on opposite sides of a layer stack 170 according to various embodiments of the present disclosure. FIG. 27B is a vertical cross-section view of the intermediate structure taken along line A-A' in FIG. 27A. FIG. 28C is a vertical cross-section view of the intermediate structure taken along line B-B' in FIG. 27A. FIG. 27D is a vertical cross-section view of the intermediate structure taken along line C-C' in FIG. 27A. FIG. 27E is a vertical cross-section view of the intermediate structure taken along line D-D' in FIG. 27A. Referring to FIGS. 26A-26E, a conductive material may be deposited within the trench openings 157 and over the upper surface of the dielectric fill layer 154. The conductive material may fill the trench openings 157 to at least the level of a horizontal plane including the upper surface of the horizontally-extending portion 103c of the gate dielectric layer 103. A planarization process, such as a CMP process and/or an etching process, may be used to remove portions of the conductive material and the dielectric fill layer 154 from above the horizontal plane including the upper surface of the horizontally-extending portion 103c of the gate dielectric layer 103 and provide discrete gate electrodes 105a and 105b located within each of the trench openings 157. A first gate electrode 105a may contact the first vertically-extending portion 103a of the gate dielectric layer 103 over a first side surface of the layer stack 170, and a second gate electrode 105b may contact the second vertically-extending portion 103b of the gate dielectric layer 103 over a second side surface of the layer stack 170.

The first gate electrode 105a and the second gate electrode 105b may be composed of a suitable conductive material as described above, such as TiN, W, WN, WCN, Co, PdCo, Mo, Cu, TaN, Ti, Al, etc., including combinations and alloys thereof. Other suitable electrically conductive materials are within the contemplated scope of disclosure. In some embodiments, the first gate electrode 105a and the second gate electrode 105b may include a metallic liner material and a metallic fill material as described above. The first gate electrode 105a and the second gate electrode 105b may be formed by suitable deposition process, which may include one or more of a CVD process, a PVD process, an ALD process, an electroplating process, etc. Other suitable deposition processes are within the contemplated scope of disclosure. In various embodiments, each of the gate electrodes 105a and 105b may have a length dimension along the first horizontal direction hd1 of at least about 10 nm, and a width dimension along the second horizontal direction hd2 of at least about 10 nm. An upper surface 158 of each of the gate electrodes 105a and 105b may be substantially coplanar with the upper surface of the gate dielectric layer 103.

Referring to FIGS. 27A-27E, a semiconductor device structure 100 according to an embodiment of the present invention is illustrated. The semiconductor device structure includes a layer stack 170 including a first conductivity-type semiconductor layer 107, a dielectric isolation layer 111 over the first conductivity-type semiconductor layer 107, and a second conductivity-type semiconductor layer 109 over the dielectric isolation layer 111. A first electrode 113 may be located on a first end 101 of the semiconductor device structure 100 and may contact a first side surface 133 of the first conductivity-type semiconductor layer 107. A second electrode 115 may be located on the first end 101 of the semiconductor device structure 100 and may contact a first side surface 143 of the second conductivity-type semiconductor layer 109. The dielectric isolation layer 111 may extend between the first electrode 113 and the second electrode 115. A third electrode 117 may be located on a second end 104 of the semiconductor device structure 100 that is opposite the first end 101 and may contact a second side surface 147 of the first conductivity-type semiconductor layer 107, a side surface of the dielectric isolation layer 111, and a second side surface 146 of the second conductivity-type semiconductor layer 109. A pair of gate electrodes 105a may extend along opposite side surfaces of the layer stack 170 and a gate dielectric layer 103 may extend between each of the gate electrodes 105a and 105b and each of the respective side surfaces of the layer stack 170.

In various embodiments, the semiconductor device structure 100 may be configured as a NOT gate or inverter circuit such that the application of a given input signal having a first logic state at the first gate electrode 105a and the second gate electrode 105b will produce an output signal from the third electrode 117 having the complementary logic state. In this regard, a high voltage input signal at the first gate electrode 105a and the second gate electrode 105b results in a low voltage output signal at the third electrode 117, and a low voltage input signal at the first gate electrode 105a and the second gate electrode 105b results in a high voltage output signal at the third electrode 117. In various embodiments, the semiconductor device structure 100 may be fabricated using a BEOL process using thin-film metal-oxide semiconductor materials. Accordingly, this may enable computing operations to be performed, at least in part, within one or more interconnect levels of a semiconductor integrated circuit (IC) die, which may enable improved integration density and/or increased processing power of the semiconductor IC die.

Figure 28A:
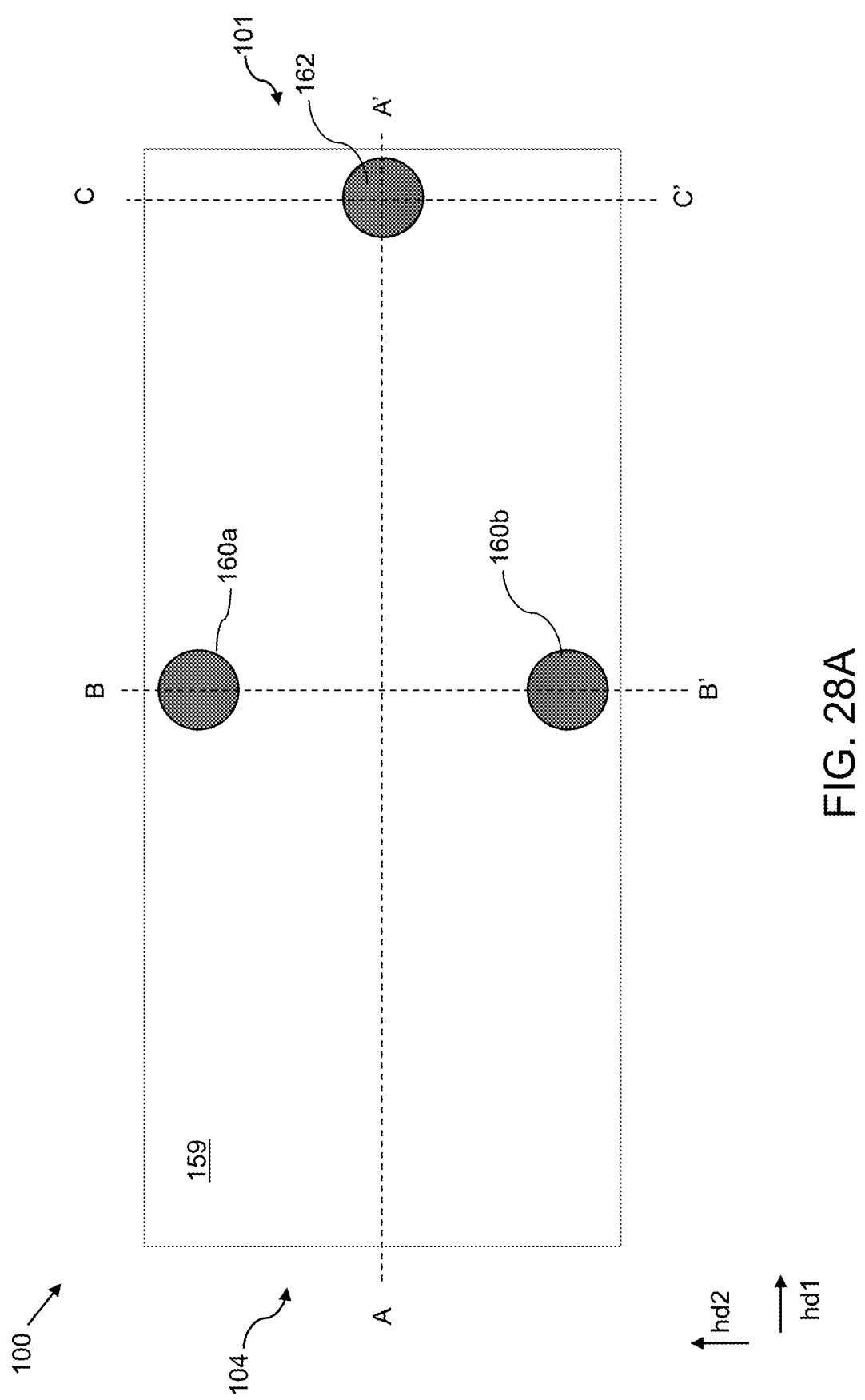
FIG. 28A is a top view of a semiconductor device structure including a fourth dielectric material layer formed over the gate dielectric layer and the gate electrodes and a plurality of conductive vias located within the fourth dielectric material layer according to various embodiments of the present disclosure.
Figure 28B:
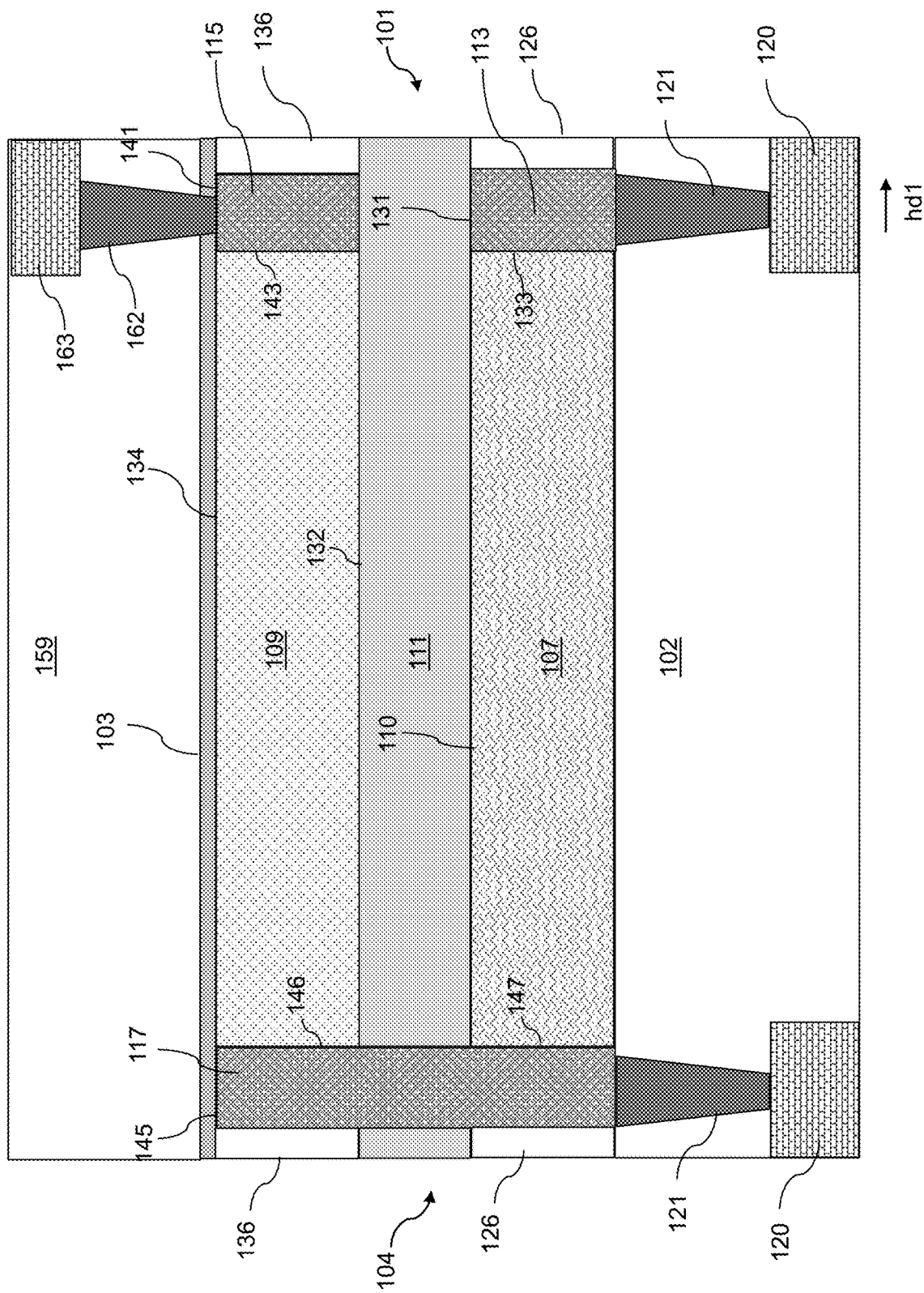
FIG. 28B is a vertical cross-section view of the semiconductor device structure 100 of taken along line A-A' in FIG. 28A.
Figure 28C:
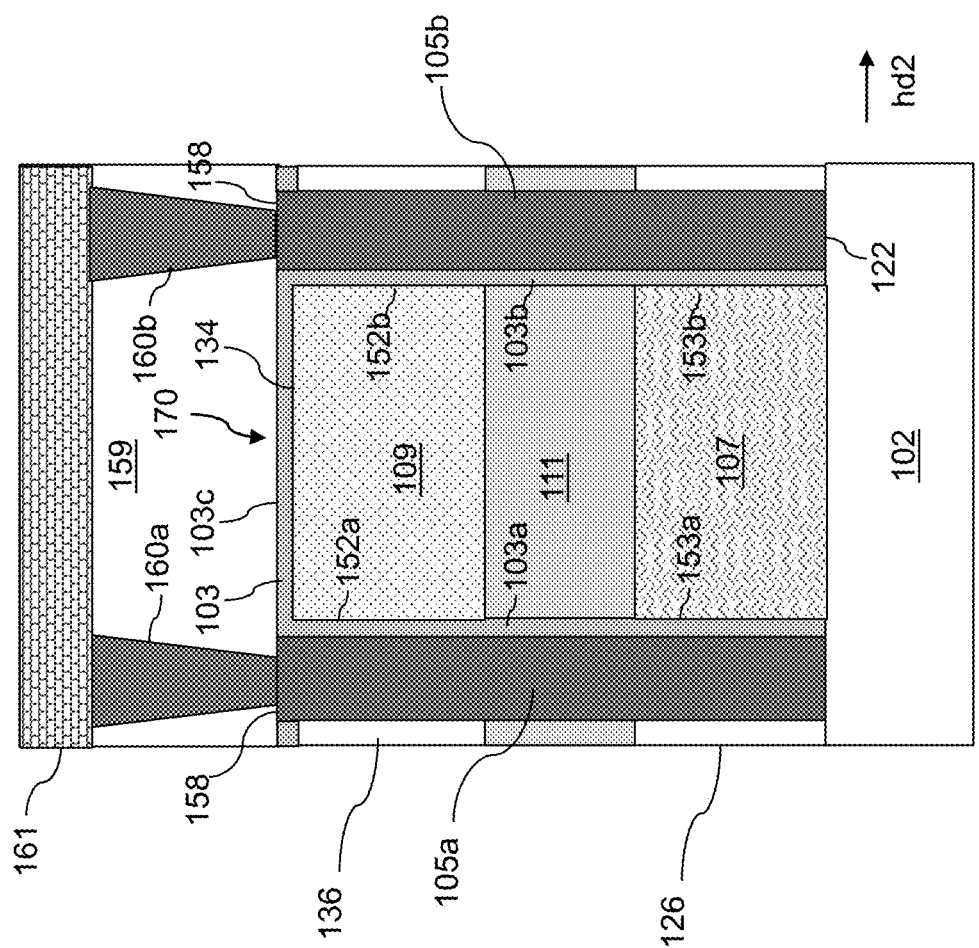
FIG. 28C is a vertical cross-section view of the semiconductor device structure 100 of taken along line B-B' in FIG. 28A.

FIG. 28A is a top view of a semiconductor device structure 100 including a fourth dielectric material layer 159 formed over the gate dielectric layer 103 and the gate electrodes 105a and 105b and a plurality of conductive vias 160a and 160b located within the fourth dielectric material layer 159 according to various embodiments of the present disclosure. FIG. 28B is a vertical cross-section view of the semiconductor device structure 100 of taken along line A-A' in FIG. 28A. FIG. 28C is a vertical cross-section view of the semiconductor device structure 100 of taken along line B-B' in FIG. 28A. Referring to FIGS. 28A-28C, the fourth dielectric material layer 159 may be deposited over the upper surface of the gate dielectric layer 103 and the upper surfaces 158 of the first and second gate electrodes 105a and 105b via a suitable deposition method (e.g., CVD, ALD, PVD, PECVD, spin coating, etc.). The fourth dielectric material layer 159 may be composed of a suitable dielectric material as described above (e.g., undoped silicate glass, a doped silicate glass, organosilicate glass, silicon oxynitride, silicon carbide nitride, etc.). Metal interconnect features, including metal lines 161, 163 and conductive vias 160a, 160b, 162, may be formed within the first dielectric material layer 102 (e.g., via a single or dual damascene process). (The metal lines 161 and 163 are not shown in FIG. 28A for purposes of clarity). A via 162 may electrically connect a metal line 163 to the second electrode 115 as shown in FIG. 28B. A pair of vias 160a and 160b may electrically connect a metal line 161 to each of the gate electrodes 105a and 105b, as shown in FIG. 28C.

Figure 29:
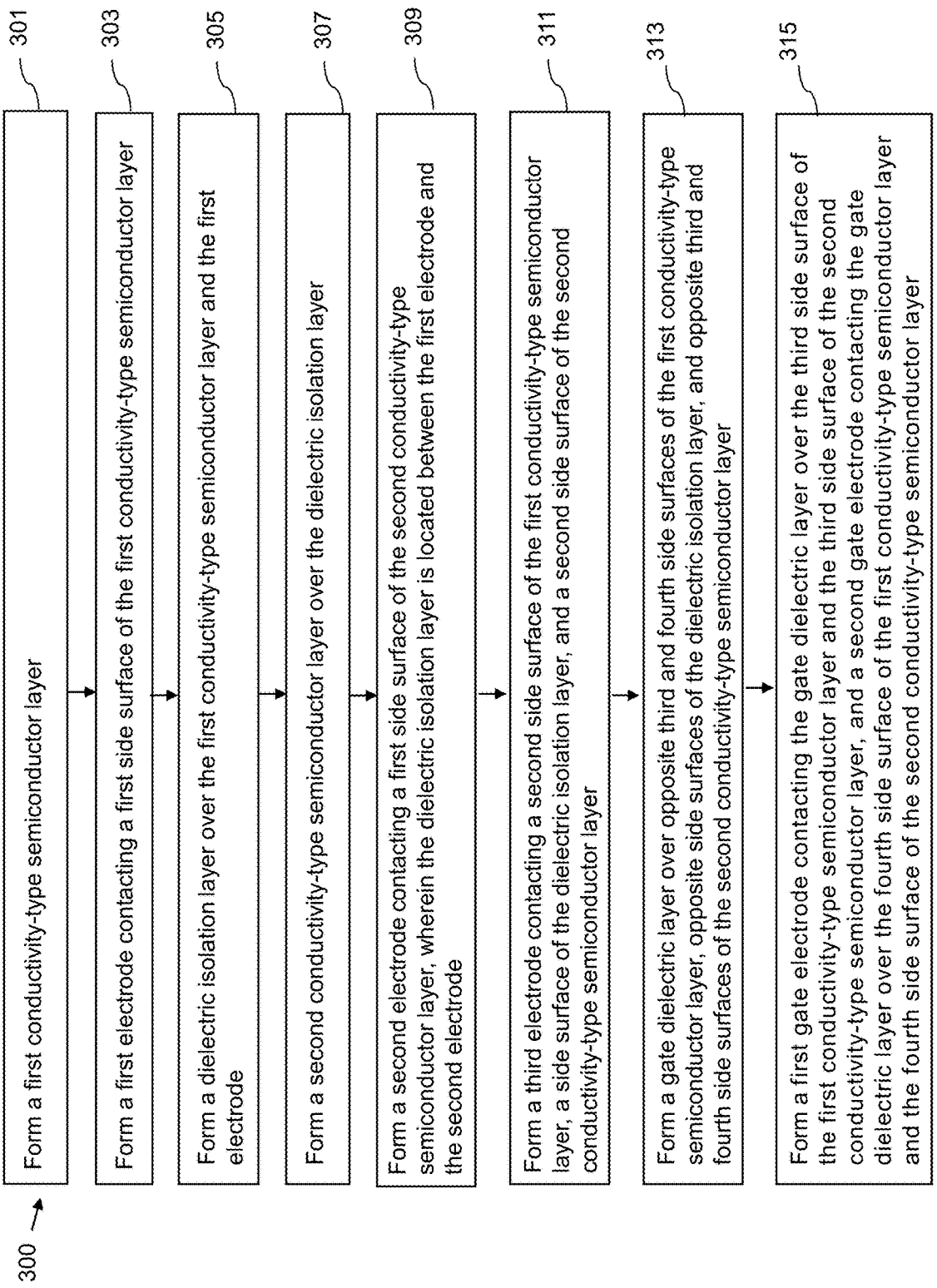
FIG. 29 is a flow diagram illustrating a method for fabricating a semiconductor device structure according to various embodiments of the present disclosure.

FIG. 29 is a flow diagram illustrating a method 300 for fabricating a semiconductor device structure 100 according to various embodiments of the present disclosure. Referring to FIGS. 4A-6B and 29, in step 301 of embodiment method 300 a first conductivity-type semiconductor layer 107 may be formed. Referring to FIGS. 7A-10B and 29, in step 303 of embodiment method 300, a first electrode 113 may be formed contacting a first side surface 133 of the first conductivity-type semiconductor layer 107. Referring to FIGS. 11A-B and 29, in step 305 of embodiment method 300, a dielectric isolation layer 111 may be formed over the first conductivity-type semiconductor layer 107 and the first electrode 113. Referring to FIGS. 12A-14B and 29, in step 307 of embodiment method 300, a second conductivity-type semiconductor layer 109 may be formed over the dielectric isolation layer 111. Referring to FIGS. 15A-18B and 29, in step 309 of embodiment method 300, a second electrode 115 may be formed contacting a first side surface 143 of the second conductivity-type semiconductor layer 109. Referring to FIGS. 19A-21B and 29, in step 311 of embodiment method 300, a third electrode 117 may be formed contacting a second side surface 147 of the first conductivity-type semiconductor layer 107, a side surface of the dielectric isolation layer 111, and a second side surface 146 of the second conductivity-type semiconductor layer 109. Referring to FIGS. 22A-26C and 29, in step 313 of embodiment method 300, a gate dielectric layer 103 may be formed over opposite third and fourth side surfaces 153a and 153b of the first conductivity-type semiconductor layer 107, opposite side surfaces of the dielectric isolation layer 111, and opposite third and fourth side surfaces 152a and 152b of the second conductivity-type semiconductor layer 109. Referring to FIGS. 27A-27E and 29, in step 315 of embodiment method 300, a first gate electrode 105a may be formed contacting the gate dielectric layer 103 over the third side surface 153a of the first conductivity-type semiconductor layer 107 and the third side surface 152a of the second conductivity-type semiconductor layer 109, and a second gate electrode 105b may be formed contacting the gate dielectric layer 103 over the fourth side surface 153b of the first conductivity-type semiconductor layer 107 and the fourth side surface 152b of the second conductivity-type semiconductor layer 109.

Referring to all drawings and according to various embodiments of the present disclosure, a semiconductor device structure 100 is provided. The semiconductor device structure 100 may include a layer stack 170 having a first conductivity-type semiconductor layer 107, a dielectric isolation layer 111 over the first conductivity-type semiconductor layer 107, and a second conductivity-type semiconductor layer 109 over the dielectric isolation layer 111. A first electrode 113 may be adjacent to a first end 101 of the layer stack 170 and may contact a first side surface 133 of the first conductivity-type semiconductor layer 107. A second electrode 115 may be adjacent to the first end 101 of the layer stack and may contact a first side surface 143 of the second conductivity-type semiconductor layer 109. A third electrode 117 may be adjacent to a second end 104 of the layer stack 170 opposite the first end 101 of the layer stack 170 and may contact a second side surface 147 of the first conductivity-type semiconductor layer 107, a side surface of the dielectric isolation layer 111, and a second side surface 146 of the second conductivity-type semiconductor layer 109. A gate dielectric layer 103 may contact opposite side surfaces of the layer stack 170 over at least a portion of a length of the layer stack 170 between the first end and the second end of the layer stack 170. A pair of gate electrodes 105a and 105b may contact the gate dielectric layer 103 and extend over the opposite side surfaces of the layer stack 170 over at least a portion of the length of the layer stack 170 between the first end and the second end of the layer stack 170.

In an embodiment, at least one of the first conductivity-type semiconductor layer 107 or the second conductivity-type semiconductor layer 109 include metal-oxide semiconductors.

In another embodiment, the first conductivity-type semiconductor layer 107 includes a p-type semiconductor layer, and the second conductivity-type semiconductor layer 109 includes an n-type semiconductor layer.

In another embodiment, the p-type semiconductor layer includes one or more of NiO, SnO, and $Cu_2O$.

In another embodiment, the n-type semiconductor layer includes one or more of amorphous silicon, $Al_2O_5Zn_2$ doped ZnO, InGaZnO, InGaO, InWO, InZnO, InSnO, $Ga_2O_3$, ZnO, GaO, $Ga_2O_3$, InO, $In_2O_3$, InZnO, ZnO, TiOx, and a III-V semiconductor material.

In another embodiment, a length of the layer stack 170 along a first horizontal direction hd1 between the first end 101 and the second end 104 of the layer stack 170 is 15 nm or more.

In another embodiment, a width of each of the first electrode 113, the second electrode 115, and the third electrode 117 along a second horizontal direction hd2 that is perpendicular to the first horizontal direction hd1 is equal to a width of the layer stack 170 between the opposite side surfaces of the layer stack 170.

In another embodiment, a thickness of the first conductivity-type semiconductor layer 107 and the second conductivity-type semiconductor layer 109 is between 2 nm and 50 nm, a thickness of the dielectric isolation layer 111 is at least 5 nm, and a thickness of the gate dielectric layer 103 is between 2 nm and 20 nm.

In another embodiment, the gate dielectric layer 103 includes a first portion 103a that extends over a first side surface of the layer stack 170, a second portion 103b that extends over a second side surface of the layer stack 170, and a third portion 103c that extends over an upper surface 134 of the second conductivity-type semiconductor layer 109 between the first portion 103a and the second portion 103b of the gate dielectric layer 103.

In another embodiment, the first conductivity-type semiconductor layer 103 is formed over an interconnect-level dielectric layer 102 having a horizontal surface 122, and wherein the interfacing surfaces of the first conductivity-type semiconductor layer 107, the dielectric isolation layer 111, and the second conductivity-type semiconductor layer 109 are substantially parallel to the horizontal surface 122 of the interconnect-level dielectric layer 102.

In another embodiment, the interconnect-level dielectric layer 102 further includes one or more electrical interconnect structures (120, 121), and wherein the first electrode 113 and the third electrode 117 are electrically connected to the one or more electrical interconnect structures (120, 121).

In another embodiment, a dielectric material matrix (126, 111, 136, 103, 159) is located over and laterally surrounds the semiconductor device structure 100, the dielectric material matrix (126, 111, 136, 103, 159) including one or more electrical interconnect structures (160a, 160b, 161, 162, 163), and the second electrode 115 and the pair of gate electrodes 105a and 105b are electrically connected to the one or more electrical interconnect structures (160a, 160b, 161, 162, 163) in the dielectric material matrix (126, 111, 136, 103, 159).

In another embodiment, the first electrode 113 is electrically connected to a voltage supply terminal VDD, the second electrode 115 is electrically connected to a ground terminal GND, the pair of gate electrodes 105a and 105b are electrically connected to a signal input terminal Vin, and the third electrode 117 is electrically connected to a signal output terminal Vout.

Another embodiment is drawn to a semiconductor device including a substrate 8 having a semiconductor material layer 9; a plurality of device structures 700 formed on or in the semiconductor material layer 9, at least one interconnect-level dielectric layer (601, 610, 620, 630, 640, 102) over the substrate 8 and the device structures 700 and including conductive interconnect structures (612, 618, 622, 628, 632, 638, 642, 648, 120, 121), and a NOT gate logic circuit 100 located over an interconnect-level dielectric layer (601, 610, 620, 630, 640, 102). The NOT gate logic circuit 100 may include a first conductivity-type semiconductor layer 107, a second conductivity-type semiconductor layer 109, a first electrode 113 contacting a first side surface 133 of the first conductivity-type semiconductor layer 107, a second electrode 115 contacting a first side surface 143 of the second conductivity-type semiconductor layer 109, a dielectric isolation layer 111 extending between the first conductivity-type semiconductor layer 107 and the second conductivity-type semiconductor layer 109 and between the first electrode 113 and the second electrode 115, a third electrode 117 contacting a second side surface 147 of the first conductivity-type semiconductor layer 107, a second side surface 146 of the second conductivity-type semiconductor layer 109, and a side surface of the dielectric isolation layer 111, a gate dielectric layer 103 contacting the first conductivity-type semiconductor layer 107 and the second conductivity-type semiconductor layer 109, and a gate electrode (105a, 105b) contacting the gate dielectric layer 103.

In an embodiment, interfacing surfaces of the first conductivity-type semiconductor layer 107, the dielectric isolation layer 111, and the second conductivity-type semiconductor layer 109 are parallel to a major surface of the substrate 8.

In another embodiment, the first conductivity-type semiconductor layer 107 includes a p-type semiconductor layer, the second conductivity-type semiconductor layer 109 includes an n-type semiconductor layer, the first electrode 113 is electrically connected to a voltage source terminal VDD, the second electrode 115 is electrically connected to a ground terminal GND, the gate electrode (105a, 105b) is electrically connected to an input signal terminal Vin, and the third electrode 117 is electrically connected to an output signal terminal Vout.

Another embodiment is drawn to a method of fabricating a semiconductor device structure that includes forming a first conductivity-type semiconductor layer 107, forming a first electrode 113 contacting a first side surface 133 of the first conductivity-type semiconductor layer 107, forming a dielectric isolation layer 111 over the first conductivity-type semiconductor layer 107 and the first electrode 113, forming a second conductivity-type semiconductor layer 109 over the dielectric isolation layer 111, forming a second electrode 115 contacting a first side surface 143 of the second conductivity-type semiconductor layer 109, forming a third electrode 117 contacting a second side surface 147 of the first conductivity-type semiconductor layer 107, a side surface of the dielectric isolation layer 111, and a second side surface 146 of the second conductivity-type semiconductor layer 109, forming a gate dielectric layer 103 over opposite third and fourth side surfaces 153a and 153b of the first conductivity-type semiconductor layer 107, opposite side surfaces of the dielectric isolation layer 111, and opposite third and fourth side surfaces 152a and 152b of the second conductivity-type semiconductor layer 109, and forming a first gate electrode 105a contacting the gate dielectric layer 103 over the third side surface 153a of the first conductivity-type semiconductor layer 107 and the third side surface 152a of the second conductivity-type semiconductor layer 109, and a second gate electrode 105b contacting the gate dielectric layer 103 over the fourth side surface 153b of the first conductivity-type semiconductor layer 107 and the fourth side surface 152b of the second conductivity-type semiconductor layer 109.

In an embodiment, forming the gate dielectric layer 103 includes forming a pair of trench openings 151, wherein the opposite third and fourth side surfaces 152a and 152b of the second conductivity-type semiconductor layer 109, the opposite side surfaces of the dielectric isolation layer 111, and the opposite third and fourth side surfaces 153a and 153b of the first conductivity-type semiconductor layer 107 are exposed along sidewalls of the respective trench openings; and depositing the gate dielectric layer 103 over an upper surface 134 of the second conductivity-type semiconductor layer 109 and along the sidewalls and bottom surfaces of each of the trench openings 151.

In another embodiment, forming the first gate electrode 105a and the second gate electrode 105b includes filling the pair of trench openings 151 with a dielectric fill layer 154, forming a pair of second trench openings 157, wherein the gate dielectric layer 103 is exposed along sidewalls of the respective second trench openings 157, and depositing an electrically conductive material within each of the second trench openings 157 and contacting the gate dielectric layer 103 to provide the first gate electrode 105a and the second gate electrode 105b.

In another embodiment, forming a plurality of first conductive vias 121 in a first dielectric material layer 102, wherein the first electrode 113 and the third electrode 117 are formed over the first dielectric layer 102 such that the first electrode 113 and the third electrode 117 each contact a first conductive via 121, forming a second dielectric material layer 159 over gate dielectric layer 103 and the first and second gate electrodes 105a and 105b, and forming a plurality of second conductive vias (160a, 160b, 162) within the second dielectric material layer 159 and contacting the second electrode 115, the first gate electrode 105a and the second gate electrode 105b.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure.

What is claimed is:

1. A semiconductor device structure, comprising:
   a layer stack comprising:
      a first conductivity-type semiconductor layer;
      a dielectric isolation layer over the first conductivity-type semiconductor layer; and
      a second conductivity-type semiconductor layer over the dielectric isolation layer;
   a first electrode adjacent to a first end of the layer stack and contacting a first side surface of the first conductivity-type semiconductor layer;
   a second electrode adjacent to the first end of the layer stack and contacting a first side surface of the second conductivity-type semiconductor layer;
   a third electrode adjacent to a second end of the layer stack opposite the first end of the layer stack and contacting a second side surface of the first conductivity-type semiconductor layer, a side surface of the dielectric isolation layer, and a second side surface of the second conductivity-type semiconductor layer;
   a gate dielectric layer contacting opposite side surfaces of the layer stack over at least a portion of a length of the layer stack between the first end and the second end of the layer stack; and
   a pair of gate electrodes contacting the gate dielectric layer and extending over opposite side surfaces of the layer stack over at least a portion of the length of the layer stack between the first end and the second end of the layer stack.

2. The semiconductor device structure of claim 1, wherein at least one of the first conductivity-type semiconductor layer or the second conductivity-type semiconductor layer comprise metal-oxide semiconductors.

3. The semiconductor device structure of claim 1, wherein the gate dielectric layer includes a first portion that extends over a first side surface of the layer stack, a second portion that extends over a second side surface of the layer stack, and a third portion that extends over an upper surface of the second conductivity-type semiconductor layer between the first portion and the second portion of the gate dielectric layer.

4. The semiconductor device structure of claim 1, wherein the first electrode is electrically connected to a voltage supply terminal, the second electrode is electrically connected to a ground terminal, the pair of gate electrodes are electrically connected to a signal input terminal, and the third electrode is electrically connected to a signal output terminal.

5. The semiconductor device structure of claim 1, wherein the first conductivity-type semiconductor layer comprises a p-type semiconductor layer, and the second conductivity-type semiconductor layer comprises an n-type semiconductor layer.

6. The semiconductor device structure of claim 5, wherein the p-type semiconductor layer comprises one or more of NiO, SnO, and $Cu_2O$.

7. The semiconductor device structure of claim 5, wherein the n-type semiconductor layer comprises one or more of amorphous silicon, $Al_2O_5Zn_2$ doped ZnO, InGaZnO, InGaO, InWO, InZnO, InSnO, $Ga_2O_3$, ZnO, GaO, $Ga_2O_3$, InO, $In_2O_3$, InZnO, ZnO, TiOx, and a III-V semiconductor material.

8. The semiconductor device structure of claim 1, wherein a length of the layer stack along a first horizontal direction between the first end and the second end of the layer stack is at least 15 nm.

9. The semiconductor device structure of claim 8, wherein a width of each of the first electrode, the second electrode, and the third electrode along a second horizontal direction that is perpendicular to the first horizontal direction is equal to a width of the layer stack between the opposite side surfaces of the layer stack.

10. The semiconductor device structure of claim 8, wherein a thickness of the first conductivity-type semiconductor layer and the second conductivity-type semiconductor layer is between 2 nm and 50 nm, a thickness of the dielectric isolation layer is at least 5 nm, and a thickness of the gate dielectric layer is between 2 nm and 20 nm.

11. The semiconductor device structure of claim 1, wherein the first conductivity-type semiconductor layer is formed over an interconnect-level dielectric layer having a horizontal surface, and
   wherein interfacing surfaces of the first conductivity-type semiconductor layer, the dielectric isolation layer, and the second conductivity-type semiconductor layer are substantially parallel to the horizontal surface of the interconnect-level dielectric layer.

12. The semiconductor device structure of claim 11, wherein the interconnect-level dielectric layer further comprises one or more electrical interconnect structures, and
wherein the first electrode and the third electrode are electrically connected to the one or more electrical interconnect structures.

13. The semiconductor device structure of claim 12, wherein a dielectric material matrix is located over and laterally surrounds the semiconductor device structure, the dielectric material matrix comprising one or more electrical interconnect structures, and the second electrode and the pair of gate electrodes are electrically connected to the one or more electrical interconnect structures in the dielectric material matrix.

14. A semiconductor device, comprising:
a substrate comprising a semiconductor material layer;
a plurality of device structures formed on or in the semiconductor material layer;
at least one interconnect-level dielectric layer over the substrate and the plurality of device structures and comprising conductive interconnect structures; and
a NOT gate logic circuit located over an interconnect-level dielectric layer, the NOT gate logic circuit comprising:
a first conductivity-type semiconductor layer;
a second conductivity-type semiconductor layer;
a first electrode contacting a first side surface of the first conductivity-type semiconductor layer;
a second electrode contacting a first side surface of the second conductivity-type semiconductor layer;
a dielectric isolation layer extending between the first conductivity-type semiconductor layer and the second conductivity-type semiconductor layer and between the first electrode and the second electrode;
a third electrode contacting a second side surface of the first conductivity-type semiconductor layer, a second side surface of the second conductivity-type semiconductor layer, and a side surface of the dielectric isolation layer;
a gate dielectric layer contacting the first conductivity-type semiconductor layer and the second conductivity-type semiconductor layer; and
a gate electrode contacting the gate dielectric layer.

15. The semiconductor device of claim 14, wherein interfacing surfaces of the first conductivity-type semiconductor layer, the dielectric isolation layer, and the second conductivity-type semiconductor layer are substantially parallel to a major surface of the substrate.

16. The semiconductor device of claim 14, wherein the first conductivity-type semiconductor layer comprises a p-type semiconductor layer, the second conductivity-type semiconductor layer comprises an n-type semiconductor layer, the first electrode is electrically connected to a voltage source terminal, the second electrode is electrically connected to a ground terminal, the gate electrode is electrically connected to an input signal terminal, and the third electrode is electrically connected to an output signal terminal.

17. A method of fabricating a semiconductor device structure, comprising:
forming a first conductivity-type semiconductor layer;
forming a first electrode contacting a first side surface of the first conductivity-type semiconductor layer;
forming a dielectric isolation layer over the first conductivity-type semiconductor layer and the first electrode;
forming a second conductivity-type semiconductor layer over the dielectric isolation layer;
forming a second electrode contacting a first side surface of the second conductivity-type semiconductor layer;
forming a third electrode contacting a second side surface of the first conductivity-type semiconductor layer, a side surface of the dielectric isolation layer, and a second side surface of the second conductivity-type semiconductor layer;
forming a gate dielectric layer over opposite third and fourth side surfaces of the second conductivity-type semiconductor layer, opposite side surfaces of the dielectric isolation layer, and opposite third and fourth side surfaces of the first conductivity-type semiconductor layer; and
forming a first gate electrode contacting the gate dielectric layer over the third side surface of the first conductivity-type semiconductor layer and the third side surface of the second conductivity-type semiconductor layer, and a second gate electrode contacting the gate dielectric layer over the fourth side surface of the first conductivity-type semiconductor layer and the fourth side surface of the second conductivity-type semiconductor layer.

18. The method of claim 17, wherein forming the gate dielectric layer comprises:
forming a pair of trench openings, wherein the opposite third and fourth side surfaces of the second conductivity-type semiconductor layer, the opposite side surfaces of the dielectric isolation layer, and the opposite third and fourth side surfaces of the first conductivity-type semiconductor layer are exposed along sidewalls of the respective trench openings; and
depositing the gate dielectric layer over an upper surface of the second conductivity-type semiconductor layer and along the sidewalls and bottom surfaces of each of the trench openings.

19. The method of claim 18, wherein forming the first gate electrode and the second gate electrode comprises:
filling the pair of trench openings with a dielectric fill layer;
forming a pair of second trench openings, wherein the gate dielectric layer is exposed along sidewalls of the respective second trench openings; and
depositing an electrically conductive material within each of the second trench openings and contacting the gate dielectric layer to provide the first gate electrode and the second gate electrode.

20. The method of claim 18, further comprising:
forming a plurality of first conductive vias in a first dielectric material layer, wherein the first electrode and the third electrode are formed over the first dielectric layer such that the first electrode and the third electrode each contact a first conductive via;
forming a second dielectric material layer over gate dielectric layer and the first and second gate electrodes; and
forming a plurality of second conductive vias within the second dielectric material layer and contacting the second electrode, the first gate electrode and the second gate electrode.

* * * * *